United States Patent [19]
Kang

[11] Patent Number: 6,091,624
[45] Date of Patent: Jul. 18, 2000

[54] SWL FERROELECTRIC MEMORY AND CIRCUIT FOR DRIVING THE SAME

[75] Inventor: Hee Bok Kang, Daejeon-si, Rep. of Korea

[73] Assignee: LG Semicon Co., Ltd., Cheongju, Rep. of Korea

[21] Appl. No.: 09/243,474

[22] Filed: Feb. 3, 1999

Related U.S. Application Data

[63] Continuation-in-part of application No. 09/210,783, Dec. 15, 1998, which is a continuation-in-part of application No. 09/187,735, Nov. 9, 1998, which is a continuation-in-part of application No. 09/055,985, Apr. 7, 1998.

[30] Foreign Application Priority Data

| Dec. 12, 1997 | [KR] | Rep. of Korea | ......................... | 97-68192 |
| Apr. 22, 1998 | [KR] | Rep. of Korea | ......................... | 98-14400 |
| Apr. 22, 1998 | [KR] | Rep. of Korea | ......................... | 98-14402 |
| May 13, 1998 | [KR] | Rep. of Korea | ......................... | 98-17212 |

[51] Int. Cl.$^7$ .................................................. G11C 11/22
[52] U.S. Cl. ..................... 365/145; 365/149; 365/230.06
[58] Field of Search ........................................ 365/145, 149, 365/230.06

[56] References Cited

U.S. PATENT DOCUMENTS

| 4,433,390 | 2/1984 | Carp et al. | ............................... | 364/900 |
| 4,873,664 | 10/1989 | Eaton, Jr. | ................................. | 365/145 |
| 4,888,630 | 12/1989 | Paterson | ................................. | 357/23.5 |
| 4,928,095 | 5/1990 | Kawahara | ................................ | 340/784 |
| 5,371,699 | 12/1994 | Larson | ..................................... | 365/145 |
| 5,373,463 | 12/1994 | Jones, Jr. | ................................ | 365/145 |
| 5,638,318 | 6/1997 | Seyyedy | ................................... | 365/145 |
| 5,680,344 | 10/1997 | Seyyedy | ................................... | 365/145 |
| 5,706,245 | 1/1998 | Kim | ...................................... | 365/230.06 |
| 5,761,138 | 6/1998 | Lee et al. | ................................. | 365/200 |
| 5,815,430 | 9/1998 | Varhaeghe et al. | ...................... | 365/145 |
| 5,903,492 | 5/1999 | Takashima | ............................... | 365/145 |
| 5,970,002 | 10/1999 | Yoo | ........................................ | 365/200 |

*Primary Examiner*—Richard Elms
*Assistant Examiner*—Tuan T. Nguyen
*Attorney, Agent, or Firm*—Fleshner & Kim, LLP

[57] ABSTRACT

A split wordline ferroelectric memory does not utilize plate lines and a circuit for driving the same is disclosed. The memory including unit cell arrays and each array has a plurality of split wordlines (SWLs) arranged in a first direction at fixed intervals, and a plurality of bitlines arranged in a second direction vertical to each of the SWLs at fixed intervals. A ferroelectric unit memory cell is arranged in each pair of adjacent two SWLs and adjacent two bitlines. The circuit includes a post X-decoder for receiving and decoding X and Z-addresses for controlling a cell array block operative, a global control pulse generator for providing a control pulse required for data write or read in response to a CSBpad signal received externally, a local control pulse generator for receiving the control pulse from the global control pulse generator and providing a control signal required for data write and read, an SWL cell array block for storage of data, an SWL driver for driving the SWL cell array block in response to control signals from the post X-decoder and the local control pulse generator, a Y-address decoder for decoding a Y-address signal received externally, a column controller for controlling columns in response to the control signal from the local control pulse generator and a decoded signal from the Y-address decoder, and a sense amplifier and I/O controller for sensing/recording a data from/to the SWL cell array block.

44 Claims, 35 Drawing Sheets

E : electric field
P : polarity ferroelectric capacitor reference voltage

SWL FERROELECTRIC MEMORY AND CIRCUIT FOR DRIVING THE SAME

This application is a continuation-in-part of application Ser. No. 09/210,783 filed Dec. 15, 1998, which is a continuation-in-part of prior application Ser. No. 09/187,735, filed Nov. 9, 1998, which is a continuation-in-part of prior application Ser. No. 09/055,985 filed Apr. 7, 1998, all currently pending.

BACKGROUND OF THE INVENTION

1. Field of the Invention

The present invention relates to a non-volatile ferroelectric memory, and more particularly, to a circuit for driving a split wordline (SWL) ferroelectric memory.

2. Background of the Related Art

A ferroelectric random access memory (FRAM) has a data processing speed as fast as a DRAM and conserves data even after the power is turned off. The FRAM includes capacitors similar to the DRAM, but the capacitors have a ferroelectric substance for utilizing the characteristic of a high residual polarization of the ferroelectric substance in which data is not lost even after eliminating an electric field applied thereto.

FIG. 1A illustrates a general hysteresis loop of a ferroelectric substance, and FIG. 1B illustrates a construction of a unit capacitor in a background art ferroelectric memory. As shown in the hysteresis loop in FIG. 1A, a polarization induced by an electric field does not vanish, but remains at a certain portion ("d" or "a" state) even after the electric field is cleared due to an existence of a spontaneous polarization. These "d" and "a" states may be matched to binary values of "1" and "0" for use as a memory cell. Referring to FIG. 1B, the state in which a positive voltage is applied to a node 1 is a "c" state in FIG. 1A, the state in which no voltage is applied thereafter to the node 1 is a "d" state. Opposite to this, if a negative voltage is applied to the node 1, the state moves from the "d" to an "f" state. If no voltage is applied to the node 1, thereafter the state moves to an "a" state. If a positive voltage is applied again, the states moves to the "c" state via the "b" state. At the end, even if there is no voltage applied on both ends of a capacitor, a data can be stored in stable states of "a" and "d". On the hysteresis loop, "c" and "d" states correspond to a binary logic value of "1", and "a" and "f" states correspond to a binary logic value "0".

In reading a data from the capacitor, the "d" state is destroyed to read the data stored in the capacitor. In a background art, a sense amplifier is used for reading a data using a voltage generated in a reference voltage generator and a voltage generated in a main cell array. In a ferroelectric reference cell, two modes of "1" polarity and "0" polarity are used for generating a reference voltage on a reference bitline. Accordingly, the sense amplifier compares a bitline voltage on a main cell and a reference bitline voltage on a reference cell, to read information in the main cell. By rewriting the read data within the same cycle, the destroyed data can be recovered.

A background art FRAM will be explained with reference to the attached drawings. There are FRAMs having a transistor and a capacitor (1T/1C) in a unit cell and FRAMs having two transistors and two capacitors (2T/2C) in a unit cell. FIG. 2 illustrates a background art 1T/1C FRAM cell array.

Referring to FIG. 2, the background art 1T/1C FRAM cell array is provided with a plurality of wordlines W/L arranged in one direction spaced at fixed or prescribed intervals, a plurality of platelines P/L arranged between wordlines in parallel thereto, and a plurality of bitlines B1, - - -, Bn arranged in a direction vertical to each of the wordlines W/L and the platelines P/L. Each of the transistors in a unit memory cell has a gate electrode connected to one of the wordlines W/L, a source electrode connected to an adjacent bitline B/L, and a drain electrode connected to a first electrode of the capacitor and a second electrode of the capacitor connected to an adjacent plateline P/L.

FIGS. 3A and 3B illustrate a circuit for driving the background art 1T/1C FRAM, FIG. 4A illustrates timings of signals for a writing operation of the background art 1T/1C FRAM cell, and FIG. 4B illustrates timings of signals provided for explaining a reading operation of the background art 1T/1C FRAM cell.

The circuit for driving the background art 1T/1C FRAM includes a reference voltage generator 1 for generating a reference voltage, and a reference voltage stabilizer 2 having a plurality of transistors Q1~Q4 and a capacitor C1 for stabilizing a reference voltage on two adjacent bitlines B1 and B2 because the reference voltage from the reference voltage generator 1 cannot be provided to a sense amplifier directly. A first reference voltage storage circuit 3 having a plurality of transistors Q6~Q7 and capacitors C2~C3 for storing of a logic value "1" and a logic value "0" in adjacent bit lines, and a first equalizer 4 having a transistor Q5 for equalizing adjacent two bitlines. A first main cell array 5 having a plurality of transistors Q8, Q9, - - -, and ferroelectric capacitors C5, C6, - - -, connected to wordlines W/L and platelines P/L for storing data, and a first sense amplifier 6 having a plurality of transistors Q10~Q15 and P-sense amplifiers PSA senses a data in a cell selected by the wordline from the plurality of cells in the main cell array 5.

A second main cell array 7 having a plurality of transistors Q26, Q27, - - -, and capacitors C7, C8, - - -, connected to wordlines and platelines different from one another to store data, and a second reference voltage storage circuit 8 having a plurality of transistors Q28~Q29 and capacitors C9~C10 to store a logic value "1" and a logic value "0" in adjacent bit lines. A second sense amplifier 9 having a plurality of transistors Q16~Q25 and N-sense amplifiers NSA to sense a data in the second main cell array 7.

Referring to FIG. 4A of the writing mode, upon enabling a CSBpad signal, a chip enable signal, from "high" to "low" externally, a writing mode enable signal WEBpad also transits from "high" to "low", to start the writing mode. An address decoding is started, to transit from "low" to "high" on a selected line to select a cell. During the wordline is held at "high", a corresponding plateline P/L is applied of an interval of "high" signal and an interval of "low" signal in a sequence. For writing a logic "1" or "0" on the selected cell, "high" or "low" signal is applied to a corresponding bitline synchronous to the writing enable signal. Namely, if "high" signal is applied to the bitline for writing a logic value "1", the logic value "1" is written on the ferroelectric capacitor within an interval of the wordline being "high" at a time when the plateline signal is "low", and for writing logic value "0", if a "low" signal is applied to the bitline, a logic value "0" is written in the ferroelectric capacitor when the plateline signal is "high". Thus, either a logic value "1" or a logic value "0" is written.

Referring to FIG. 4B of a reading mode, when CSBpad signal, a chip enable signal, is enabled from "high" to "low" externally, before selection of a corresponding wordline, all bitlines are equalized to "low" by an equalizer signal. That is, in FIG. 3, when "high" signal is applied to the equalizer 4 and "high" signal is applied to transistors Q19 and Q20, which grounds the bitlines through the transistors Q19 and Q20, the bitlines are equalized to "low". Transistors Q5, Q19 and Q20 are turned off, disabling corresponding bitlines, and address is decoded for transiting a corresponding wordline from "low" to "high", to select a corresponding cell. Then, a "high" signal is applied to a plateline of the selected cell, to cancel data corresponding to a logic value "1" stored in an FRAM. If the FRAM is in storage of a logic value "0", a data corresponding to it will not be canceled. A cell with a canceled data and a cell with a data not canceled provide signals different from each other according to the aforementioned hysteresis loop principle.

Data provided through bitline is sensed by the sense amplifier of a logic value "1" or "0". That is, referring to FIG. 1, since the case of a canceled data is a case when a state is changed from "d" to "f", and the case of a data not canceled is a case when a state is changed from "a" to "f", if the sense amplifier is enabled after a certain time, in the case of the canceled data, the data is amplified to provide a logic value "1", and, in the case of the data not canceled, the data is amplified to provide a logic value "0". After the sense amplifier amplifies and provides a signal, since the cell should be recovered of an original data, during "high" is applied to a corresponding line, the plateline is disabled from "high" to "low".

However, in the background art 1T/1C FRAM, in which the reference cell is operative more than the main memory cell, the reference cell degrades rapidly, providing an unstable reference voltage. Further, the regulation of the reference voltage by using a voltage regulating circuit is also not stable due to influences from an external power characteristic and noise. One solution in place of the background art 1T/1C FRAM having the aforementioned problems, is the 2T/2C FRAM.

Referring to FIG. 5, the array of the background art ferroelectric memory cells, each unit memory cell having two transistors and two capacitors (2T/2C) is provided with a plurality of wordlines W/L arranged in one direction and spaced at fixed intervals. A plurality of platelines P/L are arranged parallel to the wordlines and between each of the wordlines W/L. A plurality of bitlines B_n, B_n+1 and bitbarlines BB_n, BB_n+1 are arranged alternatively and in a direction vertical to the wordlines W/L and the platelines P/L.

The gate electrodes of the two transistors T1 and T2 in a unit memory cell 21 are connected to an adjacent wordline W/L in common, and the source electrodes of the transistors T1 and T2 are connected to an adjacent bitline B_n and bitbarline BB_n, respectively. The drain electrodes of the transistors T1 and T2 are connected to the first electrodes of two capacitors, respectively, while the second electrodes of the capacitors are connected in common to an adjacent plateline P/L.

The array of the background art 2T/2C FRAM cells writes and reads a logic value "1" or "0" as follows. Referring to FIG. 6A, in a writing mode, when a chip enable signal CSBpad transits from a "high" to a "low" externally, the array is enabled, and simultaneously, a writing mode enable signal WEBpad also transits from a "high" to a "low" to provide "high" and, "low" or "low" and "high" signals to the bitline and the bitbarline according to a logic value intended to be written. An address is decoded to transit a wordline signal of a selected cell from a "low" to a "high" for selecting the cell.

During an interval in which the wordline is held at a "high", a "high" signal of a fixed interval and a "low" signal of fixed interval in succession are applied to a corresponding plateline P/L. For writing a binary logic value "1", a "high" signal is applied to a bitline B-n and a "low" signal is applied to a bitbarline BB-n. For writing a binary logic value "0", a "low" signal is applied to a bitline B-n and "high" signal is applied to a bitbarline BB-n. Thus, either a logic value "1" or a logic value "0" can be written into the capacitor C1 or C2.

Referring to FIG. 6B, when a chip enable signal CSBpad transits from a "high" to a "low" and a write mode enable signal WEBpad transits from a "low" to a "high", the write mode is deactivated and a read mode is enabled. Before selection of a required wordline, all bitlines are equalized to a "low" level by an equalization signal. After completion of the equalizing to the "low" level, an address is decoded to transit a signal on the required wordline from a "low" to a "high" for selecting a corresponding unit cell. A "high" signal is applied to a plateline of the selected cell to cancel a data on the bitline or the bitbarline.

In other words, if a logic value "1" is written, a data in a capacitor connected to the bitline will be destroyed, and if a logic value "0" is written, a data in a capacitor connected to the bitbarline will be destroyed. Thus, depending on the data destroyed on the bitline or on the bitbarline, a value different from each other is provided according to the hysteresis loop characteristics. When the data provided through either the bitline or the bitbarline is sensed by the sense amplifier, the data value will be either logic "1" or logic "0". After the sense amplifier amplifies and provides the data, since the cell should have the data recovered, during the required wordline is applied of "high", the plateline is disabled from a "high" to a "low".

In spite of its merit that a stored data is kept when the power is off, the conventional FRAM has a complex layout because of their separated plate lines, and therefore, the manufacturing process is also complicated. Further, the speed of the conventional FRAM decreases because the data input and output operations are done by the separated plate lines, and a control signal is applied to the plate lines for the data read and write operations.

The integration in the conventional ferroelectric memory cell also cannot be improved without developing a new electric material or a new barrier material.

Another important factor causing a serious problem in the integration is that the area of a FRAM is larger than that of DRAM having the same capacity since a capacitor cannot be formed on a silicon substrate or on a surface of polysilicon because of lack of technique forming a ferroelectric layer on a surface of silicon. Moreover, it is difficult to exactly control the operation of the memory device since the wordline and the plate line are separately controlled, and therefore, there is a difference between control signals according to the transmission path.

Further, particularly in the background art 1T/1C FRAM, since one reference cell of a ferroelectric substance of which ferroelectric property is not fully assured is provided for a few hundreds of main memories for use in reading operation, requiring much more operation of the reference cell, the reference cell is involved in a rapid degradation of the ferroelectric property, causing instability of the reference voltage.

SUMMARY OF THE INVENTION

Accordingly, the present invention is directed an SWL ferroelectric memory and a circuit for driving the same that substantially obviates one or more of the problems, limitations and disadvantages of the related art.

An object of the present invention is to provide an SWL ferroelectric memory and a circuit for driving the same without a cell plateline.

To achieve these and other advantages and in accordance with the purpose of the present invention, as embodied and broadly described, the SWL ferroelectric memory includes unit cell arrays each having a plurality of split wordlines arranged in one direction at fixed intervals, a plurality of bitlines arranged in one direction vertical to each of the SWLs at fixed intervals, and a ferroelectric unit memory cell arranged in each pair of adjacent two SWLs and adjacent two bitlines.

In other aspect of the present invention, there is provided a circuit for driving an SWL ferroelectric memory including a post X-decoder for receiving and decoding X and Z-addresses for controlling a cell array block operative, a global control pulse generator for providing a control pulse required for data write or read in response to a CSBpad signal received externally, a local control pulse generator for receiving the control pulse from the global control pulse generator and providing a control signal required for data write and read, an SWL cell array block for storage of data, an SWL driver for driving the SWL cell array block in response to control signals from the post X-decoder and the local control pulse generator, a Y-address decoder for decoding a Y-address signal received externally, a column controller for controlling columns in response to the control signal from the local control pulse generator and a decoded signal from the Y-address decoder, and a sense amplifier and I/O controller for sensing/recording a data from/to the SWL cell array block.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1A:
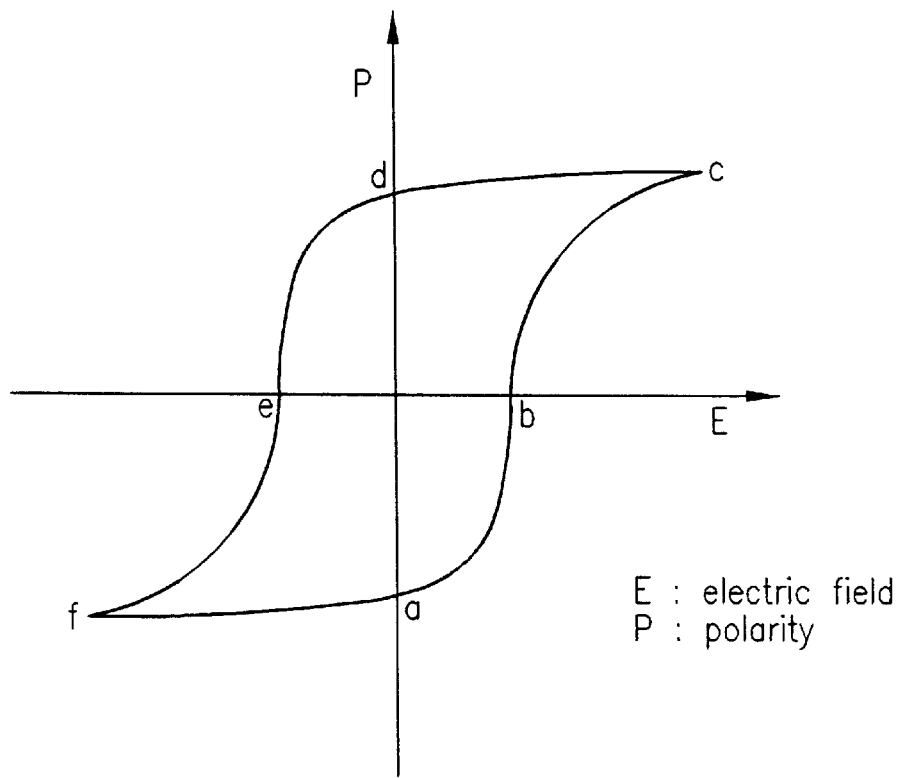
FIG. 1A illustrates a general hysteresis loop of a ferroelectric substance.
Figure 1B:
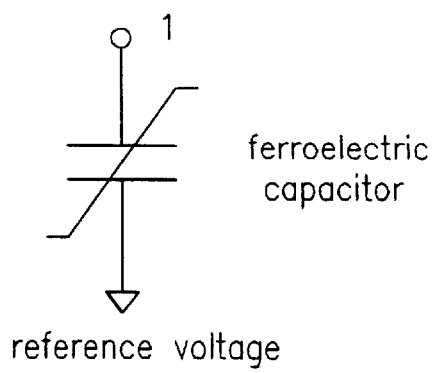
FIG. 1B illustrates a construction of a unit capacitor in a background art ferroelectric memory.
Figure 2:
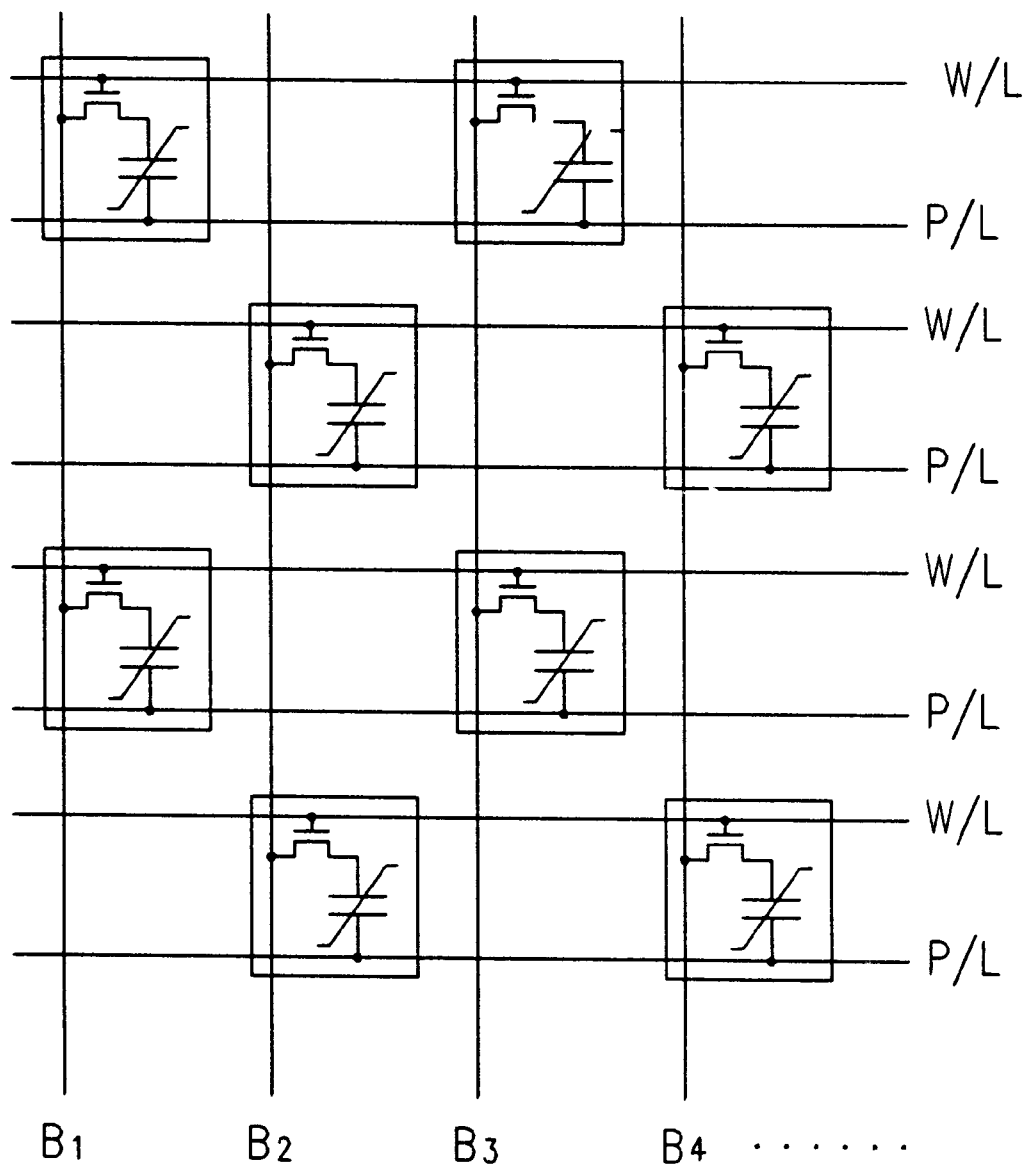
FIG. 2 illustrates a background art 1T/1C FRAM cell array.
Figure 3A:
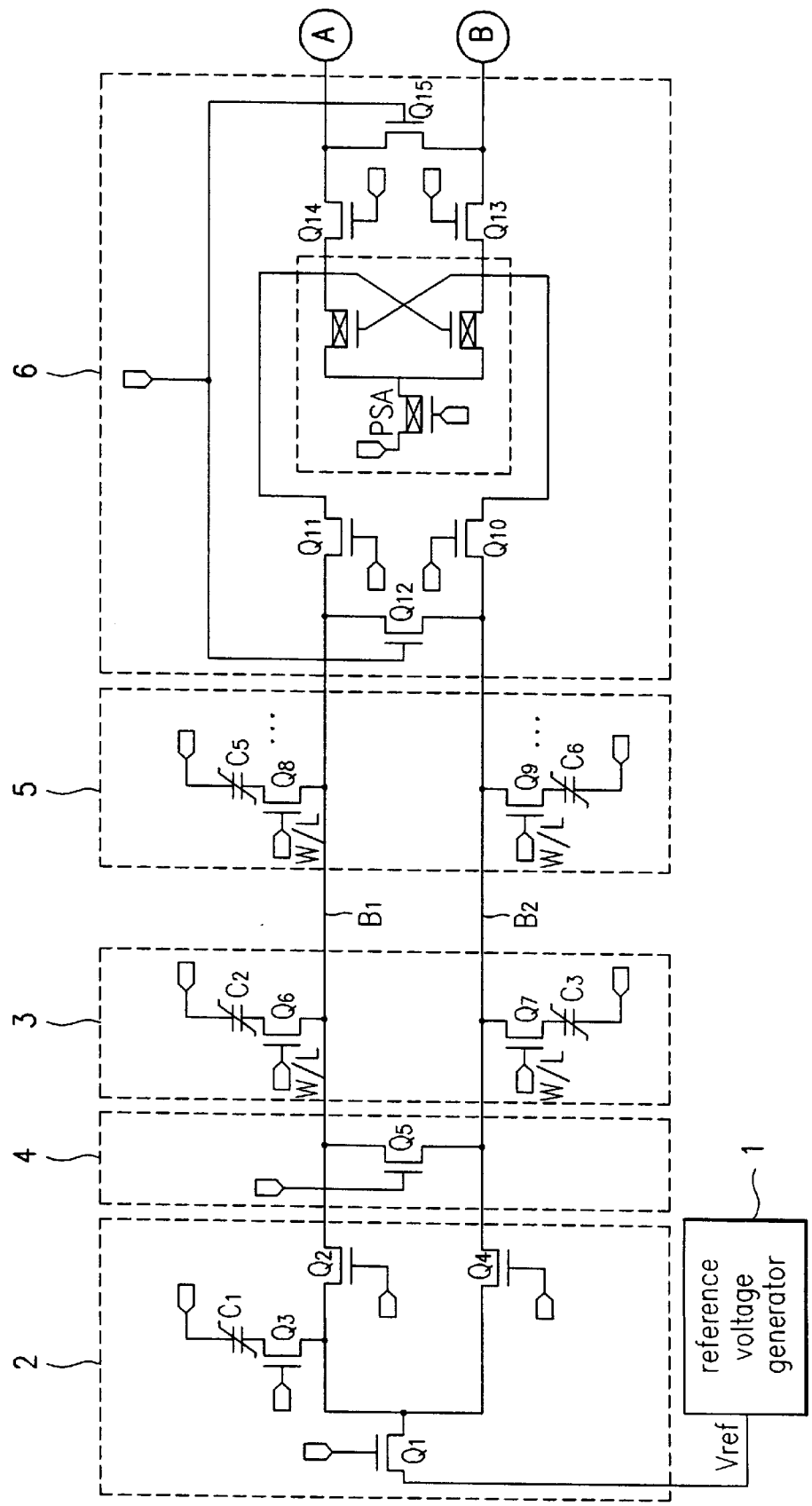
FIGS. 3A and 3B together illustrate a circuit for driving the background art 1T/1C FRAM.
Figure 3B:
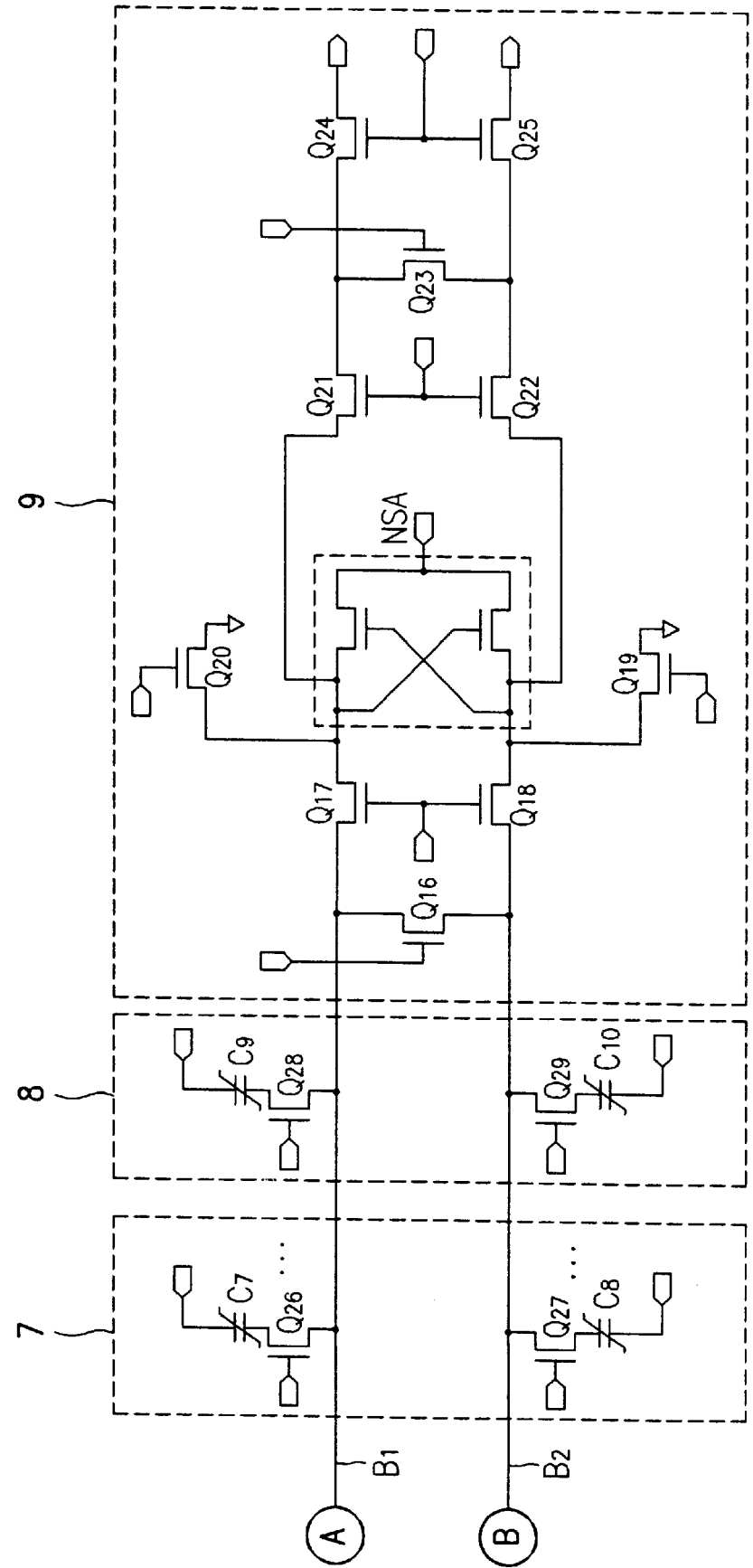
Figure 4A:
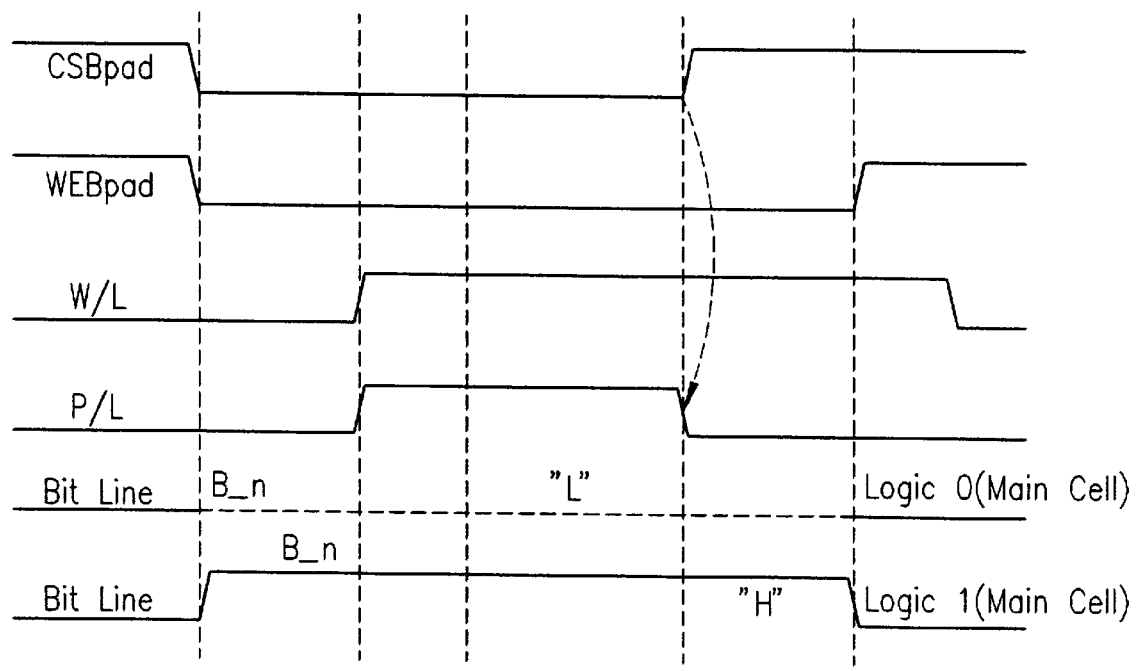
FIG. 4A illustrates timings of signals provided for explaining a writing on the background art 1T/1C FRAM cell.
Figure 4B:
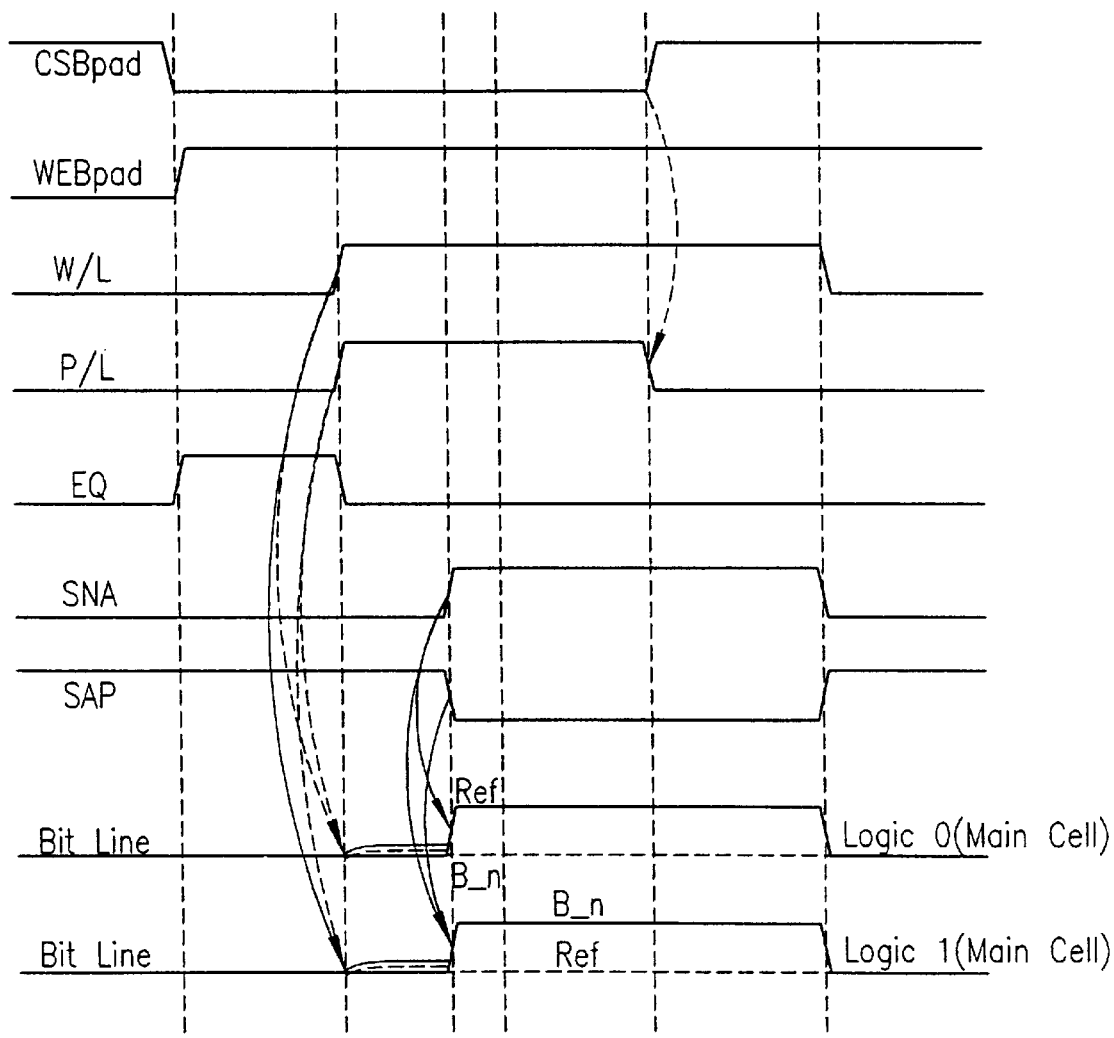
FIG. 4B illustrates timings of signals provided for explaining a reading from the background art 1T/1C FRAM cell.
Figure 5:
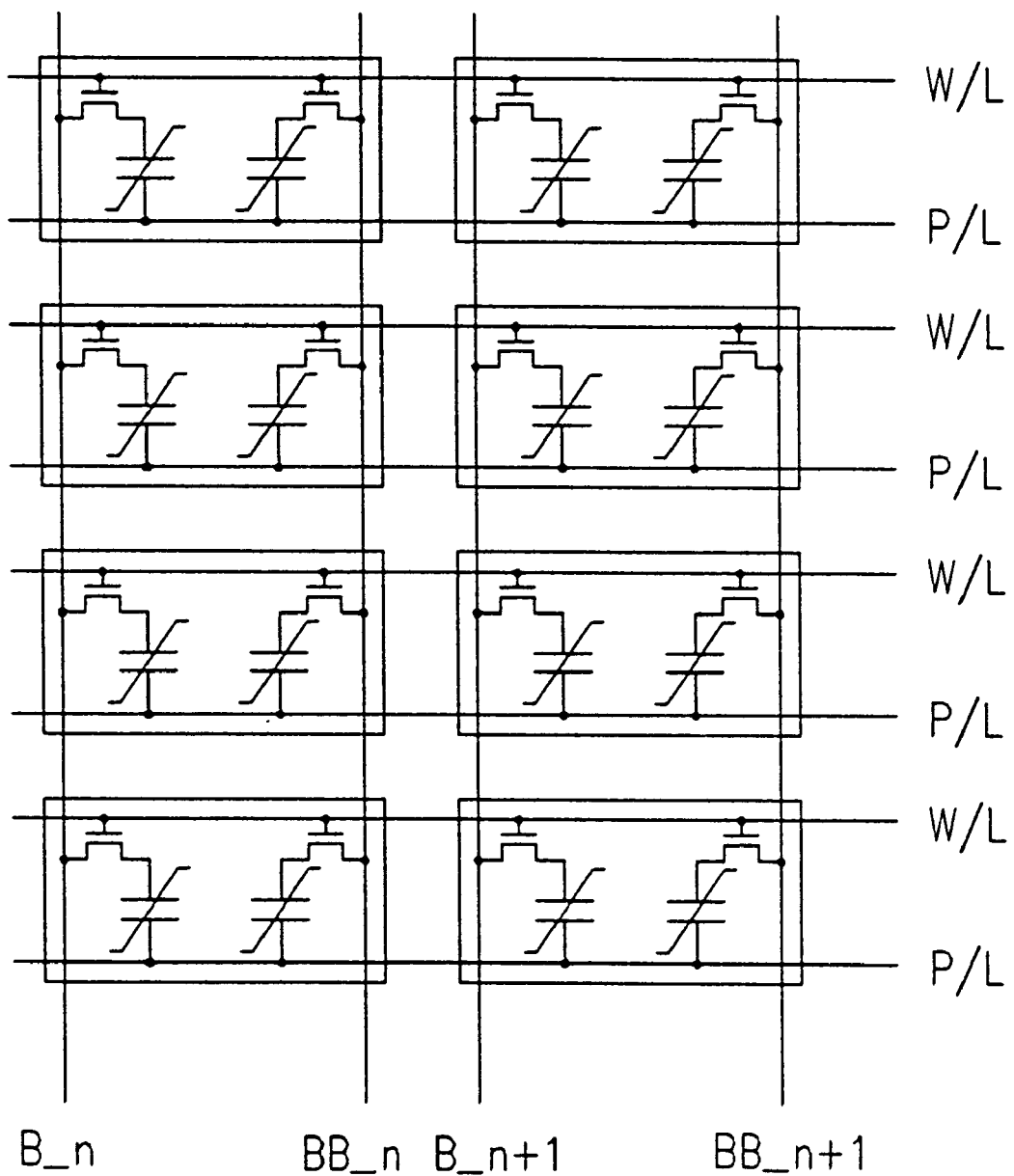
FIG. 5 illustrates an array of a background art 2T/2C FRAM cells.
Figure 6A:
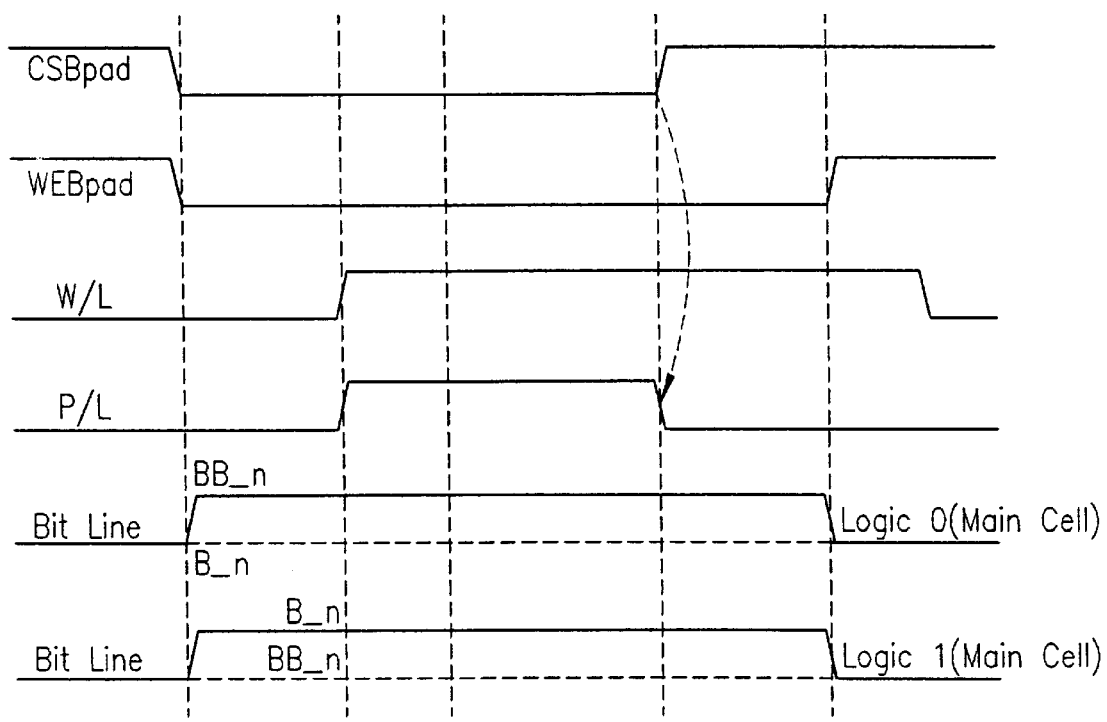
FIG. 6A illustrates timings of different signals provided for explaining a writing on the background art 2T/2C FRAM cell.
Figure 6B:
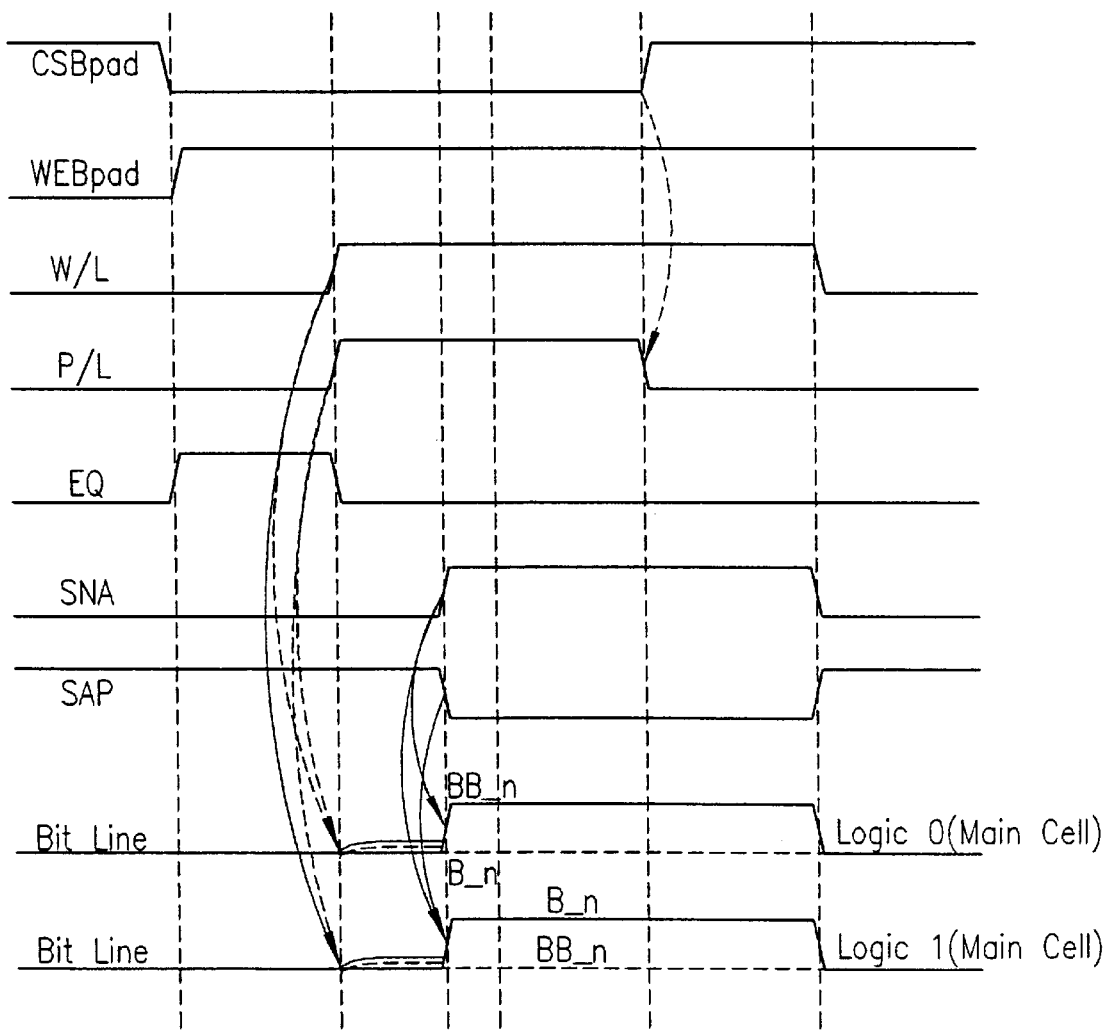
FIG. 6B illustrates timings of different signals provided for explaining a reading from the background art 2T/2C FRAM cell.
Figure 7:
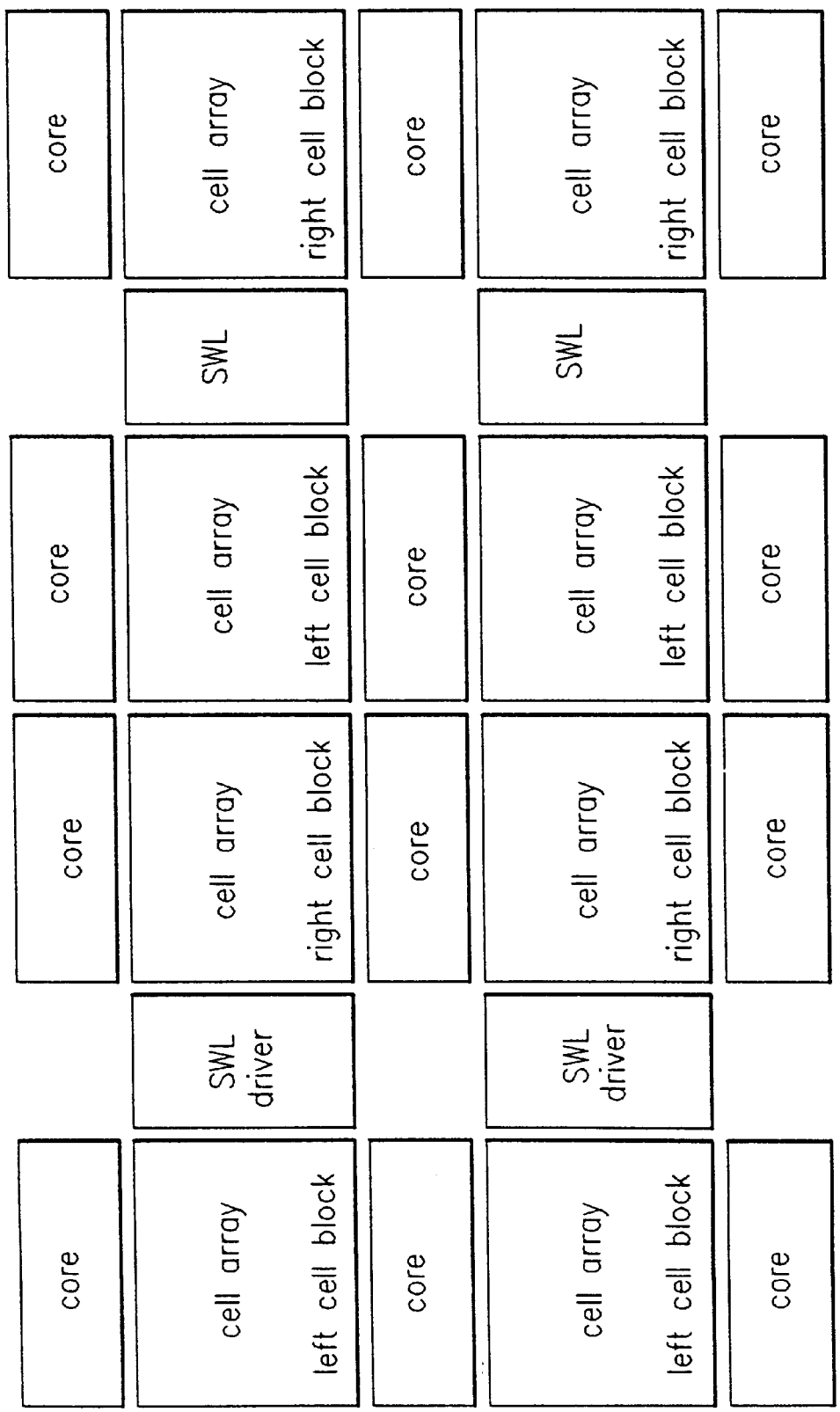
FIG. 7 illustrates an array of SWL ferroelectric memory cells in accordance with a preferred embodiment of the present invention.

FIG. 7 is a block diagram for the structure of the nonvolatile ferroelectric memory device according to a preferred embodiment of the present invention. The basic structure of the nonvolatile ferroelectric memory device according to the present invention is classified by three blocks, which comprise a split wordline driver for driving the split wordlines, a cell array for storing data, and a core or input/output circuit including a sense amplifier for sensing data and a bitline controller for controlling the bitlines.

The cell array is provided on each of the right and left sides of a split wordline driver, respectively. The core is arranged between the cell arrays on the top and bottom sides of the cell array. A number of sense amplifiers in the core is the same as that of the corresponding bit and bitbarlines, each of the sense amplifiers connected to each of the bit and bitbarlines.

Figure 8:
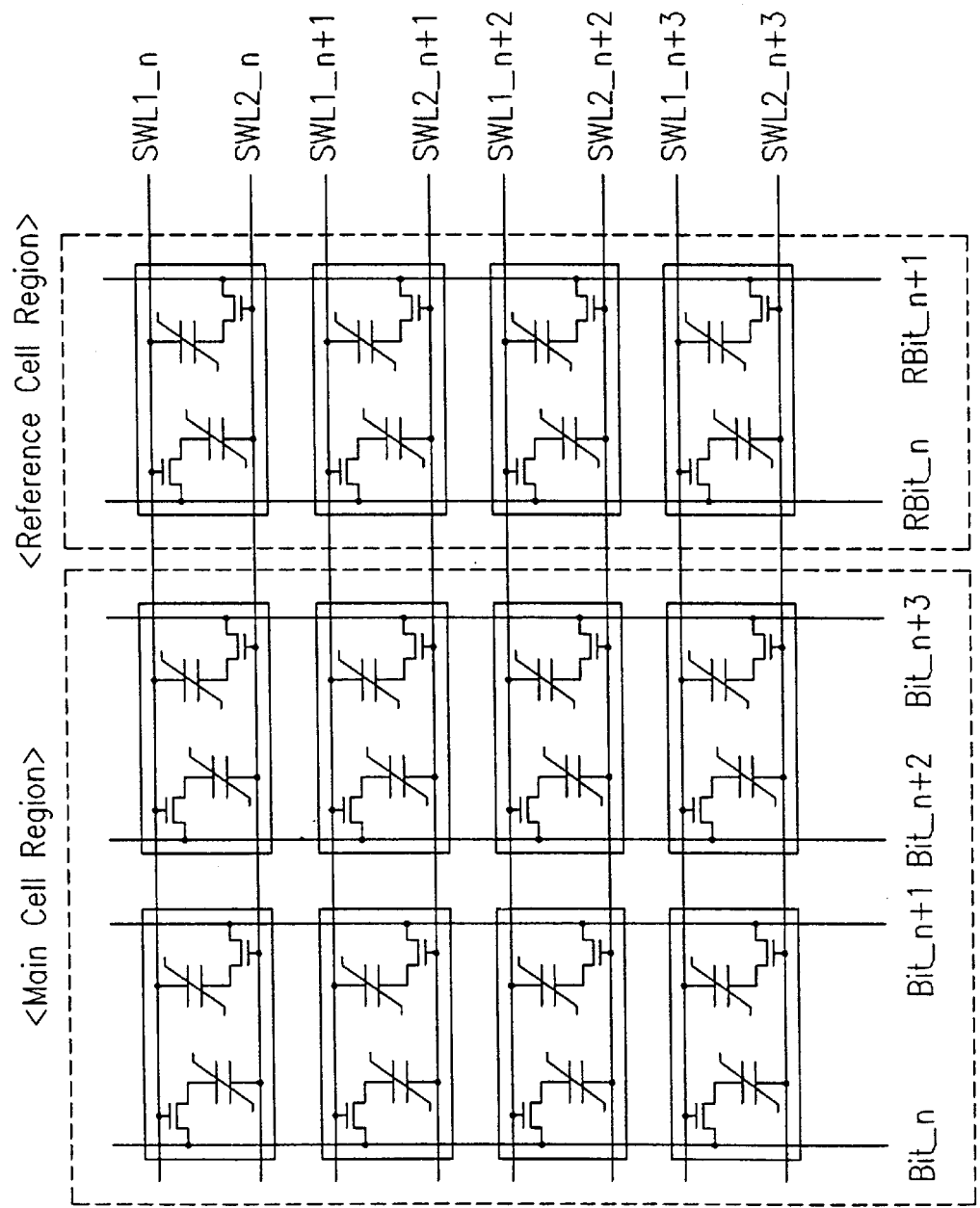
FIG. 8 illustrates a circuit of an array of SWL ferroelectric memory cells in accordance with a first embodiment of the present invention.

FIG. 8 illustrates a circuit of a sub-block array of SWL ferroelectric memory cells in accordance with a first embodiment of the present invention. The SWL ferroelectric memory cell array in accordance with a first embodiment of the present invention includes a plurality of split wordlines (hereafter called "SWL") SWL1-n, SWL2-n, - - - , SWL2-n+3 arranged in one direction at fixed intervals, and a plurality of bitlines Bit-n, Bit-n+1, - - - , RBit-n, RBit-n+1 arranged in a direction vertical to each of the SWLs at fixed or prescribed intervals.

A unit cell is formed in every pair of adjacent two SWLs and adjacent two bitlines. That is, the unit cell includes a first transistor having a gate electrode connected to a first SWL of one pair of SWLs and a source electrode connected to a first bitline of the pair of bitlines, a second transistor having a gate electrode connected to a second SWL of the pair of SWLs and a source electrode connected to a second bitline of one pair of bitlines, a first capacitor having a first electrode connected to a drain electrode of the first transistor and a second electrode connected the second SWL, and a second capacitor having a first electrode connected to a drain electrode of the second transistor and a second electrode connected to the first SWL.

The cell array actually includes a main cell region for writing a data and a reference cell region for being in storage of a reference value for reading a data. Thus, main cells and a plurality of bitlines for the main cells form a main cell sub-block and one pair of reference cell bitlines RBit-n, Rbit-n+1 for every main cell sub-block form a reference cell sub-block, and a plurality of the main cell sub-blocks and a plurality of the reference cell sub-blocks form one cell array.

Figure 9:
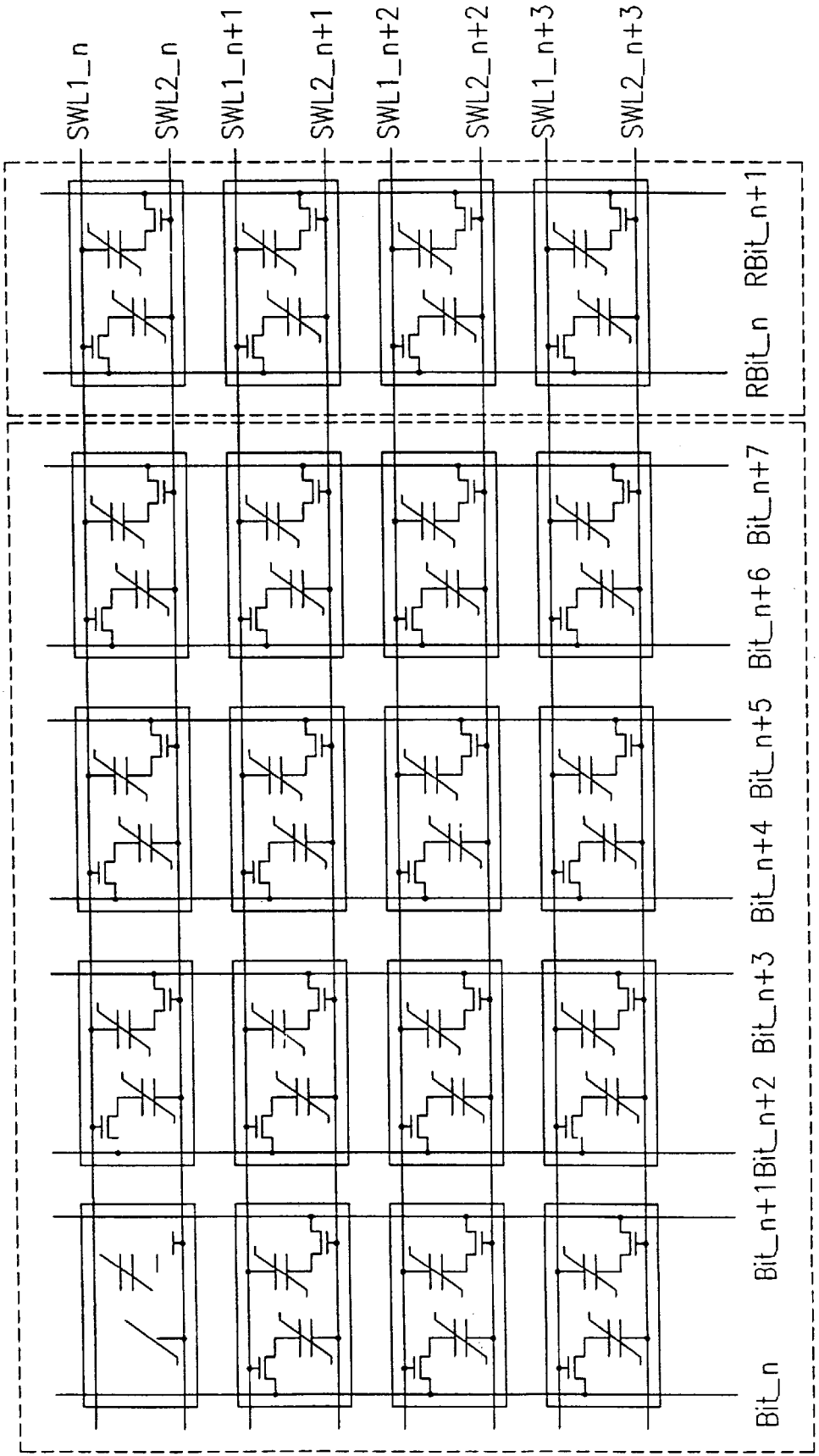
FIG. 9 illustrates a circuit of an array of SWL ferroelectric memory cells in accordance with a second embodiment of the present invention.

FIG. 9 illustrates a circuit of a sub-block array of SWL ferroelectric memory cells in accordance with a second embodiment of the present invention. The system of SWL ferroelectric memory cell array in accordance with a second embodiment of the present invention is the same with the system of SWL ferroelectric memory cell array in accordance with a first embodiment of the present invention, except that the main cell sub-block has 8 columns with the reference cell sub-block having 2 columns. Moreover, the main cell sub-block may have 2n columns (n is an integer greater than 2) with the reference cell block having two columns.

Figure 10:
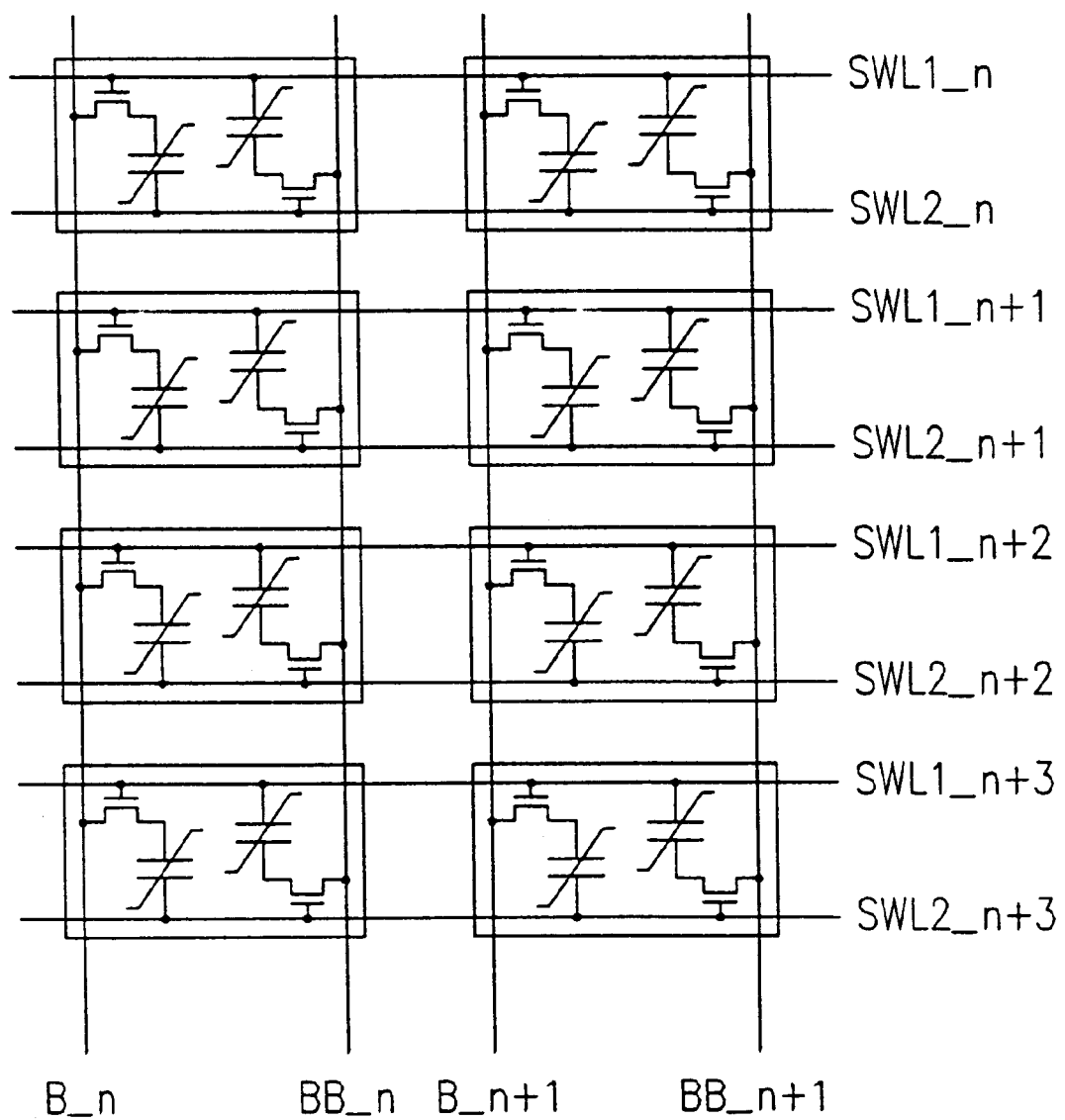
FIG. 10 illustrates a circuit of an array of SWL ferroelectric memory cells in accordance with a third embodiment of the present invention.

FIG. 10 illustrates a circuit of an SWL ferroelectric memory cell array in accordance with a third embodiment of the present invention. The cell array includes a plurality of D first split wordlines SWL1_n, SWL1_n+1, SWL1_n+2, SWL1_n+3, etc., a plurality of second split wordlines SWL2_n, SWL2_n+1, SWL2_n+2, SWL2_n+3, etc., on one side of the split wordlines, a plurality of bitlines B_n, B_n+1, etc., and a plurality of bitbarlines BB_n, BB_n+1, etc, crossing the first, and second split wordlines, and the memory cells formed at intersections of the first and second split wordlines, and odd and even numbered bitlines, respectively, of the plurality of bitlines.

The memory cells can be formed of a folded bitline system in which the memory cell is provided, not at every crossing of the first and second split wordlines with the bitlines, but in view of a particular split wordline, one for every second bitline. Accordingly, the split wordlines are disposed to have a memory cell at every odd or even numbered bitline, which implies that one split wordline alone can not be enabled, but a pair of first and second split wordlines SWL1 and SWL2 should be enabled simultaneously.

The SWL ferroelectric memory cell array in accordance with a third embodiment of the present invention is similar to the SWL ferroelectric memory cell arrays in accordance with the first and second embodiments of the present invention, except that the third embodiment has the even numbered bitlines B in the first, or second embodiment replaced with bitbarlines BB and all the reference cell sub-blocks in the first, or second embodiment replaced with main cells.

Figure 11:
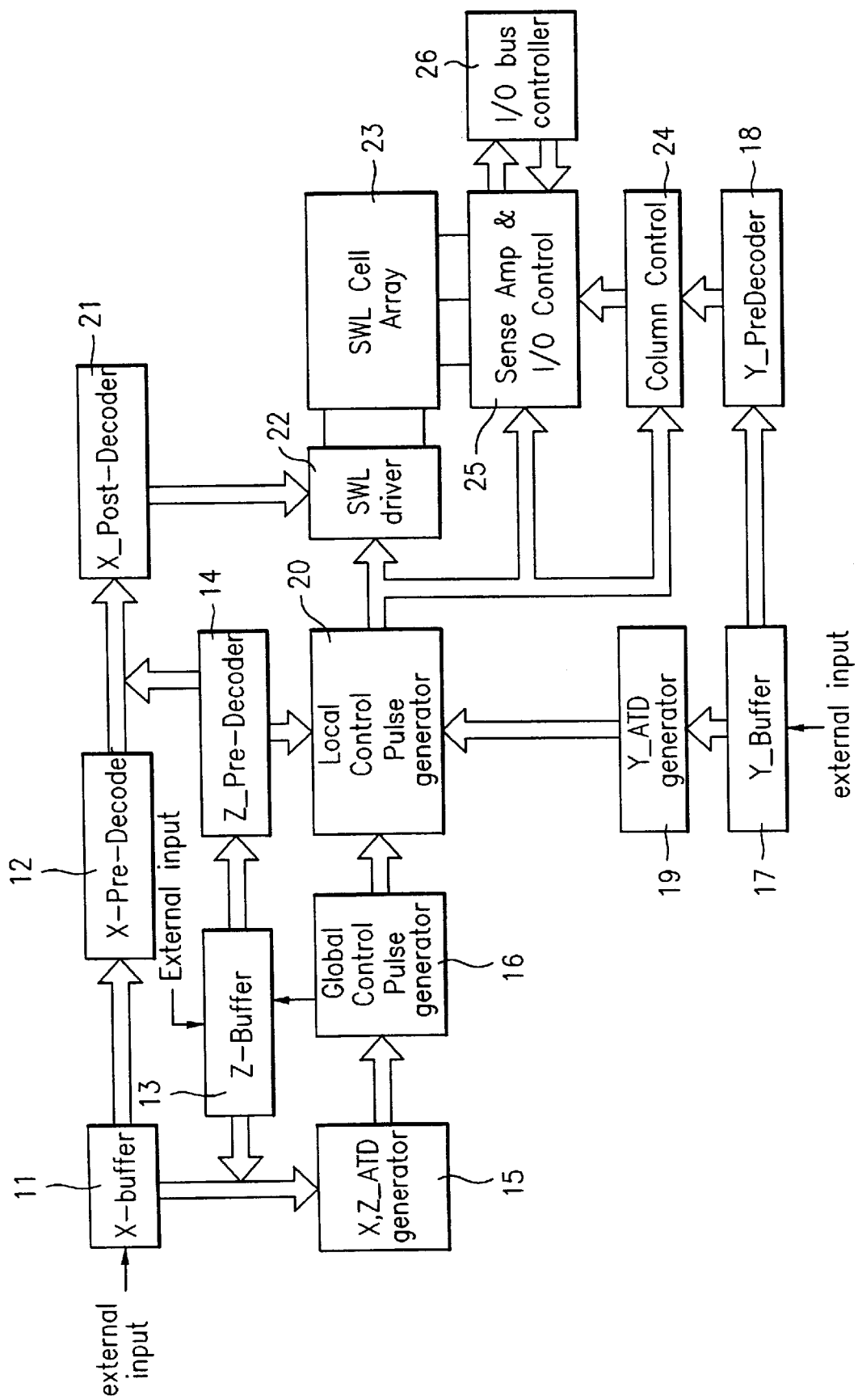
FIG. 11 illustrates a block diagram of a circuit for driving an SWL ferroelectric memory in accordance with a preferred embodiment of the present invention.

A circuit for driving a ferroelectric memory in accordance with the present invention will be explained. FIG. 11 illustrates a block diagram of a circuit for driving a ferroelectric memory in accordance with the present invention. The circuit is adapted to drive any of the first, second and third embodiment ferroelectric memory of the present invention.

As shown in FIG. 11, an input/output circuit for driving a nonvolatile ferroelectric memory in accordance with a preferred embodiment of the present invention includes an X-buffer 11 for buffering an X address of X-, Y- and Z-addresses, and an X-predecoder 12 for predecoding a signal from the X-buffer 11. A Z-buffer 13 buffers a Z address of X-, Y- and Z-addresses, a Z-pre-decoder 14 for predecoding a signal from the Z-buffer 13. An X, Z-ATD generator 15 detects address transition points of the X-address and Z-address signals from the X-buffer 11 and the Z-buffer 13. A global control pulse generator 16 receives a signal from the X, Z-ATD generator 15 and an external CSB-pad signal for generating a power-up detection signal for itself to provide a basic pulse for memory control according to the X, Z-ATD signal, the CSBpad signal and the power-up detection signal. A Y-buffer 17 buffers a Y address of X-, Y- and Z-addresses received externally. A Y-pre-decoder 18 pre-decodes a signal from the Y-buffer 17, and a Y-ATD generator 19 detects an address transition point of the Y-address signal from the Y-buffer 17.

A local control pulse generator 20 combines a signal from the global control pulse generator 16, a Z address pre-decoded signal from the Z-pre-decoder 14 and a signal from the Y-ATD generator 19 into a pulse required in each memory block. An X-post decoder 21 combines the X address pre-decoded signal and the Z address pre-decoded signal from the X-pre-decoder 12 and the Z-pre-decoder 14, respectively, to select a cell block. An SWL driver 22 combines the signals from the X-post decoder 21 and the local control pulse generator 20 to apply a driving signal to split wordlines on each of cell blocks 23. A column controller 24 combines the signals from the Y-pre-decoder 18 and the local control pulse generator 20 to select a bitline (or a bitbarline). A sense amplifier and I/O controller 25 combines a signal from the local control pulse generator 20 and a signal from the column controller 24 to control operation of the sense amplifier and input/output controller 25. An I/O bus controller 26 interfaces the sense amplifier and the I/O controller 25 to an external data.

Figure 12:
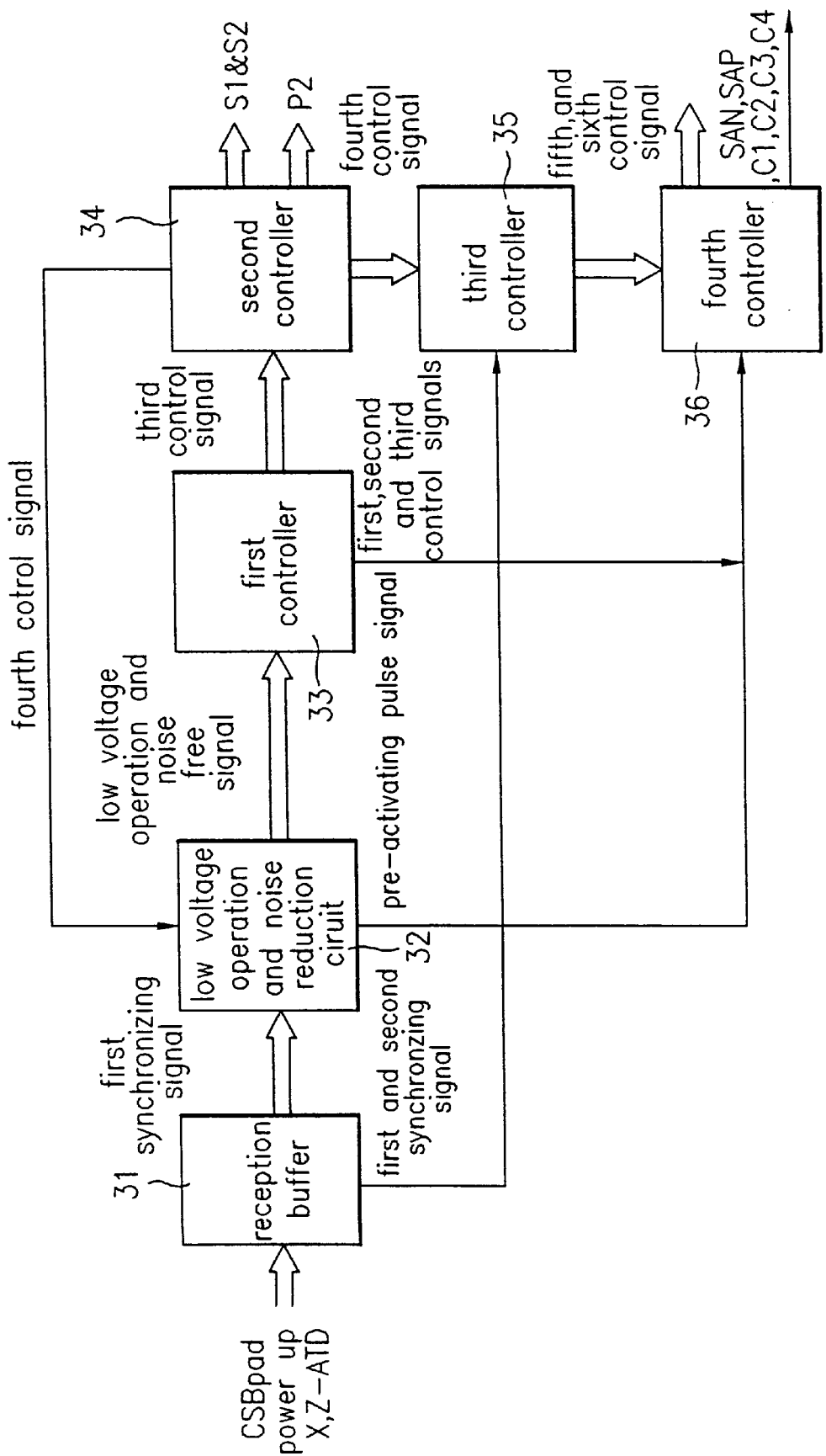
FIG. 12 illustrates a block diagram of a global control pulse generator in accordance with a first preferred embodiment of the present invention.

FIG. 12 illustrates a system block diagram of a global control pulse generator of FIG. 11 in accordance with a first preferred embodiment. A reception buffer 31 receives a signal containing at least CSBpad signal, the X, Z-ATD signal and the power-up detection signal and provides first and second synchronizing signals. A low voltage operation and noise reduction circuit 32 provides: (1) a low voltage detection signal for stopping the operation at a low voltage, (2) a noise canceling signal for filtering a noise in the first synchronizing signal, and (3) a pre-activating pulse for pre-charging the bitlines and the like in response to the first synchronizing signal from the reception buffer 31 and a feed back signal.

When a normal power supply voltage is supplied from the low voltage operation and noise reduction circuit 32, a first controller receives a signal having the noise removed therefrom and provides (1) a first control signal for controlling an enable time point of the sense amplifier, (2) a second control signal for controlling a column selection enable time point and a bitline and bitbarline pull-up, and (3) a third control signal for providing a signal for the SWL driver and other control signals.

A second controller 34 receives the third control signal from the first controller 33 and generates (1) preliminary signals S1 and S2 for generating signals to be applied to a pair of first and second split wordlines SWL1 and SWL2 in the SWL driver, (2) a fourth control signal which is a basic pulse signal for controlling enabled time periods of the signals S1 and S2 and (3) a pulse signal P2 having a driving capability improved from the fourth control signal. The second controller 34 provides the fourth control signal to the low voltage operation and noise reduction circuit 32 as a feed back signal, and the pulse signal P2 to the local control pulse generator 20.

A third controller 35 receives the first and second synchronizing signals from the input buffer 31 and the fourth control signal from the second controller 34 and provides (1) a fifth control signal for controlling the synchronization to the CSBpad signal if all signal except the preliminary signals S1 and S2 are disabled and (2) a sixth control signal for interrupting a disabled state of the CSBpad signal if the CSBpad signal is disabled under a state that the preliminary signal S1 and the preliminary signal S2 are enabled. The third controller 35 sustains the enabled state until the completion of normal operations of the preliminary signals S1 and S2.

A fourth controller 36 is coupled for receiving the fifth and sixth control signals from the third controller 35, the first, second and third control signals from the first controller 33 and the pre-activating pulse from the low voltage operation and noise reduction circuit 32. The fourth controller 36 provides (1) preliminary signals SAN and SAP for generating enable signals for, respectively, NMOS and PMOS elements, of the sense amplifier, (2) a control signal C1 for connecting a bitline on a main cell block and a first I/O node on the sense amplifier to each other, (3) a control signal C2 for connecting a bitline on a reference cell block and a second I/O node on the sense amplifier to each other, (4) a control signal C3 for controlling low voltage pre-charges between a bitline on a main cell. a bitline on a reference cell and a node on the sense amplifier, and (5) a control signal C4 for controlling an enable time point of a column selection and a bitline pull-up of a reference cell.

If the externally applied signals (the CSBpad signal, the X, Z-ATD signal and the power-up detection signal) to the global control pulse generator are stable, the low voltage operation and noise reduction circuit may be dispensed. The low voltage operation and noise reduction circuit in the global control pulse generator may also be a low voltage operation reduction circuit which prevents operation at a low voltage or a noise remover which only has a function of noise removal.

Figure 13:
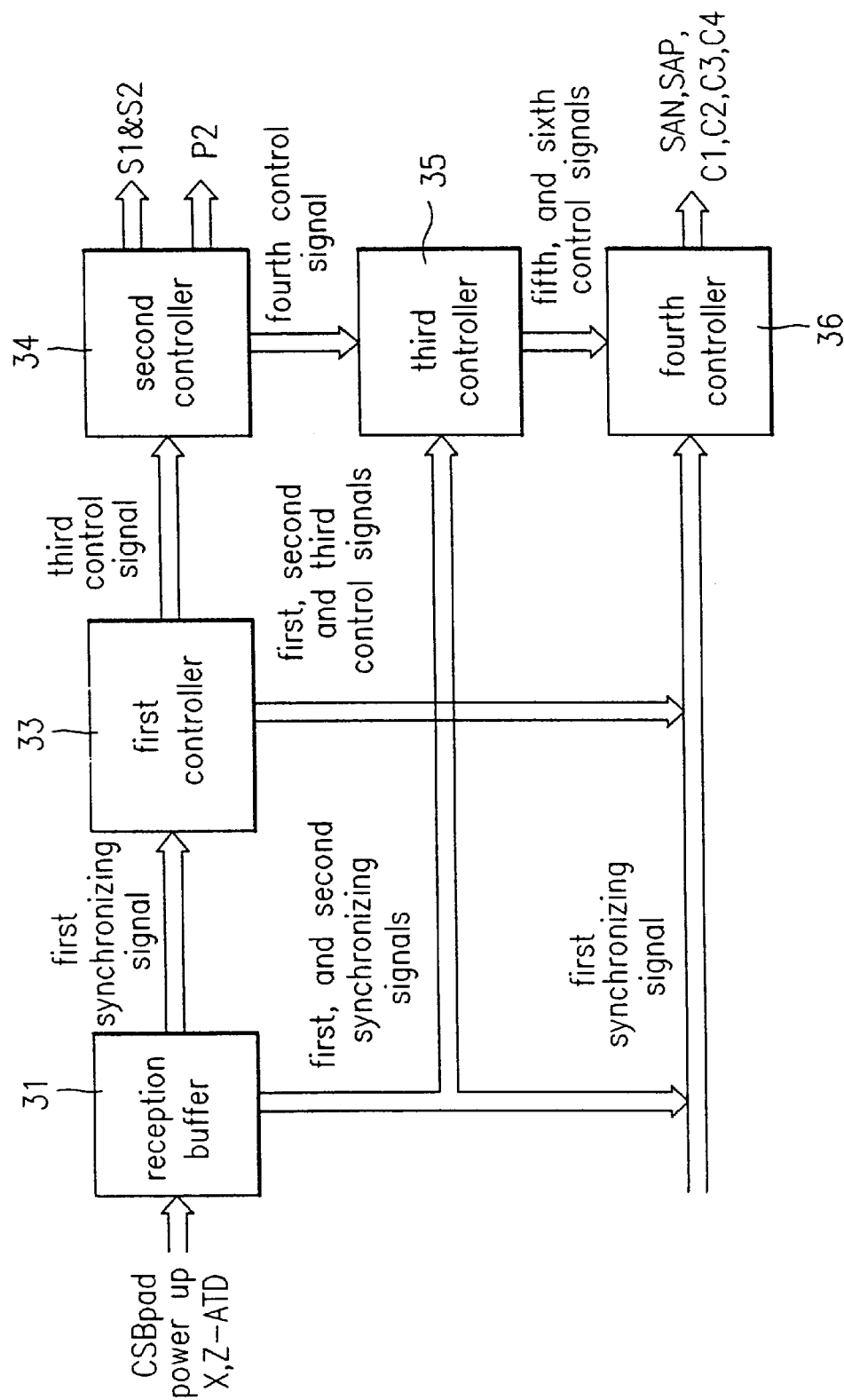
FIG. 13 illustrates a block diagram of a global control pulse generator in accordance with a second preferred embodiment of the present invention.

FIG. 13 depicts a global control pulse generator in accordance with a second preferred embodiment of the present invention. A reception buffer 31 receives a signal containing at least a CSBpad signal of the CSBpad signal, the X, Z-ATD signal from the X, Z-ATD generator 15 and the power-up detecting signal and provides first, and second synchronizing signals. A first controller 33 receives the first synchronizing signal from the reception buffer 31 and provides a first control signal for controlling an enable time point of the sense amplifier, a second control signal for controlling a column selection enable time point and a bitline pull-up of a reference cell, and a third control signal for providing a signal for the SWL driver and other control signals.

A second controller 34 receives the third control signal from the first controller 33, generates a basic waveform generating signal S1 for the SWL1 and a basic waveform generating signal S2 for the SWL2 in a pair of SWLs for the SWL driver, a fourth control signal which is a basic pulse signal for controlling enabled time periods of the signals S1 and S2 and a pulse signal P2 having a driving capability improved from the fourth control signal, and proves the pulse signal P2 to the local control pulse generator 20.

A third controller 35 receives the first and second synchronizing signals from the reception buffer 31 and the fourth control signal from the second controller 34 and provides a fifth control signal for controlling to be synchronous to the SCBpad signal if all signal except the basic waveform generating signal S1 for the SWL1 and the basic waveform generating signal S2 for SWL2 is disabled. The third controller 35 also provides a sixth control signal for interrupting a disabled state of the CSBpad signal if the CSBpad signal is disabled under a state that the basic waveform generating signal S1 for the SWL1 and the basic waveform generating signal S2 for SWL2 are enabled and sustains the enabled state until completion of normal operations of the basic waveform generating signal S1 for the SWL1 and the basic waveform generating signal S2 for SWL2.

A fourth controller 36 receives the fifth and sixth control signals from the third controller 35, the first, second and third control signals from the first controller 33 and the first synchronizing signal from the reception buffer 31. Thereafter, the fourth controller 36 provides (1) an enable signal SAN for an n-MOS device and an enable signal SAP for p-MOS device in the sense amplifier, (2) a control signal C1 for connecting a bitline on a main cell block and a first I/O node on the sense amplifier to each other, (3) a control signal C2 for connecting a bitline on a reference cell block and a second I/O node on the sense amplifier to each other, (4) a control signal C3 for controlling low voltage precharges of a bitline on a main cell, a bitline on a reference cell and a node on the sense amplifier, and (5) a control signal C4 for controlling an enable time point of a column selection and a bitline pull-up of a reference cell.

Figure 14:
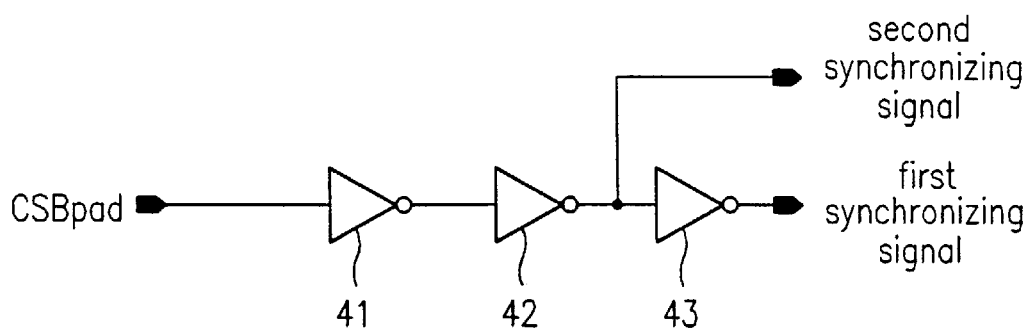
FIG. 14 illustrates a block diagram of an reception buffer in accordance with a first preferred embodiment of the present invention.
Figure 15:
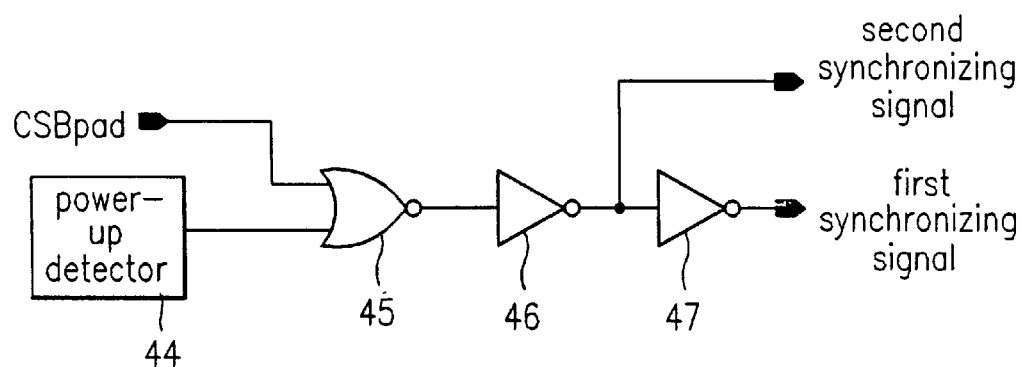
FIG. 15 illustrates a circuit diagram of a reception buffer in accordance with a second preferred embodiment of the present invention.
Figure 16:
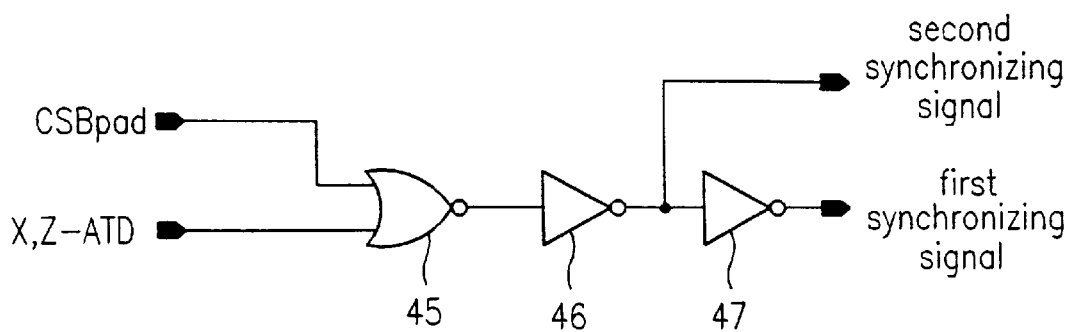
FIG. 16 illustrates a circuit diagram of a reception buffer in accordance with a third preferred embodiment of the present invention.
Figure 17:
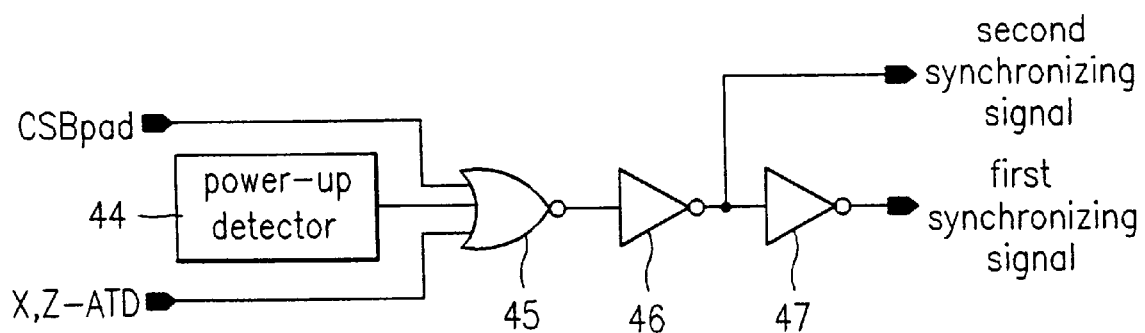
FIG. 17 illustrates a circuit diagram of a reception buffer in accordance with a fourth preferred embodiment of the present invention.

FIG. 14 illustrates a block diagram of a reception buffer in accordance with a first preferred embodiment of the present invention, and FIG. 15 illustrates a circuit diagram of a reception buffer in accordance with a second preferred embodiment of the present invention. FIG. 16 further illustrates a circuit diagram of a reception buffer in accordance with a third preferred embodiment of the present invention, and FIG. 17 illustrates a circuit diagram of a reception buffer in accordance with a fourth preferred embodiment of the present invention.

Referring to FIG. 14, the reception buffer in accordance with a first preferred embodiment of the present invention, adapted to use the CSBpad signal applied externally only, includes three inverters 41, 42 and 43 in series, for inverting the CSBpad signal to provide a first synchronizing signal from the inverter 43 and a second synchronizing signal from the inverter 42. As shown in FIG. 15, the reception buffer in accordance with a second preferred embodiment of the present invention, adapted to use the CSBpad signal applied externally and a power-up detecting signal, includes a power-up detector 44 for providing a "high" signal until a power is stabilized when a "low" signal is provided for stabilizing a circuit operation, an NOR gate 45 for subjecting the CSBpad signal applied externally and a signal from the power-up detector 44 to OR operation and inversion, an inverter 46 for inverting the signal from the NOR gate to provide a second synchronizing signal, and an inverter 47 for inverting the signal from the inverter 46 to provide a first synchronizing signal.

As shown in FIG. 16, the reception buffer in accordance with a third preferred embodiment of the present invention, adapted to use the CSBpad signal applied externally and the X, Z-ATD signal from the X, Z-ATD generator 15 shown in FIG. 11, includes a system similar to a system shown in FIG. 15, except that the NOR gate 45 is applied of the X, Z-ATD signal to one reception terminal thereof. As shown in FIG. 17, the reception buffer in accordance with a fourth preferred embodiment of the present invention, adapted to use the CSBpad signal applied externally, the X, Z-ATD signal from the X, Z-ATD generator 15 shown in FIG. 11 and the power-up detecting signal, includes a system similar to a system shown in FIG. 15, except that an NOR gate 48 with three reception terminals is used in place of the NOR gate 45, which subjects the X, Z-ATD signal, the CSBpad signal and the power-up detecting signal to OR operation and inversion.

Figure 18:
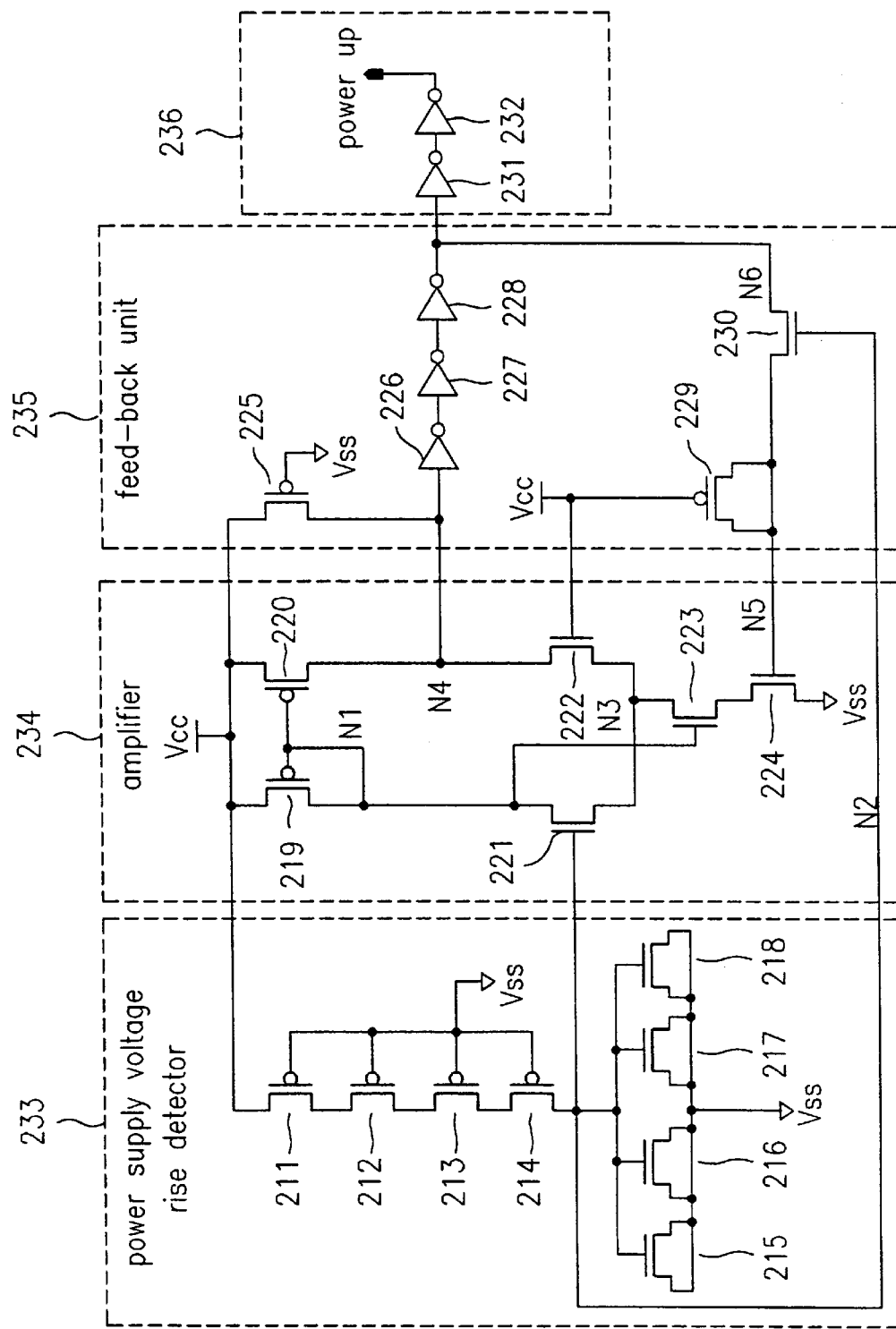
FIG. 18 illustrates a circuit diagram of a power-up detector in accordance with a first preferred embodiment of the present invention.

FIG. 18 illustrates a circuit diagram of a power-up detector in accordance with a first preferred embodiment of the present invention. A power supply voltage rise detector 233 having PMOS transistors 211~214 and NMOS transistors 215~218 senses a rise of a power supply voltage, and an amplifier 234 having PMOS transistors 219~220 and NMOS transistors 221~224 subjects a signal from the power supply voltage rise detector and the power supply voltage to comparison and amplification. A feed-back unit 235 having PMOS transistors 225 and 229, an NMOS transistor 230 and inverters 226~228 feeds back a signal from the amplifier 234 to provide a signal which exhibits a stability of the power supply voltage, and a power-up forwarder 236 having inverters 231 and 232 enhances a driving capability of a signal from the feed-back part 235 for use in the global pulse generator 16.

Figure 19:
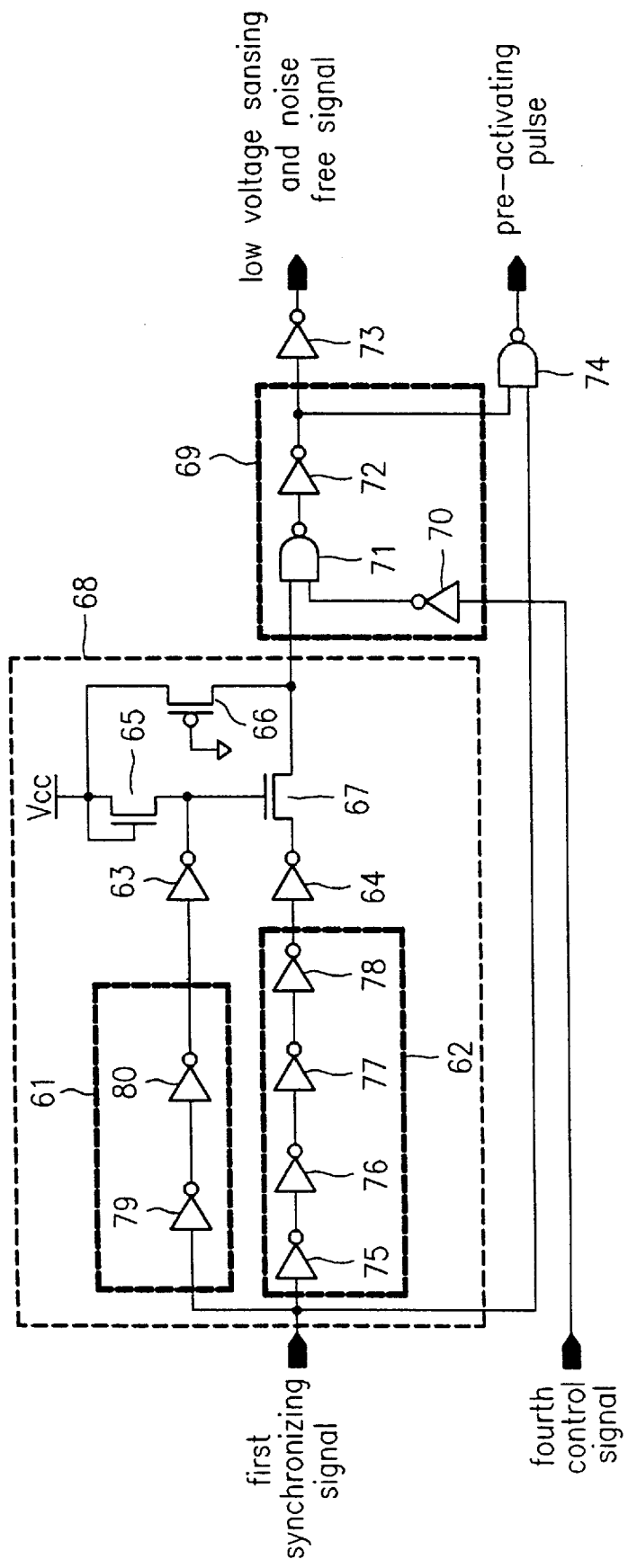
FIG. 19 illustrates a circuit diagram of a low voltage operation and noise reduction circuit in accordance with a first preferred embodiment of the present invention.
Figure 20:
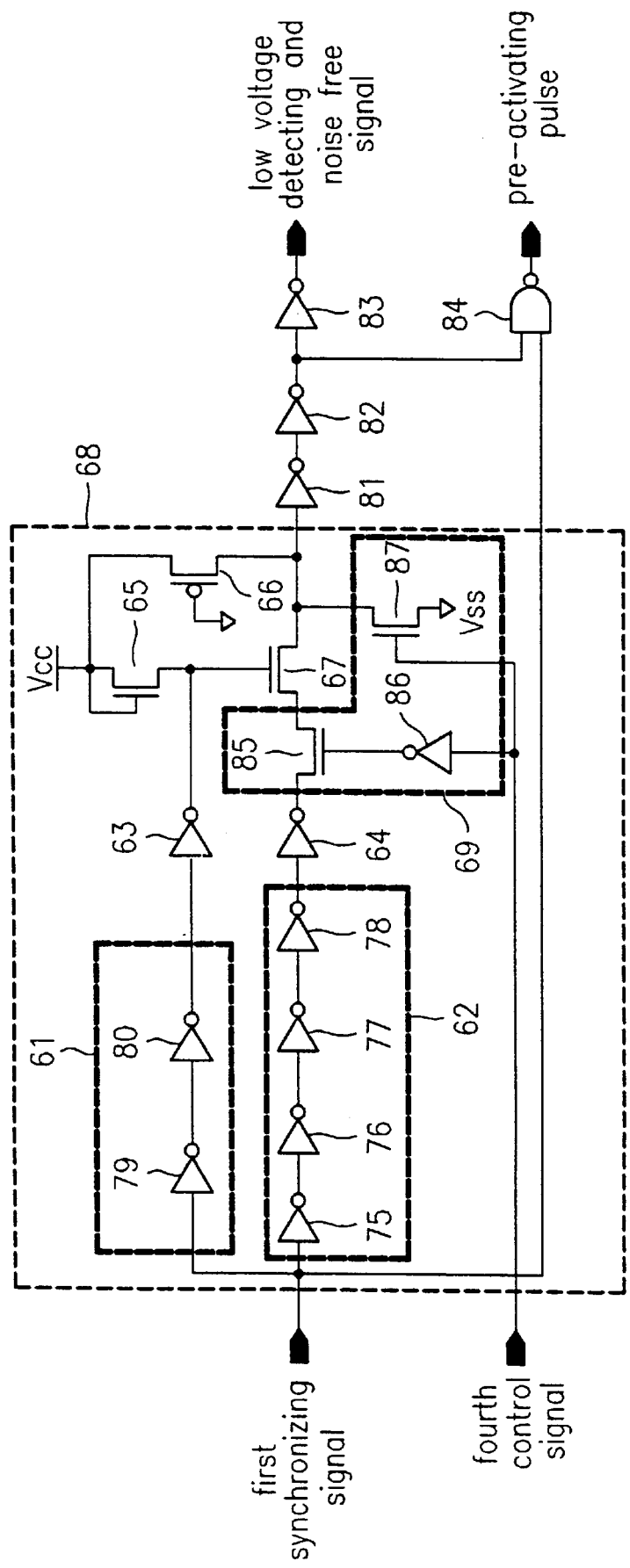
FIG. 20 illustrates a circuit diagram of a low voltage operation and noise reduction circuit in accordance with a second preferred embodiment of the present invention.

FIG. 19 illustrates a circuit diagram of a low voltage operation and noise reduction circuit in accordance with a first preferred embodiment of the present invention, and FIG. 20 illustrates a circuit diagram of a low voltage operation and noise reduction circuit in accordance with a second preferred embodiment of the present invention.

The low voltage operation and noise reduction circuit of the present invention has three primary functions. First, by detecting a low voltage and disabling a control pulse at the low voltage, a memory cell data is protected. Second, by delaying, a pulse width of a control signal C3 for use in controlling a low voltage pre-charge of a sense amplifier is controlled. Third, noise is removed from the externally applied signal (CSBpad signal).

Accordingly, referring to FIG. 19, the low voltage operation and noise reduction circuit in accordance with a first preferred embodiment of the present invention includes a low voltage sensing and delaying unit 68 for sensing a low voltage and delaying a pulse width of the control signal C3, and a noise removing unit 69 for removing noise. The low voltage sensing and delaying unit 68 includes a first delay 61 having inverters 79 and 80 for delaying the first synchronizing signal from the reception buffer 31 for a preset period of time. A second delay 62 includes inverters 76 and 78 for dropping a current driving capability of a PMOS and inverter 75 and 77 for enhancing driving capability of PMOS and NMOS, to delay a rising edge of the first synchronizing signal to reduce a "high" pulse width of the first synchronizing signal from the reception buffer 31. Inverters 63 and 64 invert signals from the first and second delay 61 and 62 respectively.

An NMOS transistor 65 has a gate electrode and a source electrode connected to a power supply terminal Vcc in common and a drain electrode connected to an output terminal of the inverter 63. An NMOS transistor 67 has a gate electrode connected to an output terminal on the inverter 63, a source electrode connected to the inverter 64 and a drain electrode adapted to forward a signal, and a PMOS transistor 66 having a gate electrode grounded, a source electrode and a drain electrode respectively connected to the power supply terminal and the drain electrode of the NMOS transistor 67.

The noise removing unit 69 includes an inverter 70 for inverting the fourth control signal fed-back from the second controller 34. An NAND gate 71 performs a NAND operation of a signal from the low voltage sensing and delaying unit 68 and a signal from the inverter 70. An inverter 72 inverts an output of the NAND gate 71, and an NAND gate 74 subjects the first synchronizing signal from the reception buffer 31 and an output from the inverter 72 to AND operation and inversion to provide a pre-activating pulse for controlling pre-charge of the sense amplifier, and an inverter 73 for inverting an output of the inverter 72 to provide a low voltage detecting and noise free signal.

The low voltage operation and noise reduction circuit in accordance with a second preferred embodiment of the present invention illustrated in FIG. 20 includes a noise removing unit 69 provided between the inverter 64 and the NMOS transistor 67 in the low voltage sensing and delaying unit 68 shown in FIG. 19. That is, the noise removing unit 69 includes an NMOS transistor 85 connected between the inverter 64 and the NMOS transistor 67, an inverter 86 for inverting a feed-back signal (the fourth control signal) from the second controller 34 and providing to the NMOS transistor 85, and an NMOS transistor 87 for grounding an output of the NMOS transistor 67 in response to the feed-back signal.

A system of a low voltage operation and noise reduction circuit can be provided by adding thereto of an inverter 81 for inverting an output of the NMOS transistor 67, an inverter 82 for inverting an output of the inverter 81, an NAND gate 84 for subjecting an output of the inverter 82 and the first synchronizing signal from the reception buffer 31 to AND operation and inversion to provide a pre-activating pulse, and an inverter 83 for inverting an output of the inverter 82 to provide a low voltage detecting and noise free signal.

Figure 21:
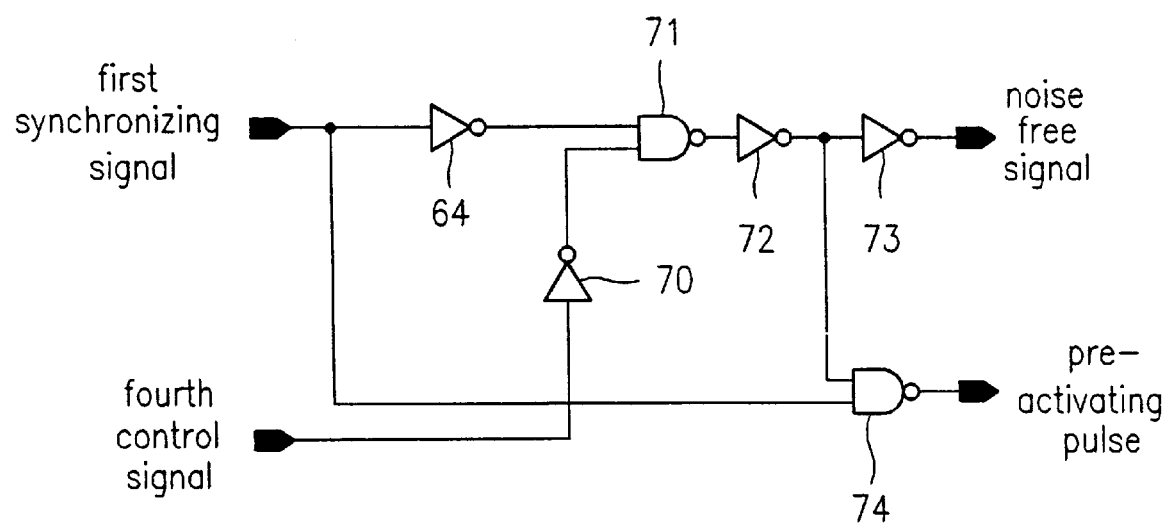
FIG. 21 illustrates a circuit diagram of a low voltage operation and noise reduction circuit in accordance with a third preferred embodiment of the present invention.
Figure 22:
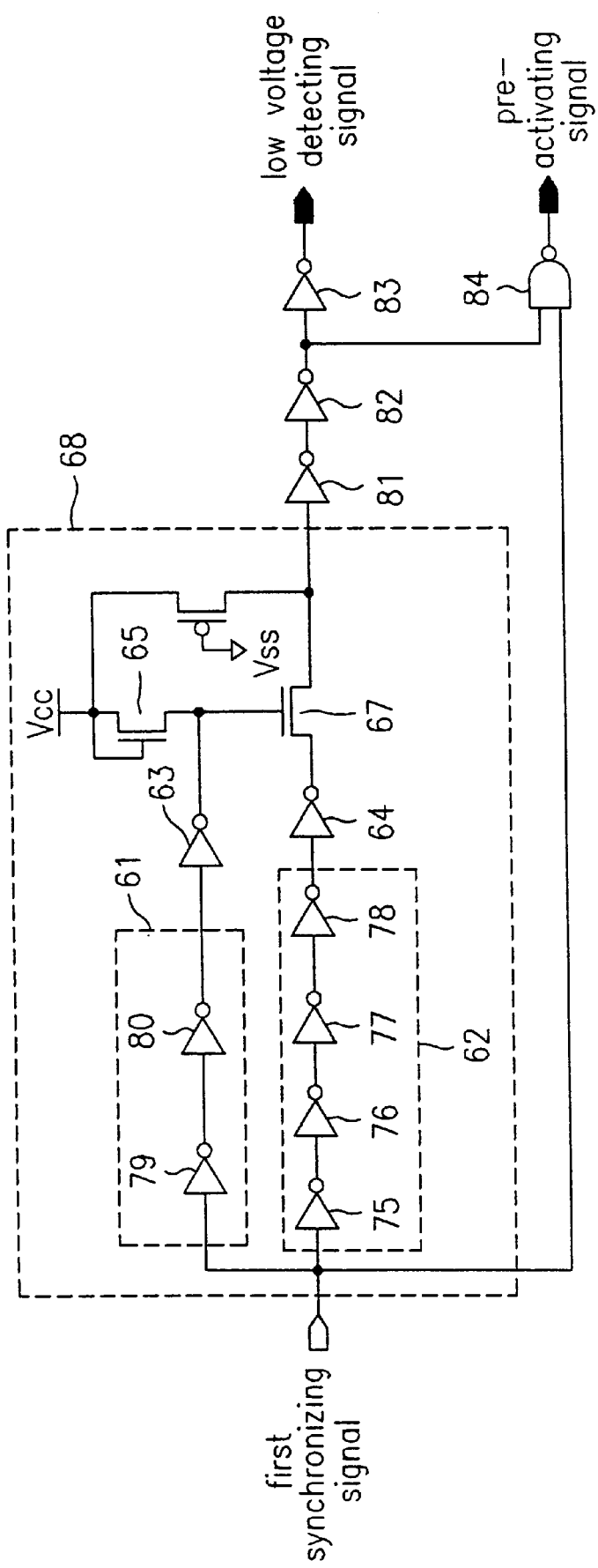
FIG. 22 illustrates a circuit diagram of a low voltage operation and noise reduction circuit in accordance with a fourth preferred embodiment of the present invention.

From the low voltage operation and noise reduction circuit shown in FIG. 19 or 20, the low voltage sensing and delaying unit 68, or the noise removing unit may be omitted. FIG. 21 illustrates a case when only the noise removing unit 69 is provided excluding the low voltage sensing and delaying unit in FIG. 19, and FIG. 22 illustrates a case when the low voltage sensing and delaying unit 68 is provided excluding the noise removing unit in FIG. 20.

Figure 23:
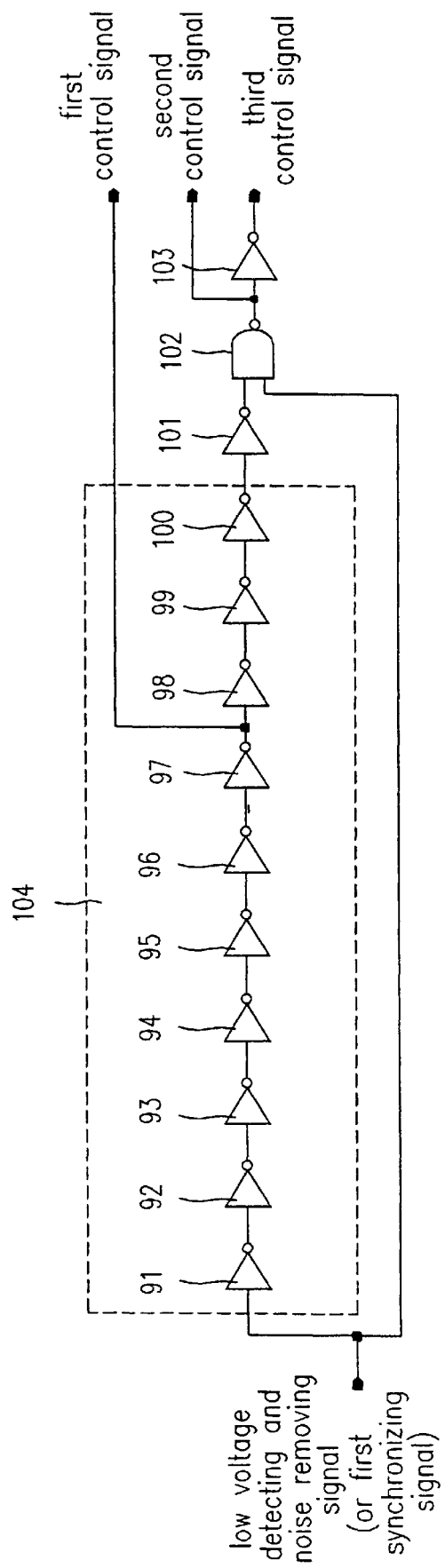
FIG. 23 illustrates a circuit diagram of a first controller in accordance with a first preferred embodiment of the present invention.

A detailed circuit of the first controller in the global control pulse generator of FIGS. 12 or 13 is shown in FIG. 23. The first controller of the present invention includes a third delay 104 having inverters 91~100 for delaying the low voltage detecting and noise free signal from the low voltage operation and noise reduction circuit or the first synchronizing signal from the reception buffer 31 for a certain time period to provide a first control signal. An inverter 101 inverts a signal from the third delay 104, and an NAND gate 102 subjects the low voltage detecting and noise free signal from the low voltage operation and noise reduction circuit or the first synchronizing signal from the reception buffer 31 and a signal from the inverter 101 to AND operation and inversion to provide a second control signal. An inverter 103 inverts an output of the NAND gate 102 to provide a third control signal.

Figure 24:
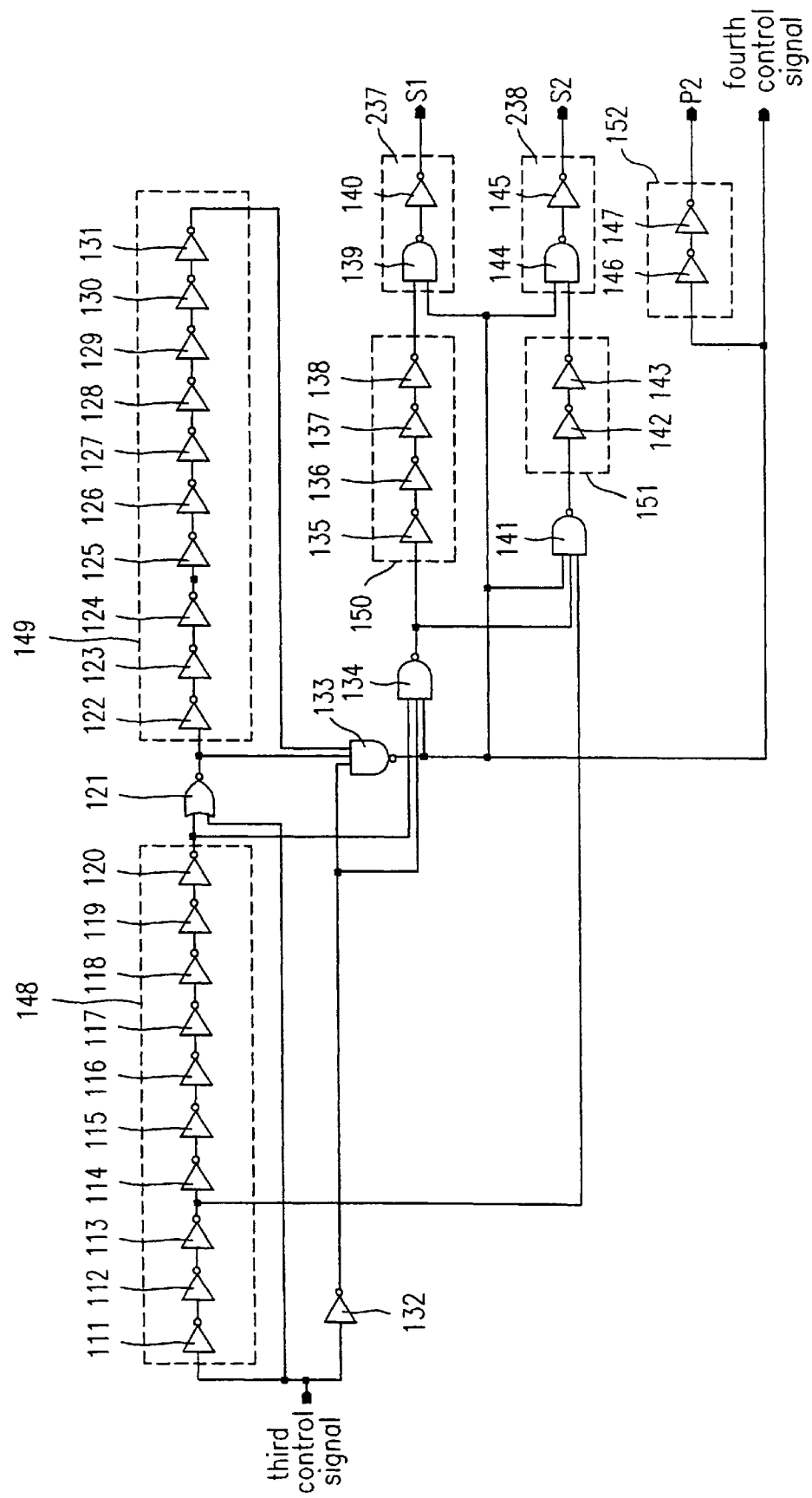
FIG. 24 illustrates a circuit diagram of a second controller in accordance with a first preferred embodiment of the present invention.

FIG. 24 illustrates a circuit diagram of a second controller in accordance with a first preferred embodiment of the present invention. A third delay 148 has (1) a plurality of inverters 111, 113, 115, 117 and 119 for reducing a current driving capability of a PMOS and enhancing a current driving capability of an NMOS in the sense amplifier and (2) a plurality of inverters 112, 114, 116, 118 and 120 for enhancing the current driving capabilities of the PMOS and NMOS transistors, and the third delay delays a falling edge of the third control signal from the first controller 33 for a predetermined time period. An NOR gate 121 subjects an output of the third delay 148 and the third control signal to OR operation and inversion.

A fourth delay 149 has (1) a plurality of inverters 123, 125, 127, 129 and 131 for reducing a current driving capability of the PMOS and enhancing a current driving capability of the NMOS in the sense amplifier and (2) a plurality of inverters 122, 124, 126, 128 and 130 for enhancing the current driving capabilities of the PMOS and NMOS transistors, and the fourth delay 148 delays a rising edge of a signal from the NOR gate 121 for a predetermined time period. An inverter 132 inverts the third control signal, and an NAND gate 133 subjects outputs of the inverter 132, the NOR gate 121 and the fourth delay 149 to AND operation and inversion to provide the fourth control signal, which is also used as a feed back signal. An NAND gate 134 subjects outputs of the inverter 132, the third delay 148 and the NAND gate 133 to AND operation and inversion, and a fifth delay 150 having inverters 135~138 delays a rising edge of an output of the NAND gate 133 for a predetermined time period.

An NAND gate 141 subjects outputs of the inverter 113, the NAND gate 134 and the NAND gate 133 to AND operation and inversion, and a sixth delay 151 having inverters 142 and 143 delays a rising edge of an output of the NAND gate 141 for a predetermined time period. An S1 signal forwarder 237 having an NAND gate 139 and an inverter 140 subjects outputs of the fifth delay 150 and the NAND gate 133 to AND operation to provide the basic waveform generating signal S1 of the SWL1. An S2 signal forwarder 238 having an NAND gate 144 and an inverter 145 subjects outputs of the sixth delay 151 and the NAND gate 133 to AND operation to provide the basic waveform generating signal S2 of the SWL2. A pulse signal forwarder 152 having inverters 146 and 147 for enhancing a signal driving capability of the NAND gate 133 provides a pulse signal P2.

Figure 25:
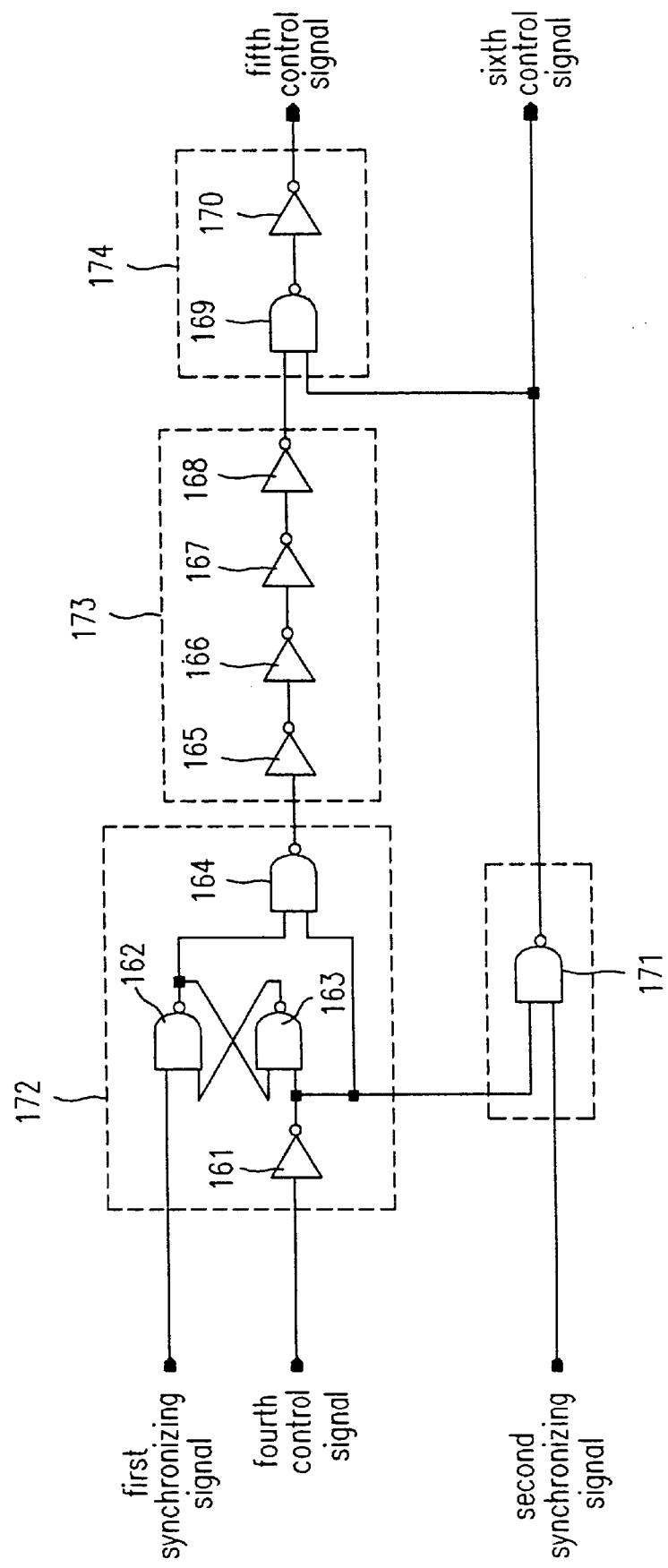
FIG. 25 illustrates a circuit diagram of a third controller in accordance with a first preferred embodiment of the present invention.
Figure 26:
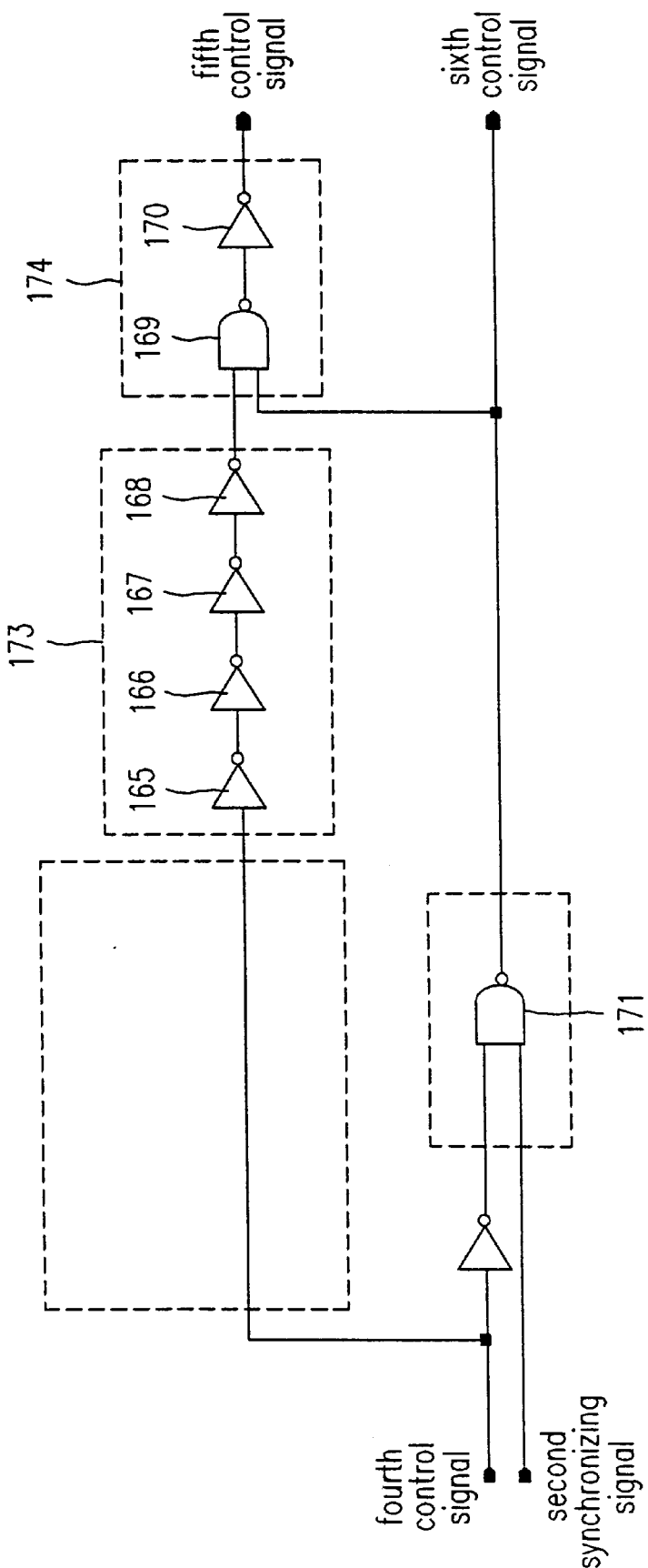
FIG. 26 illustrates a circuit diagram of a third controller in accordance with a second preferred embodiment of the present invention.
Figure 27:
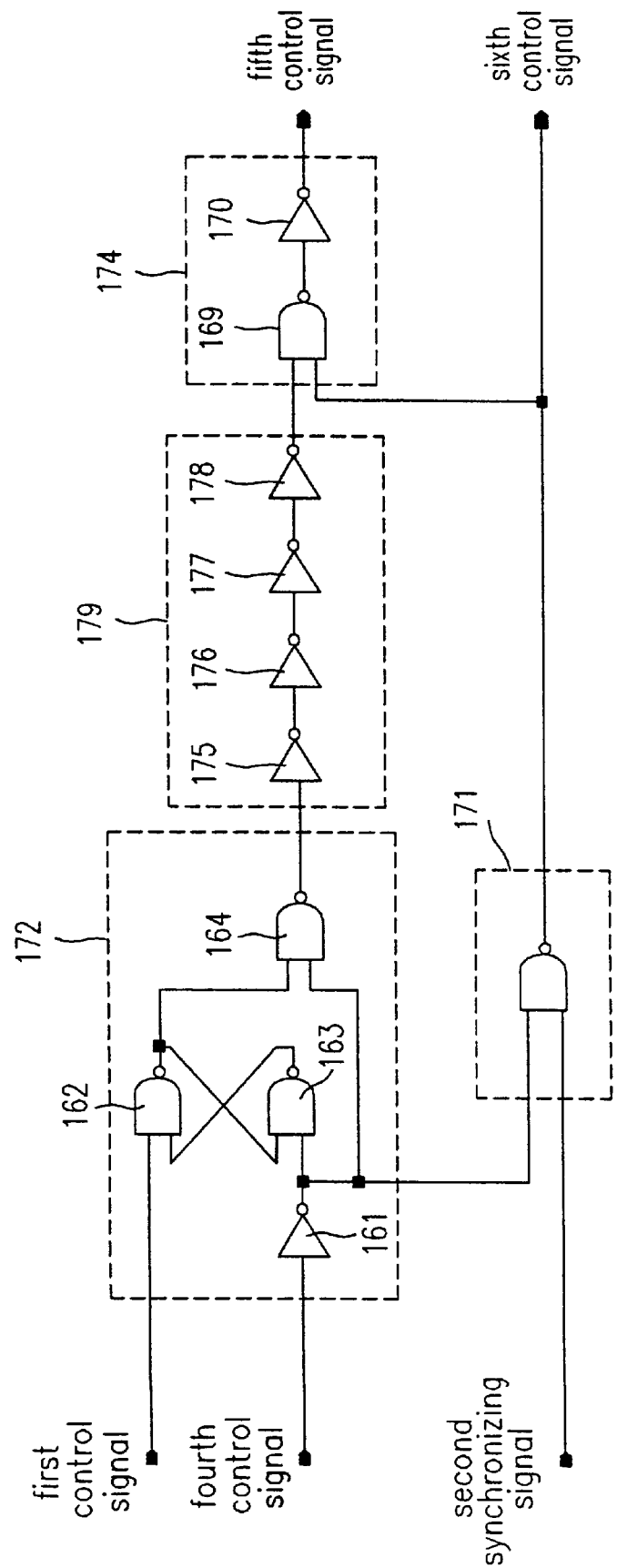
FIG. 27 illustrates a circuit diagram of a third controller in accordance with a third preferred embodiment of the present invention.

FIG. 25 illustrates a circuit diagram of a third controller in accordance with a first preferred embodiment of the present invention, FIG. 26 illustrates a circuit diagram of a third controller in accordance with a second preferred embodiment of the present Or invention, and FIG. 27 illustrates a circuit diagram of a third controller in accordance with a third preferred embodiment of the present invention.

The third controller in accordance with a first preferred embodiment of the present invention includes a signal extender 172 having an inverter 161 and NAND gates 162, 163 and 164 for receiving the first synchronizing signal from the reception buffer 31 and the fourth control signal from the second controller 34 for extending a high pulse of the pulse signal P2 from the second controller 34 until a time when the CSBpad signal is held enabled at "low". A seventh delay 173 having inverters 165~168 delays the rising edge of a signal from the signal extender 172 for a predetermined time period. An NAND gate 171 subjects an inverted signal of the fourth control signal and the second synchronizing signal from the reception buffer 31 to AND operation and inversion to provide the sixth control signal, a control signal forwarder 174 having an NAND gate 169 and an inverter 170 subjects outputs of the seventh delay 173 and the NAND gate 171 to AND operation to provide the fifth control signal.

Referring to FIG. 26, in the third controller in accordance with a second preferred embodiment of the present invention, the signal extender 172 is omitted from the system of the third controller shown in FIG. 25, to provide the fourth control signal to the a seventh delay 173, directly. Referring to FIG. 27, in the third controller in accordance with a third preferred embodiment of the present invention, while the seventh delay 173 in FIG. 25 is adapted to delay the rising edge of the signal from the signal extender 172, the eighth delay 179 of the third embodiment in FIG. 27 is adapted to delay all portion (including the rising edge and the falling edge) of the signal from the signal extender 172.

Figure 28:
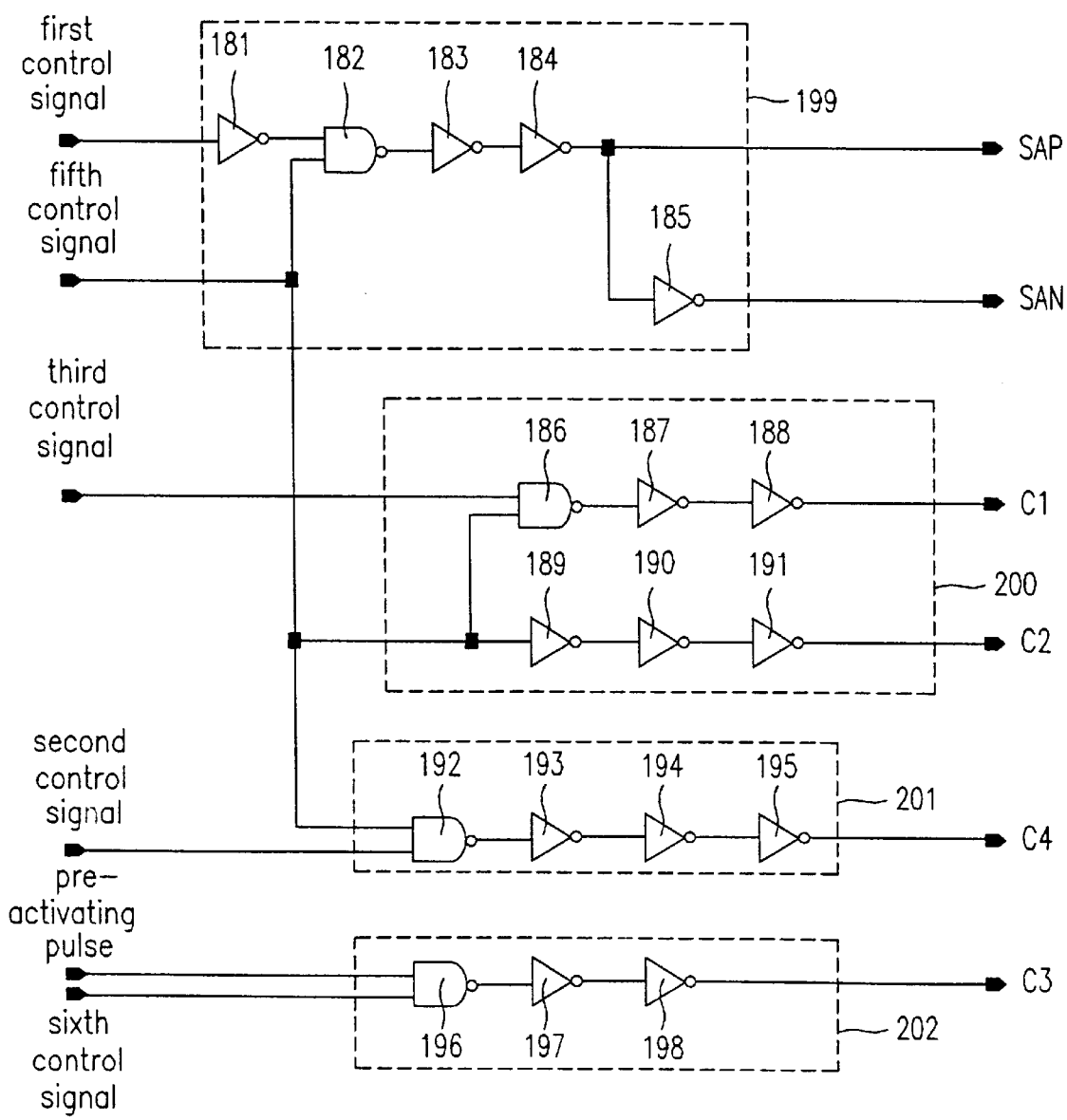
FIG. 28 illustrates a circuit diagram of a fourth controller in accordance with a first preferred embodiment of the present invention.
Figure 29:
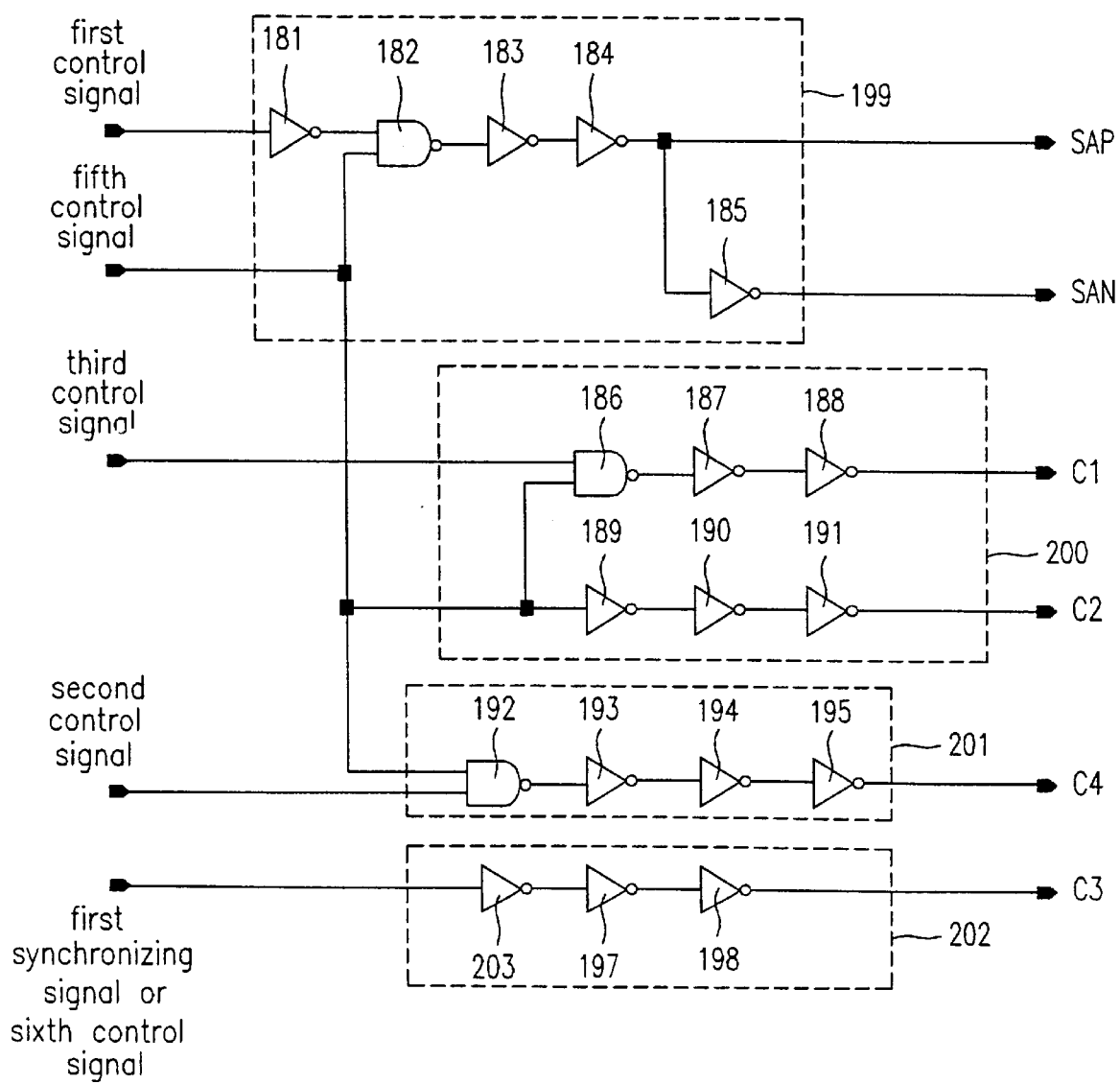
FIG. 29 illustrates a circuit diagram of a fourth controller in accordance with a second preferred embodiment of the present invention.

FIG. 28 illustrates a circuit diagram of a fourth controller for the global control pulse generator in accordance with a first preferred embodiment of the present invention shown in FIG. 12, and FIG. 29 illustrates a circuit diagram of a fourth controller for the global control pulse generator in accordance with a second preferred embodiment of the present invention shown in FIG. 13.

Referring to FIG. 28, the fourth controller in accordance with a first preferred embodiment of the present invention includes a sense amplifier control signal forwarder 199 having inverters 181, 183, 184 and 185 and an NAND gate 182 for subjecting the first control signal from the first controller 33 and the fifth control signal from the third controller 35 to AND operation and inversion to provide an enable signal SAN for the NMOS device in the sense amplifier and an enable signal SAP for the PMOS device in the sense amplifier. A bitline switching signal forwarder 200 having an NAND gate 186 and inverters 187~191 subjects the third control signal from the first controller 33 and the fifth control signal from the third controller 35 to logical operation to provide a control signal C1 for connecting a bitline in a main cell block and a first I/O node on the sense amplifier and a control signal C2 for connecting a bitline in a reference cell block and a second I/O node on the sense amplifier.

A column control signal forwarder 201 having an NAND gate 192 and inverters 193, 194 and 195 subjects the second control signal from the first controller 33 and the fifth control signal from the third controller 35 to logical operation to provide a control signal C4 for providing a column control signal. A pre-charge control signal forwarder 202 having an NAND gate 196 and inverters 197 and 198 subjects the pre-activating pulse from the low voltage operation and noise reduction circuit 32 and the sixth control signal from the third controller 35 to logical operation to provide a pre-charge control signal C3.

Referring to FIG. 29, the fourth controller in accordance with a second preferred embodiment of the present invention includes a sense amplifier control signal forwarder 199 having inverters 181, 183, 184 and 185 and an NAND gate 182 for subjecting the first control signal from the first controller 33 and the fifth control signal from the third controller 35 to AND operation and inversion to provide an enable signal SAN for the NMOS device in the sense amplifier and an enable signal SAP for the PMOS device in the sense amplifier. A bitline switching signal forwarder 200 having an NAND gate 186 and inverters 187~191 subjects the third control signal from the first controller 33 and the fifth control signal from the third controller 35 to a logical operation to provide a control signal C1 for connecting a bitline in a main cell block and a first I/O node on the sense amplifier and a control signal C2 for connecting a bitline in a reference cell block and a second I/O node on the sense amplifier.

A column control signal forwarder 201 having an NAND gate 192 and inverters 193, 194 and 195 subjects the second control signal from the first controller 33 and the fifth control signal from the third controller 35 to logical operation to provide a control signal C4 for providing a column control signal. A pre-charge control signal forwarder 202 having inverters 197, 198 and 203 subjects the first synchronizing signal from the reception buffer 31 or the sixth control signal from the third controller 35 to logical operation to provide a pre-charge control signal C3.

Figure 30:
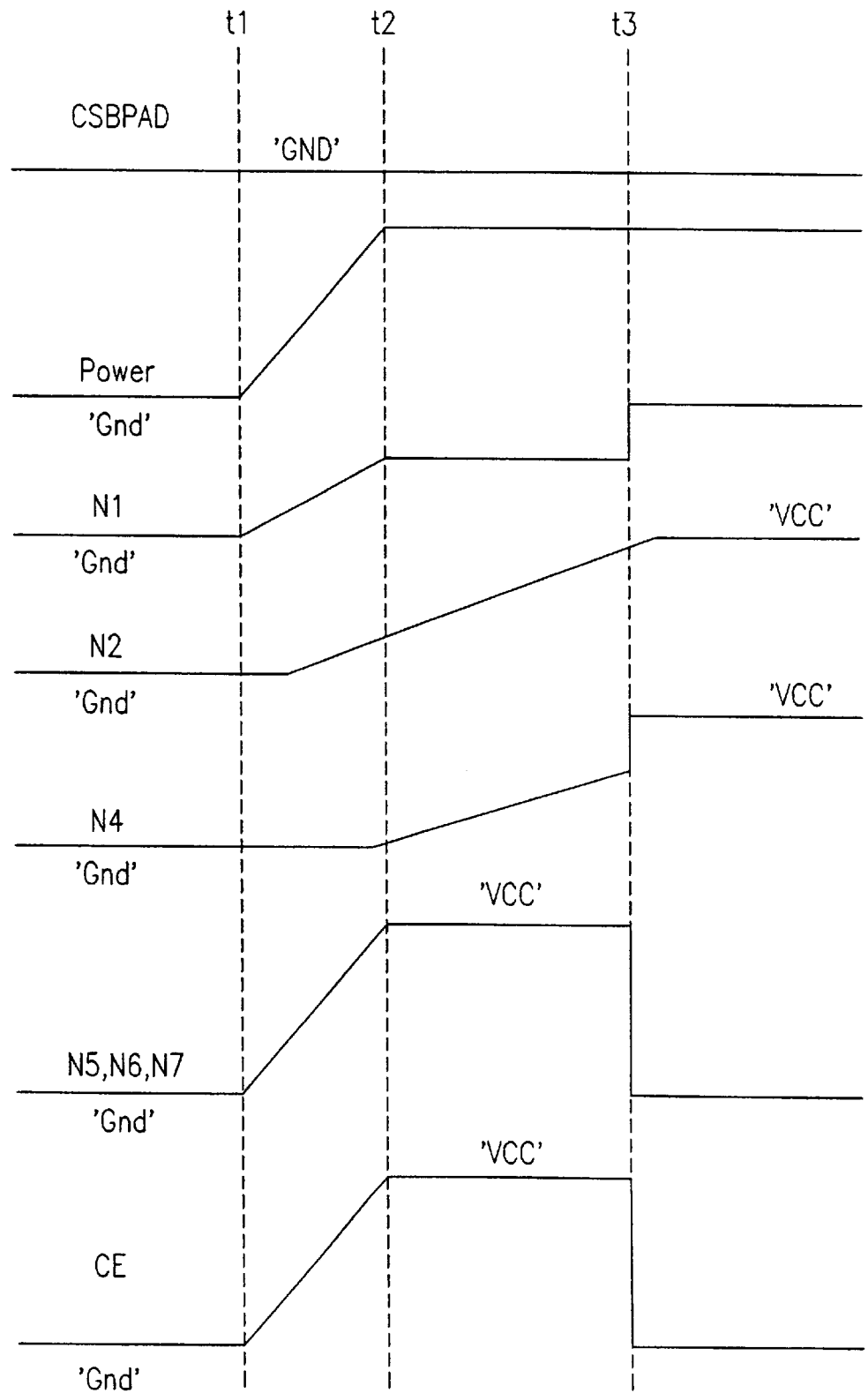
FIG. 30 illustrates operation timings of the power-up detector in accordance with a preferred embodiment of the present invention.

A method for driving the aforementioned SWL ferroelectric memory will be explained. FIG. 30 illustrates waveforms from different parts of the power-up detector of the present invention. Referring to FIG. 30, it is assumed that the CSBpad signal, a chip enable signal, is fixed at a ground voltage, to bring the chip into an enable state in all sections thereof upon power-up. At a time before t1 when no power is applied yet, node signals N1~N6 are in a grounded state.

[t1~t2 interval]

The power is raised from ground voltage to Vcc. A signal on node N1 rises, but with a mild slope, as the PMOS transistor 219 is pulled-up. A signal on a node N2 rises slowly due to delay. A signal on node N4 is amplified to become a ground voltage. A signal on node N5 rises to a floating condition as the NMOS transistor 230 in a turned off state, and a signal on node N6 also rises by an influence from the signal on node N4.

[t2~t3 interval]

When the NMOS transistor 221 is turned on as a signal voltage on the node N2 rises higher than a threshold voltage Vtn, the amplifier is brought into operation, to drop the signal on node N1 slowly, to raise the signal on node N4 to a voltage which is not enough to invert an output of the inverter 226, to hold the signals on nodes N5 and N6 at Vcc, respectively.

[interval beyond t3]

The signal on node N4 keeps on rising to a voltage higher than a threshold voltage Vt of the inverter 226 when signals on nodes N5 and N6 are inverted from "high" to "low", to turn off the NMOS transistor 224, disabling the amplifier 234. The signal on node N4 rises to Vcc by a current from the PMOS transistor 225, and the power-up signal is brought to a low state. Therefore, though the CSBpad signal is fixed at "low", the power-up signal which is one of received signals is turned from "high", a disabled state, to "low", an enabled state, in the reception buffer 31.

Figure 31:
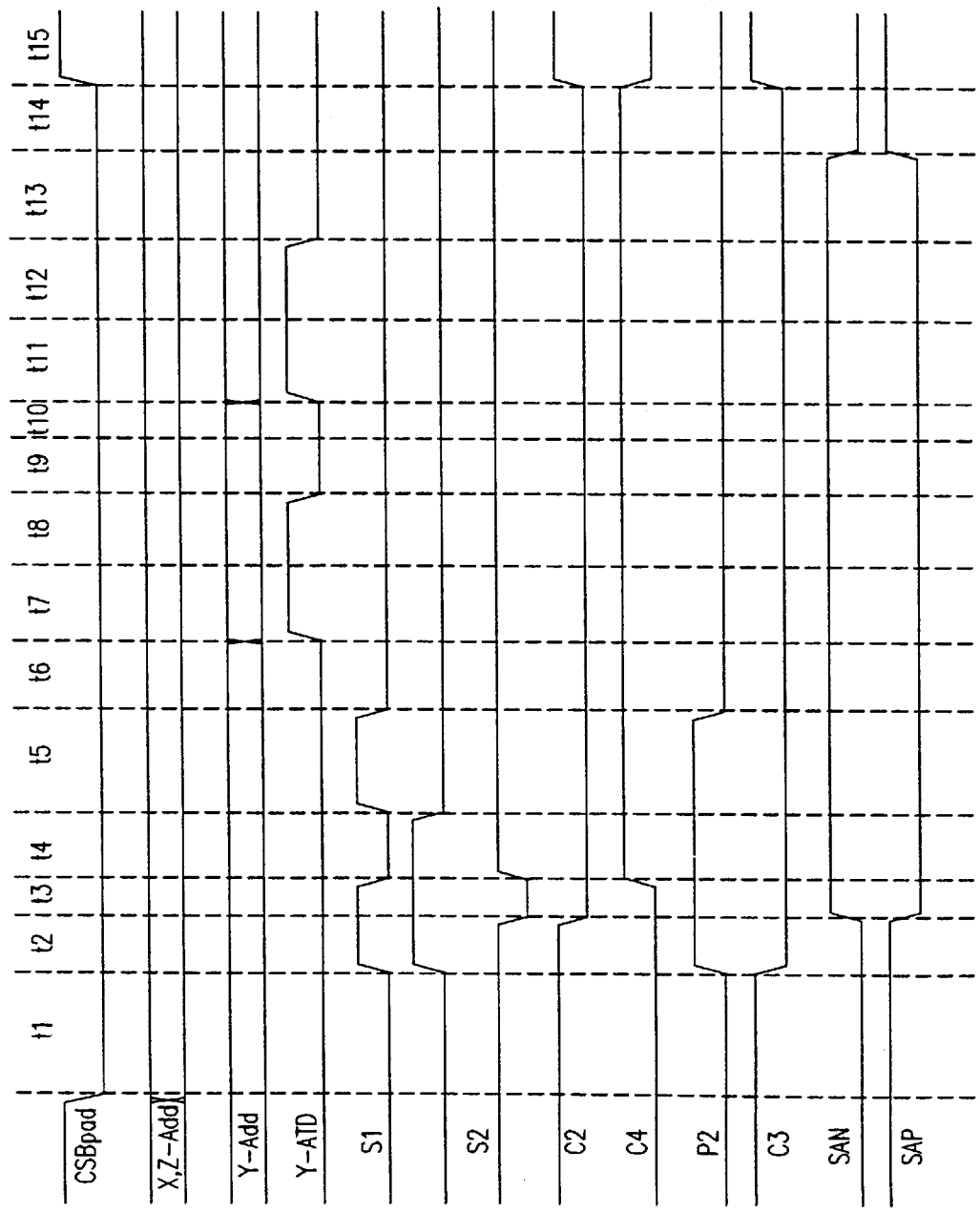
FIG. 31 illustrates operation timings of the first embodiment global control pulse generator in accordance with ;he present invention.
Figure 32:
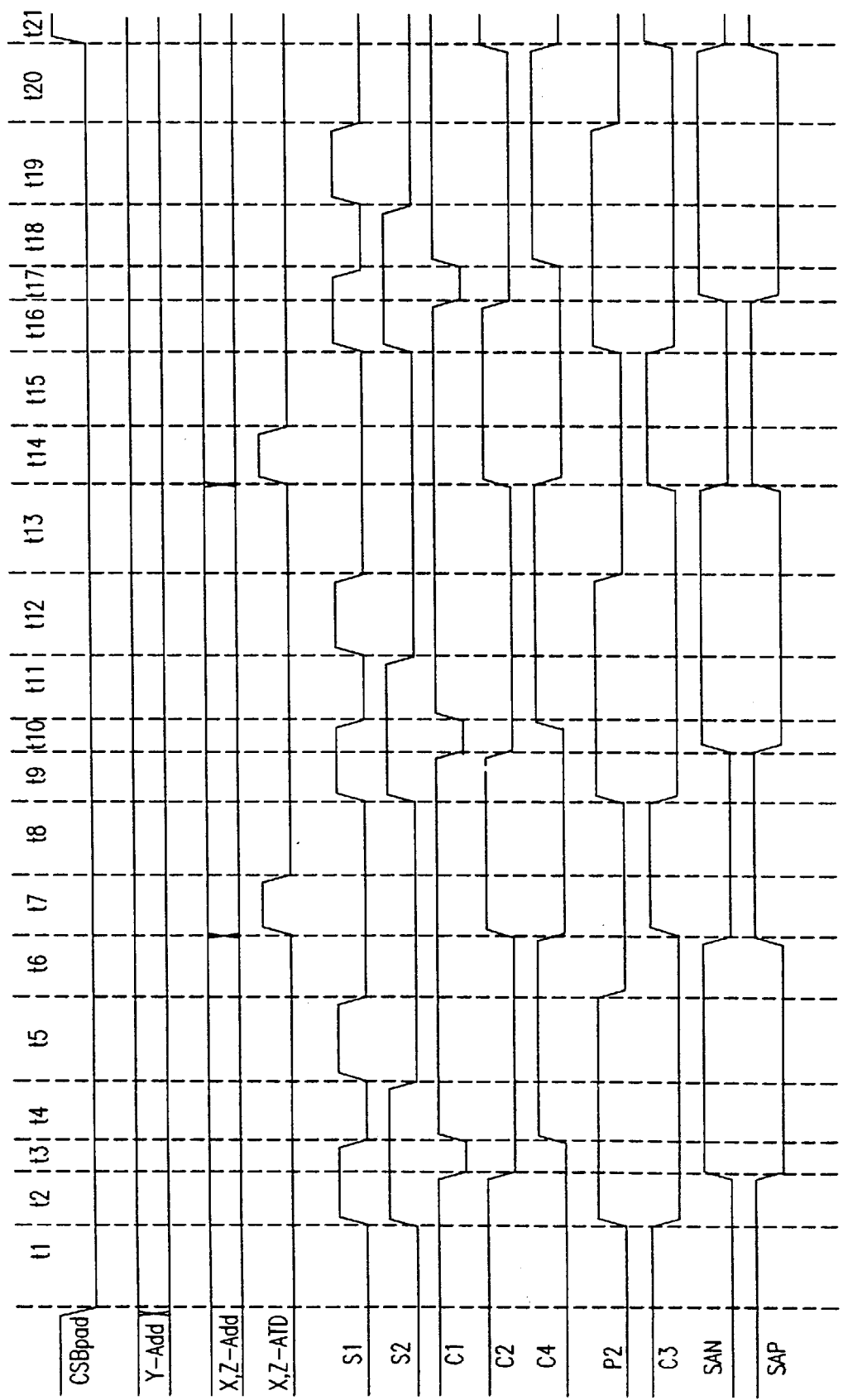
FIG. 32 illustrates operation timings of the second embodiment global control pulse generator in accordance with the present invention.
Figure 33:
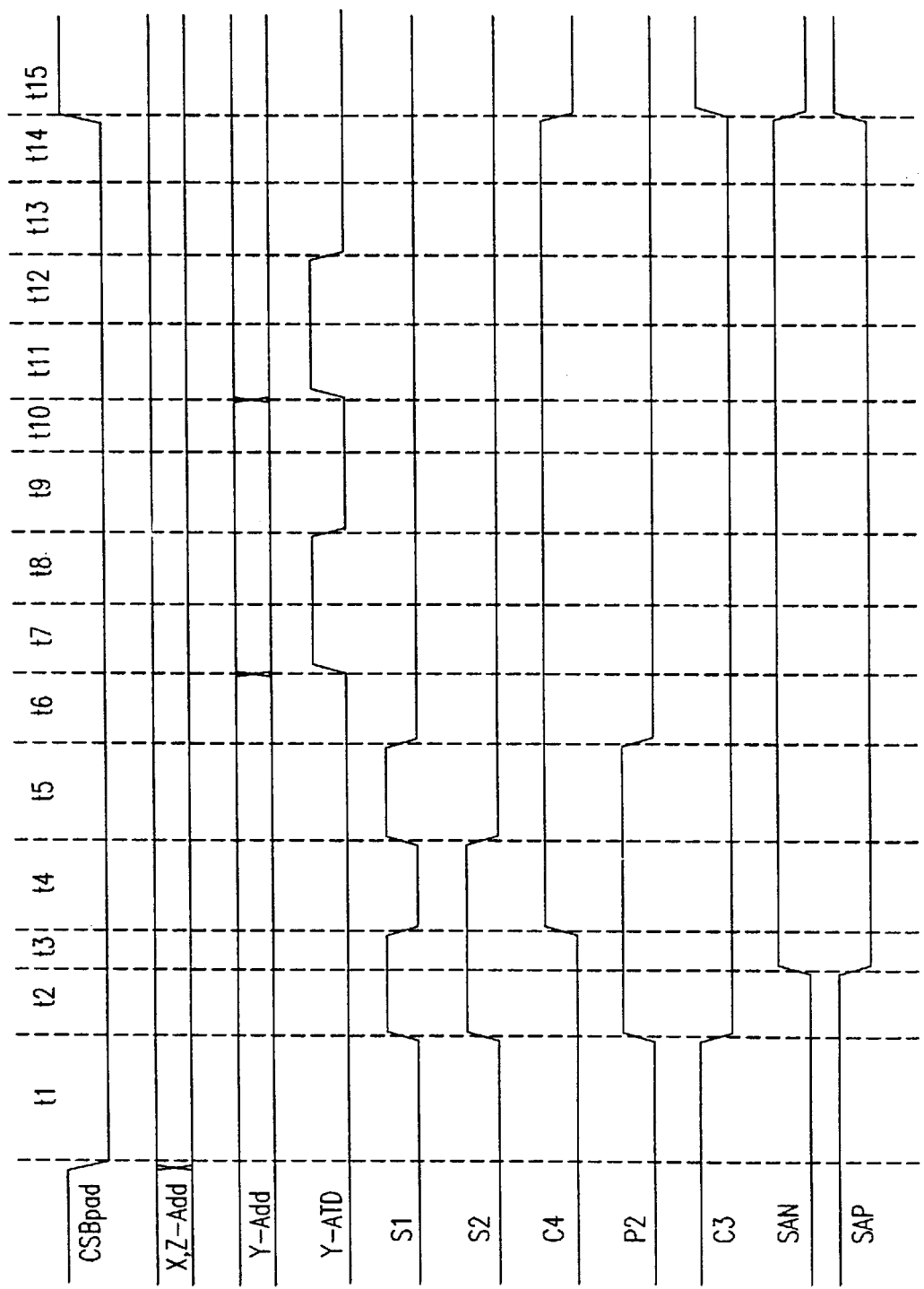
FIG. 33 illustrates operation timings of the third embodiment global control pulse generator in accordance with the present invention; and, FIG. 34 illustrates operation timings of the fourth embodiment global control pulse generator in accordance with the present invention.
Figure 34:
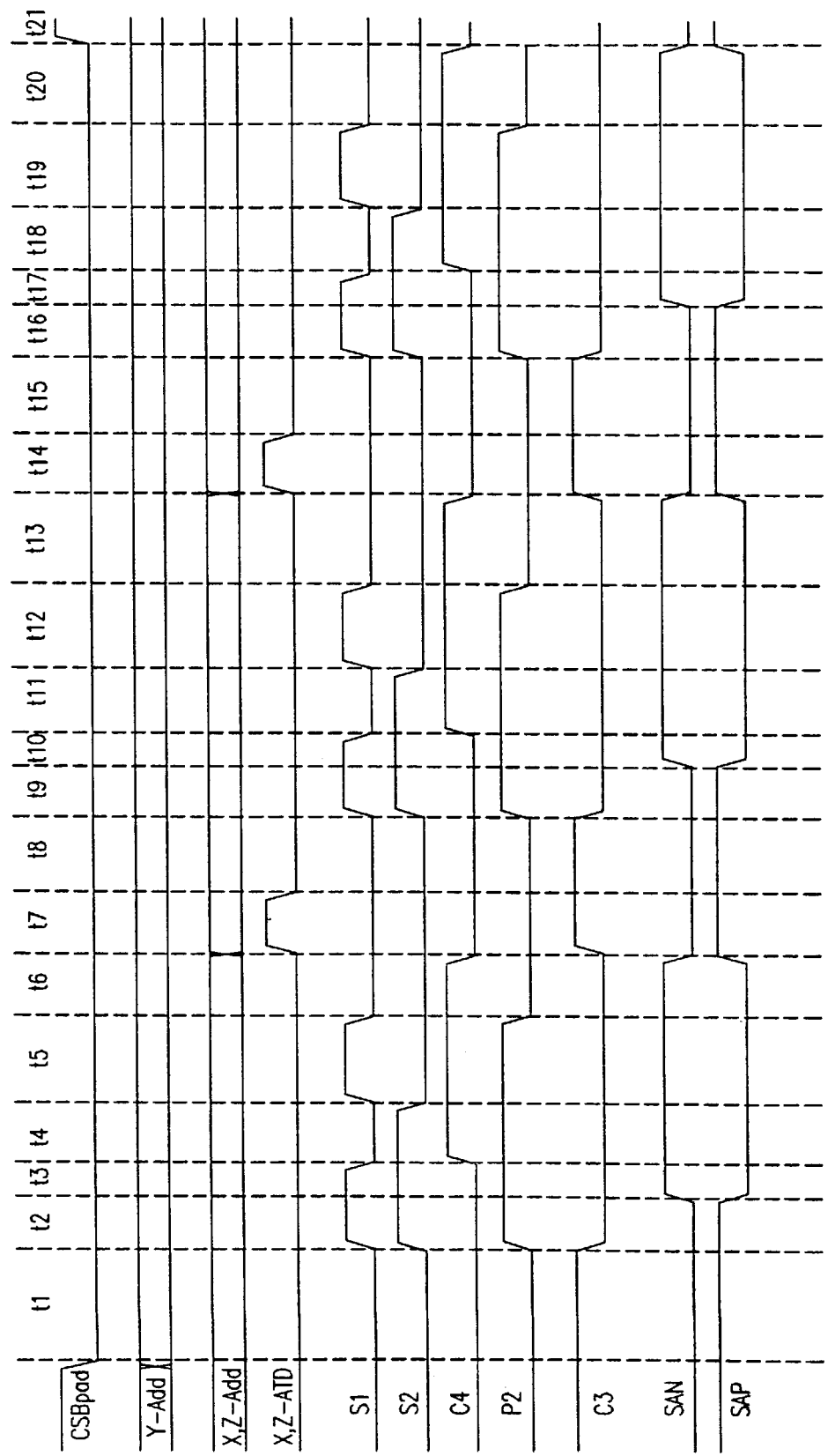

Waveforms from the global control pulse generator of the present invention using the power-up detector will be explained. FIG. 31 illustrates operation timings of the first embodiment global control pulse generator in accordance with the present invention, FIG. 32 illustrates operation timings of the second embodiment global control pulse generator in accordance with the present invention, FIG. 33 illustrates operation timings of the third embodiment global control pulse generator in accordance with the present invention, and FIG. 34 illustrates operation timings of the fourth embodiment global control pulse generator in accordance with the present invention.

The operation of the global control pulse generator of the present invention more or less differs depending on cell array systems, X, Z-address toggle, or Y-address toggle. The operation of the global control pulse generator is shown in FIG. 31, which is the first embodiment, in a case when the cell array system of FIG. 8 or 9 and the Y-address is toggled. Because the chip is enabled when the chip enable signal CSBpad signal applied externally is at "low", the chip will be brought into an enabled state when the CSBpad signal is turned from "high" to "low". Therefore, a disabled interval at a "high" state is required for conducting a new read or write. As shown in FIG. 31, one complete cycle of operation is divided from t1 interval to t15 interval, for convenience of explanation of signal behaviors.

First, it is assumed that the CSBpad signal is enabled at "low" from a starting point of the t1 interval to an end point of the t4 interval and disabled at "high" from a starting point of the t15 interval. It is assumed that there are no transition in X and Z addresses, a Y address transits at a starting point of t7 interval and a starting point of t11 interval respectively during the CSBpad signal is at an enabled state. A Y-ATD senses a change of a Y address to generate a high pulse from t7 to t8 intervals and t11 to t12 intervals, respectively. The S1 and S2 signals are pulses for use in formation of basic waveforms for wordlines SWL1 and SWL2 for an SWL cell.

First, the CSBpad signal is transited from "high" to "low" at t1 interval to enable the chip, when X-, Y- and Z-addresses are kept the states before t1. Y-ATD signal is transited to "high" from t7 to t8 interval if the Y-address is transited at a t7 starting time point. If Y-address is transited at a t11 starting time point, the Y-ATD signal is transited to "high" from t11 to t12 intervals. The S1 signal is held at "low" until t1 interval, at "high" from t2 to t3 intervals, at "low" in t4 interval, at "high" in t5 interval, and at "low" from t6 to t15 intervals. S2 is held at "high" from t3 to t4 intervals, otherwise held at "low".

The C1 signal, which is a basic signal for controlling signal flow between a main cell bitline and one I/O terminal on the sense amplifier, is held at "low" only in t3 interval, and is held at "high" otherwise, to cut-off signal flow between the main cell bitline and one I/O terminal on the sense amplifier only in t3 interval. The C2 signal, which is a basic signal for controlling a signal flow between a reference cell bitline and the other I/O terminal on the sense amplifier, provides a pulse which held at "low" from t3 interval to t14 interval, to cut-off the signal flow between a reference cell bitline and the other I/O terminal on the sense amplifier from t3 interval to t14 interval. The C4 signal, which controls signal transmission between a main cell bitline and external data bus and pull-up of a reference cell bitline, is held at "high" from t4 to t14 and transits to "low" again at a time point at which the CSBpad signal is disabled (an end point of the t14interval), to allow control of signal transmission between a main cell bitline and external data bus and pull-up of a reference cell bitline only from t4 to t14 intervals.

The P2 signal is held at high in intervals from t2 to t5 in which the S1 and S2 signals are held at high for protecting the S1 and S2 signals from external interference, and is transited to "low" at t6 starting time point, again. The C3 signal, which pre-charges a low voltage on the main cell bitline and the reference cell bitline before S1 and S2 are enabled, is, while held at "high" as before until t1 interval, transited to "low" at t2 starting time point, held at "low" to an end of t14 to disable the pre-charge, and is transited to "high" again in intervals other than these (a time point at which the CSBpad signal is disabled).

The SAN signal (a preliminary signal for producing an SAN_C signal which is a signal for controlling transistors with NMOSs for operating the sense amplifier in the sense amplifier and I/O controller) is held at "low" as before, and transited to "high" at t3 starting point and to "low" at a time point when the CSBpad signal is disabled. SAP signal (a preliminary signal of an SAP_P signal which controls transistors with PMOSs for operating the sense amplifier in the sense amplifier and I/O controller) behaves opposite to the SAN signal and is held at "high" until t2 interval, a previous state, transited to "low" at t3 starting point, and transited to "high" at a time point when the CSBpad signal is disabled. Thus, under a state when the CSBpad signal is enabled, if Y-address is transited to occur Y-ATD, in case it is a write mode, a logic "0" is written on a relevant cell in intervals both the S1 and S2 are at "high", i.e., from t2 interval to t3 interval, and logic "1" is written on the cell in intervals only one of the S1 and S2 signals is at "high", i.e., from t4 interval to t5 interval.

The operation of the global control pulse generator is shown in FIG. 32, which is the second embodiment, in a case when the cell array system of FIG. 8 or 9 and the X, Z-address are toggled. One complete cycle of operation is divided from t1 interval to t21 interval, and both X, Z-addresses are transited at starting points of t7 and t14 intervals. Because the operation of the global control pulse generator in a case of the X, Z-address toggle is also similar to the operation of the operation of the global control pulse generator in the case of the Y-address toggle, portions of which operations are different will be explained.

While Y-ATD signal is transited to "high" at a time point when a Y-address is transited in FIG. 31, as it is assumed in the second embodiment of the present invention that both X, Z-addresses are transited at starting points of t7 and t14 intervals, X, Z-ATD signals are held at "high" in t7 interval and t14 interval and at "low" in rest of the intervals. When the X, Z-addresses are transited, the global control pulse generator compounds X, Z-ATD signals with CSBpad signal in using them. Therefore, if the X, Z-ATD signals are present at "high" (t7 and t14), the global control pulse generator senses that the CSBpad signal is enabled again in the interval. Accordingly, the global control pulse generator provides all signals again, to enable normal accesses to the X, Z-addresses.

Both S1 and S2 signals are started after a certain interval (t1) from a transit of the CSBpad signal to "low" and also started after a certain interval (t8 and t15) from a time point of transits of the X, Z-ATD signals to "low". That is, S1 signal is held at "high" in t2–t3 intervals, t5 interval, t9–t10 intervals, t16–t17 intervals and t19 interval, and held at "low" in rest of the intervals. The S2 signal is held at "high" in t2–t4 intervals, t9–t11 intervals and t16–t18 intervals, and held at "low" in rest of the intervals.

The C1 signal is transited and held at "low" for one interval (t3, t10 and t17) of intervals in which both the S1 and S2 signals are at "high" (t1–t3, t9–t10 and t16–t17), and transited to "high" again. The C2 signal is transited from "high" to "low" at a time point when the C1 signal is transited to "low" as above, and transited from "low" to "high" at a time point when the X, Z-ATD signal is transited to "high". The C4 signal is transited from "high" to "low" at a time point when C1 signal is transited to "high", and transited from "high" to "low" at a time point when the X, Z-ATD signal is transited to "high". The P2 signal is transited from "low" to "high" at a time point when both the S1 and S2 signals are transited to "high", and transited from "low" to "high" at a time point when the X, Z-ATD signals are transited to "high". The SAN and SAP signals are transited to opposite states at a time point of the C2 signal transit. Accordingly, a logic "0" is written on a relevant cell in intervals both the S1 and S2 signals are at "high", i.e., intervals of t1–t3, t9–t10 and t16–t17. And, a logic "1" is written in a relevant cell in intervals only one of the S1 and S2 signals are at "high", i.e., in intervals of t4–t5, t11–t12 and t18–t19.

The operation of the global control pulse generator in a case when the cell array has a system as shown in FIG. 10 and a Y-address is toggled is as shown in FIG. 33. One complete cycle of operation is divided from t1 interval to t15 interval, to explained behaviors of signals. The cell array system shown in FIG. 10 requires no C1 and C2 signals as the cell array system has bitlines and bitbarlines but without reference cells. It is assumed that the CSBpad signal is enabled to "low" from a t1 interval starting point to a t14 interval end point and disabled to "high" from a t15 interval starting point, and, while the CSBpad signal is enabled, though the X, Z-addresses are not transited, the Y-address is transited at t7 and t11 interval starting points. Then, Y-ATD signal, on sensing the Y-address transition, is transited to and held at "high" from t7 interval to t8 interval and from t11 interval to t12 interval.

The S1 and S2 signals being signals used for forming basic waveforms for the SWL1 and the SWL2 split wordlines of the SWL memory cell, S1 signal is provided as pulses at "high" in t2–t3 intervals and t5 interval and S2 signal is provided as pulses at "high" in t2–t4 intervals. Being a signal for controlling a signal transmission between a main cell bitline and an external data bus and pull-up of the main cell bitline and bitbarline, C4 signal is transited from "low" to "high" at t4 interval starting time point and transited to "low" again at a time point when CSBpad signal is disabled (before starting of t15), allowing the signal transmission between a main cell bitline and a dataline.

Adapted to be held at "high" in t2–t5 intervals in which both S1 and S2 signals have normal pulses (at "high"), P2 signal interlocks S1 and S2 signals for preventing S1 and S2 signals from interference by other signals. That is, by being held at high in intervals between t2 to t5 in which S1 and S2 signals are normal, P2 signal protect S1 and S2 signals being normal from interference by other signals in these intervals.

Disabling pre-charge in t2–t4 intervals and enabling precharge in rest of the intervals, C3 signal is held at "high" until t1 interval, transited to "low" at t2 starting time point and transited to "high" again at a time point when CSBpad signal is disabled. The SAN signal, a preliminary signal for producing an SAN_C signal which is a signal for controlling NMOS transistors for operating the sense amplifier in the sense amplifier and I/O controller, is held at "low", and transited to "high" at t3 starting point and to "low" at a time point when the CSBpad signal is disabled. The SAP signal, a preliminary signal of an SAP P signal which controls PMOS transistors for operating the sense amplifier in the sense amplifier and I/O controller) behaves opposite to the SAN signal; held at "high" until t2 interval, transited to "low" at t3 starting point, and transited to "high" again at a time point when the CSBpad signal is disabled. Accordingly, a logic "0" is written on a relevant cell in intervals both S1 and S2 signals are at "high", i.e., in intervals of t2–t3. And, a logic "1" is written on a relevant cell in intervals only one of S1 and S2 signals are at "high", i.e., in intervals of t4–t5.

The operation of the global control pulse generator in a case when the cell array has a system as shown in FIG. 10 and X, Z-addresses are toggled is as shown in FIG. 34 which is a second embodiment. That is, because the operation of the global control pulse generator at toggle of X, Z-addresses is also similar to the operation of the global control pulse generator at toggle of Y-address, portions of which operations are different will be explained.

While Y-ATD signal is transited to "high" at a time point when Y-address is transited in FIG. 33, X, Z-ATD signals are transited to "high" in a case when X, Z-addresses are transited in FIG. 34. The global control pulse generator compounds X, Z-ATD signals with the signal in using them when X, Z-addresses are transited. Therefore, if X, Z-ATD signals are present at "high" (t7 and t14), the global control pulse generator senses that CSBpad signal is enabled again in the interval. Accordingly, the global control pulse generator provides all signals again, to enable normal accesses to X, Z-addresses.

Both S1 and S2 signals are started after a certain interval (t1) from a transit of CSBpad signal to "low" and also started after a certain interval (t8 and t15) from a time point of transits of X, Z-ATD signals to "low". The C4 signal is transited from "high" to "low" at a time point when the S1 signal is transited to "low" and the S2 signal is held at "high", and transited from "high" to "low" at a time point when X, Z-ATD signals are transited to "high". The P2 signal is transited from "low" to "high" at a time point when both S1 and S2 signals are transited to "high", and transited from "high" to "low" at a time point when S1 and S2 signals are transited to "low". The C3 signal is transited from "high" to "low" at a time point when both S1 and S2 signals are transited to "high", and transited from "low" to "high" at a time point when X, Z-ATD signals are transited to "high".

The SAN and SAP signals are transited after a predetermined delay from a time point when both S1 and S2 signals are "high", and transited to opposite states at a time point when X, Z-ATD signals are transited to "high". Accordingly, a logic "0" is written on a relevant cell in intervals both S1 and S2 signals are at "high", i.e., intervals of t2–t3, t9–t10 and t16–t17. A logic "1" is written in a relevant cell in intervals only one of the S1 and S2 signals are at "high", i.e., in intervals of t4–t5, t11–t12 and t18–t19.

The SWL ferroelectric memory of the present invention and the circuit for driving the same of the present invention have various advantages. The provision of split wordlines which takes up the function of platelines without separate platelines facilitates improvements in a packing density and in an efficiency as a memory since it requires no separate plateline control signal in read and write of data any more. Since one reference cell of a ferroelectric substance of which ferroelectric property is not fully assured is provided for a few hundreds of main memories for use in reading operation, requiring much more operation of the reference cell, the reference cell in the background art is involved in a rapid degradation of the ferroelectric property, causing instability of the reference voltage. However, because a ratio of the reference cells to corresponding main memory cells is significantly lowered in the present invention, the degradation of the reference cells can be prevented.

The use of X, Y, Z-ATD signals in addition to CSBpad signal which is generally used for enabling a ferroelectric memory facilitates the chip operative in a fast column access mode, that allows to improve a chip access speed, subsequent with efficient management of a memory operation. That is, the chip can be operated classifying the cases into a case when at large only X, Z-addresses are transited and only Y-address is transited, and protect operation of the chip from interference of X, Y and Z-addresses when the chip is enabled by CSBpad signal and is under operation. In the case when only X, Z-addresses are transited, the same operation as the chip being enabled by CSBpad signal can be implemented using X, Z-ATD signal as there are no valid data latched in the sense amplifier yet, and, when only Y-address is transited, a data latched in the sense amplifier already can be read as split wordlines SWL1 and SWL2 of row address are not transited, and a normal write operation can be conducted using Y-ATD in a write mode.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A split word line (SWL) ferroelectric memory, comprising:
   SWL drivers for driving split wordlines;
   cell arrays for storage of data; and
   cores, each having a sense amplifier block for sensing a data and a bitline control block for controlling bitlines, wherein each of the cell arrays is disposed on left and right sides of one of the SWL drivers centered on one of the SWL drivers and each of the cores is disposed on upper and lower sides of one of the cell arrays between the cell arrays.

2. The SWL ferroelectric memory of claim 1, wherein the cell array includes main cell blocks for writing data and reference cell blocks for being in storage of reference values for reading data.

3. The SWL ferroelectric memory of claim 1, wherein one cell array includes a plurality of main cell sub-blocks and a plurality of reference cell sub-blocks, each of the main cell sub-blocks having a plurality of even numbers of column units and each of the reference cell sub-blocks having two column units.

4. The SWL ferroelectric memory of claim 3, wherein each of the main cell sub-blocks includes four column units.

5. The SWL ferroelectric memory of claim 3, wherein each of the main cell sub-blocks includes eight column units.

6. The SWL ferroelectric memory of claim 1, wherein each of the cell arrays includes:
   a plurality of split wordlines arranged in one direction at fixed intervals;
   a plurality of bitlines arranged in one direction vertical to each of the SWLs at fixed intervals; and
   a ferroelectric unit memory cell arranged in each pair of adjacent two SWLs and adjacent two bitlines.

7. The SWL ferroelectric memory of claim 6, wherein the ferroelectric unit memory cell includes:
   a first transistor having a gate electrode connected to a first SWL of one pair of SWLs and a source electrode connected to a first bitline of one pair of bitlines;
   a second transistor having a gate electrode connected to a second SWL of the one pair of SWLs and a source electrode connected to a second bitline of the one pair of bitlines;
   a first capacitor having a first electrode connected to a drain electrode of the first transistor and a second electrode connected to the second SWL; and
   a second capacitor having a first electrode connected to a drain electrode of the second transistor and a second electrode connected to the first SWL.

8. The SWL ferroelectric memory of claim 6, wherein each of the plurality of bitlines includes a plurality of sub-blocks, each of the sub-blocks having plural columns of bitlines for main cells for data storage and two columns of bitlines for reference cells for providing a reference voltage.

9. The SWL ferroelectric memory of claim 1, wherein the each of the cell arrays includes:
   a plurality of split wordlines arranged in one direction at fixed intervals;
   a plurality of bitlines and a plurality of bitbarlines both arranged alternatively in one direction vertical to each of the split wordlines at fixed intervals; and
   a ferroelectric unit memory cell arranged in each pair of adjacent two split wordlines and adjacent pair of a bitline and a bitbarline.

10. The SWL ferroelectric memory of claim 9, wherein the ferroelectric unit memory cell includes:
    a first transistor having a gate electrode connected to a first SWL of one pair of SWLs and a source electrode connected to a bitline;
    a second transistor having a gate electrode connected to a second SWL of the one pair of SWLs and a source electrode connected to a bitbarline;
    a first capacitor having a first electrode connected to a drain electrode of the first transistor and a second electrode connected to the second SWL; and
    a second capacitor having a first electrode connected to a drain electrode of the second transistor and a second electrode connected to the first SWL.

11. A circuit for driving a split wordline (SWL) ferroelectric memory, comprising:
    a post X-decoder for receiving and decoding X and Z-addresses for controlling a cell array block operative;
    a global control pulse generator for providing a control pulse required for data write or read in response to a CSBpad signal;
    a local control pulse generator for receiving the control pulse from the global control pulse generator and providing a control signal required for data write and read;
    an SWL cell array block for storage of data;
    an SWL driver for driving the SWL cell array block in response to control signals from the post X-decoder and the local control pulse generator;
    a Y-address decoder for decoding a Y-address signal received externally;
    a column controller for controlling columns in response to the control signal from the local control pulse generator and a decoded signal from the Y-address decoder; and
    a sense amplifier and I/O controller for sensing/recording a data from/to the SWL cell array block.

12. The circuit of claim 11, wherein the global control pulse generator includes:
    a reception buffer for receiving signals including the CSBpad signal and providing first and second synchronizing signals;
    a low voltage operation and noise reduction circuit for receiving the first synchronizing signal from the reception buffer and a feed back signal thereof and providing a low voltage detecting signal for preventing operation at a low voltage and a noise free signal which has been filtered for noise in the first synchronizing signal;
    a first controller for receiving a signal having the noise removed therefrom and providing (1) a first control signal for controlling an enable time point of the sense amplifier, (2) a second control signal for controlling a column selection enable time point and a reference cell bitline pull-up, and (3) a third control signal for providing a signal for the SWL driver and other control signals, when a normal power supply voltage is supplied from the low voltage operation and noise reduction circuit;
    a second controller for receiving the third control signal from the first controller, generating (1) a basic waveform generating signal S1 for The SWL1 and a basic waveform generating signal S2 for The SWL2 in a pair of SWLs for the SWL driver, (2) a fourth control signal which is a basic pulse signal for controlling enabled time periods of the signals S1 and S2, and (3) a pulse signal P2 having a driving capability improved from the fourth control signal, and providing the fourth control signal to the low voltage operation and noise reduction circuit as a feed back signal and the pulse signal P2 to the local control pulse generator;

a third controller for receiving the first and second synchronizing signals from the reception buffer and the fourth control signal from the second controller and providing (1) a fifth control signal for controlling to be synchronous to the CSBpad signal if all signal except the basic waveform generating signal S1 for the SWL1 and the basic waveform generating signal S2 for SWL2 are disabled and (2) a sixth control signal for interrupting a disabled state of the CSBpad signal if the CSBpad signal is disabled under a state that the basic waveform generating signal S1 for the SWL1 and the basic waveform generating signal S2 for the SWL2 are enabled and sustaining an enabled state until completion of normal operations of the basic waveform generating signal S1 for the SWL1 and the basic waveform generating signal S2 for SWL2; and a fourth controller for receiving the fifth, and sixth control signals from the third controller and the first, second and third control signals from the first controller and providing (1) an enable signal SAN for an n-MOS device and an enable signal SAP for a p-MOS device in the sense amplifier, (2) a control signal C1 for connecting a bitline on a main cell block and a first I/O node on the sense amplifier to each other, (3) a control signal C2 for connecting a bitline on a reference cell block and a second I/O node on the sense amplifier to each other, (4) a control signal C3 for controlling low voltage pre-charges of a bitline on a main cell, a bitline on a reference cell and a node on the sense amplifier, and (5) a control signal C4 for controlling an enable time point of a column selection and a bitline pull-up of a reference cell.

13. The circuit of claim 11, wherein the global control pulse generator provides, when an enabled period of the CSBpad signal received externally is divided into t1–t14 intervals;

a first SWL basic waveform generating signal S1 held at "high" in t2–t3 intervals and in t5 interval and at "low" in rest of the intervals;

a second SWL basic waveform generating signal S2 held at "high" in t2–t4 intervals and at "low" in rest of the intervals;

a control signal C1 transited to "low" in t3 interval and held at "high" in rest of the intervals for connecting a bitline on a main cell and a first node on the sense amplifier;

a control signal C2 held at "low" in t3–t14 intervals and held at "high" in rest of the intervals for connecting a bitline on a reference cell and a second node on the sense amplifier;

a control signal C4 held at "high" in t4–t14 intervals and held at "low" in rest of the intervals for controlling a column selection enable time point and a reference cell bitline pull-up;

a pulse signal P2 held at "high" in t2–t5 intervals and at "low" in rest of the intervals for controlling enable time periods of the first, and second basic waveform generating signals S1 and S2, respectively;

a control signal C3 held at "low" in t2–t14 intervals and held at "high" in rest of the intervals for controlling a low voltage pre-charge of a main cell bitline, a reference cell bitline and a sense amplifier node;

a first enable signal SAP for the sense amplifier held at "high" in t3–t14 intervals and held at "low" in rest of the intervals; and a second enable signal SAN for the sense amplifier held at "low" in t3–t14 intervals and held at "high" in rest of the intervals.

14. The circuit of claim 11, wherein the global control pulse generator provides, when an enabled period of the CSBpad signal received externally is divided into t1–t20 intervals and X, Z-address signals are transited at starting points of t7 and t14 intervals;

a first SWL basic waveform generating signal S1 held at "high" in t2–t3 intervals, t5 interval, t9–t10 intervals, t12 interval, t16–t17 intervals and t19 interval and at "low" in rest of the intervals;

a second SWL basic waveform generating signal S2 held at "high" in t2–t4 intervals, t9–t11 intervals and t16–t18 intervals and at "low" in rest of the intervals;

a control signal C1 transited to "low" in t3 interval, t10 interval and t17 interval and held at "high" in rest of the intervals for connecting a bitline on a main cell and a first node on the sense amplifier;

a control signal C2 transited from "high" to "low" at end points of t2, t10 and t17 intervals and transited from "low" to "high" at starting points of t7 and t14 intervals for connecting a bitline on a reference cell and a second node on the sense amplifier;

a control signal C4 held at "high" in t4–t6 intervals, t11–t13 intervals and t18–t20 intervals and held at "low" in rest of the intervals for controlling a column selection enable time point and a reference cell bitline pull-up;

a pulse signal P2 held at "high" in t2–t5 intervals, t9–t12 and t16–t19 intervals and at "low" in rest of the intervals for controlling enable time periods of the first, and second basic waveform generating signals S1 and S2, respectively;

a control signal C3 held at "low" in t2–t6 intervals, t9–t13 intervals and t16–t20 intervals and held at "high" in rest of the intervals for controlling a low voltage pre-charge of a main cell bitline, a reference cell bitline and a sense amplifier node;

a first enable signal SAP for the sense amplifier held at "high" in t3–t6 intervals, t10–t13 intervals and t17–t20 intervals and held at "low" in rest of the intervals; and a second enable signal SAN for the sense amplifier held at "low" in t3–t6 intervals, t10–t13 intervals and t17–t20 intervals and held at "high" in rest of the intervals.

15. The circuit of claim 11, wherein the global control pulse generator includes:

a reception buffer for receiving signals including CSBpad signal and providing first and second synchronizing signals;

a first controller for receiving the first synchronizing signal from the reception buffer and providing (1) a first control signal for controlling an enable time point of the sense amplifier, (2) a second control signal for controlling a column selection enable time point and a reference cell bitline pull-up, and (3) a third control signal for providing a signal for the SWL driver and other control signals, a second controller for receiving the third control signal from the first controller, generating (1) a basic waveform generating signal S1 for an SWL1 and a basic waveform generating signal S2 for an SWL2 in a pair of SWLs for the SWL driver, (2) a fourth control signal which is a basic pulse signal for controlling enabled time periods of the signals S1 and S2 and (3) a pulse signal P2 having a driving capability improved from the fourth control signal, and providing the pulse signal P2 to the local control pulse generator;

a third controller for receiving the first, and second synchronizing signals from the reception buffer and the fourth control signal from the second controller and providing (1) a fifth control signal for controlling to be synchronous to the CSBpad signal if all signal except the basic waveform generating signal S1 for the SWL1 and the basic waveform generating signal S2 for SWL2 are disabled and (2) a sixth control signal for interrupting a disabled state of the CSBpad signal if the CSBpad signal is disabled under a state that the basic waveform generating signal S1 for the SWL1 and the basic waveform generating signal S2 for the SWL2 are enabled and sustaining an enabled state until completion of normal operations of the basic waveform generating signal S1 for the SWL1 and the basic waveform generating signal S2 for SWL2; and a fourth controller for receiving the fifth, and sixth control signals from the third controller, the first, second and third control signals from the first controller and the first synchronizing signal from the reception buffer and providing (1) an enable signal SAN for an n-MOS device and an enable signal SAP for a p-MOS device in the sense amplifier, (2) a control signal C1 for connecting a bitline on a main cell block and a first I/O node on the sense amplifier to each other, (3) a control signal C2 for connecting a bitline on a reference cell block and a second I/O node on the sense amplifier to each other, (4) a control signal C3 for controlling low voltage pre-charges of a bitline on a main cell, a bitline on a reference cell and a node on the sense amplifier, and (5) a control signal C4 for controlling an enable time point of a column selection and a bitline pull-up of a reference cell.

16. A circuit for driving a split wordline (SWL) ferroelectric memory, comprising:

X, Y, Z buffers for buffering X, Y, Z address signals;

X, Y, Z pre-decoders for pre-decoding the X, Y, Z addresses from the X, Y, Z buffers, respectively;

a post X-decoder for receiving and pre-decoding the X and Z-addresses from the X, Y, Z pre-decoders for controlling a cell array block operative;

a global control pulse generator for providing a control pulse required for data write or read in response to a CSBpad signal;

a local control pulse generator for providing a control signal in response to the control pulse from the global control pulse generator;

a SWL cell array block for storage of data;

a SWL driver for driving the SWL cell array block in response to control signals from the post X-decoder and the local control pulse generator;

a column controller for controlling columns in response to the control signal from the local control pulse generator and a Y pre-decoded signal from the X, Y, Z-pre-decoder; and a sense amplifier and I/O controller for sensing/recording a data from/to the SWL cell array block in response to the control signal from the local control pulse generator and under the control of the column controller.

17. The circuit of claim 16, wherein the global control pulse generator includes:

a reception buffer for receiving signals including CSBpad signal and providing first and second synchronizing signals, a low voltage operation and noise reduction circuit for receiving the first synchronizing signal from the reception buffer and a feed back signal thereof and providing a low voltage detecting signal for preventing operation at a low voltage and a noise free signal, which has been filtered for noise in the first synchronizing signal;

a first controller for receiving a signal having the noise removed therefrom and providing (1) a first control signal for controlling an enable time point of the sense amplifier, (2) a second control signal for controlling a column selection enable time point and a reference cell bitline pull-up, and (3) a third control signal for providing a signal for the SWL driver and other control signals, when a normal power supply voltage is supplied from the low voltage operation and noise reduction circuit;

a second controller for receiving the third control signal from the first controller, generating (1) a basic waveform generating signal S1 for an SWL1 and a basic waveform generating signal S2 for an SWL2 in a pair of SWLs for the SWL driver, (2) a fourth control signal which is a basic pulse signal for controlling enabled time periods of the signals S1 and S2 and (3) a pulse signal P2 having a driving capability improved from the fourth control signal, and providing the fourth control signal to the low voltage operation and noise reduction circuit as a feed back signal and the pulse signal P2 to the local control pulse generator;

a third controller for receiving the first, and second synchronizing signals from the reception buffer and the fourth control signal from the second controller and providing (1) a fifth control signal for controlling to be synchronous to the CSBpad signal if all signal except the basic waveform generating signal S1 for the SWL1 and the basic waveform generating signal S2 for SWL2 are disabled and (2) a sixth control signal for interrupting a disabled state of the CSBpad signal if the CSBpad signal is disabled under a state that the basic waveform generating signal S1 for the SWL1 and the basic waveform generating signal S2 for the SWL2 are enabled and sustaining an enabled state until completion of normal operations of the basic waveform generating signal S1 for the SWL1 and the basic waveform generating signal S2 for SWL2; and a fourth controller for receiving the fifth, and sixth control signals from the third controller and the first, second and third control signals from the first controller and providing (1) an enable signal SAN for an n-MOS device and an enable signal SAP for a p-MOS device in the sense amplifier, (2) a control signal C1 for connecting a bitline on a main cell block and a first I/O node on the sense amplifier to each other, (3) a control signal C2 for connecting a bitline on a reference cell block and a second I/O node on the a sense amplifier to each other, (4) a control signal C3 for controlling low voltage pre-charges of a bitline on a main cell, a bitline on a reference cell and a node on the sense amplifier, and (5) a control signal C4 for controlling an enable time point of a column selection and a bitline pull-up of a reference cell.

18. The circuit of claim 16, wherein the global control pulse generator includes:

a reception buffer for receiving signals including CSBpad signal and providing first and second synchronizing signals;

a first controller for receiving the first synchronizing signal from the reception buffer and providing (1) a first control signal for controlling an enable time point of the sense amplifier, (2) a second control signal for controlling a column selection enable time point and a reference cell bitline pull-up, and (3) a third control signal for providing a signal for the SWL driver and other control signals;

a second controller for receiving the third control signal from the first controller, generating (1) a basic waveform generating signal S1 for an SWL1 and a basic waveform generating signal S2 for an SWL2 in a pair of SWLs for the SWL driver, (2) a fourth control signal which is a basic pulse signal for controlling enabled time periods of the signals S1 and S2 and (3) a pulse signal P2 having a driving capability improved from the fourth control signal, and providing the pulse signal P2 to the local control pulse generator;

a third controller for receiving the first, and second synchronizing signals from the reception buffer and the fourth control signal from the second controller and providing (1) a fifth control signal for controlling to be synchronous to the CSBpad signal if all signal except the basic waveform generating signal S1 for the SWL1 and the basic waveform generating signal S2 for SWL2 are disabled and (2) a sixth control signal for interrupting a disabled state of the CSBpad signal if the CSBpad signal is disabled under a state that the basic waveform generating signal S1 for the SWL1 and the basic waveform generating signal S2 for the SWL2 are enabled and sustaining an enabled state until completion of normal operations of the basic waveform generating signal S1 for the SWL1 and the basic waveform generating signal S2 for SWL2; and a fourth controller for receiving the fifth, and sixth control signals from the third controller, the first, second and third control signals from the first controller and the first synchronizing signal from the reception buffer and providing (1) an enable signal SAN for an n-MOS device and an enable signal SAP for a p-MOS device in the sense amplifier, (2) a control signal C1 for connecting a bitline on a main cell block and a first I/O node on the sense amplifier to each other, (3) a control signal C2 for connecting a bitline on a reference cell block and a second I/O node on the sense amplifier to each other, (4) a control signal C3 for controlling low voltage pre-charges of a bitline on a main cell, a bitline on a reference cell and a node on the sense amplifier, and (5) a control signal C4 for controlling an enable time point of a column selection and a bitline pull-up of a reference cell.

19. The circuit of claim 16, wherein the global control pulse generator provides, when an enabled period of the CSBpad signal received externally is divided into t1–t14 intervals;

a first SWL basic waveform generating signal S1 held at "high" in t2–t3 intervals and in t5 interval and at "low" in rest of the intervals;

a second SWL basic waveform generating signal S2 held at "high" in t2–t4 intervals and at "low" in rest of the intervals;

a control signal C1 transited to "low" in t3 interval and held at "high" in rest of the intervals for connecting a bitline on a main cell and a first node on the sense amplifier;

a control signal C2 held at "low" in t3–t14 intervals and held at "high" in rest of the intervals for connecting a bitline on a reference cell and a second node on the sense amplifier;

a control signal C4 held at "high" in t4–t14 intervals and held at "low" in rest of the intervals for controlling a column selection enable time point and a reference cell bitline pull-up;

a pulse signal P2 held at "high" in t2–t5 intervals and at "low" in rest of the intervals for controlling enable time periods of the first, and second basic waveform generating signals S1 and S2, respectively;

a control signal C3 held at "low" in t2–t14 intervals and held at "high" in rest of the intervals for controlling a low voltage pre-charge of a main cell bitline, a reference cell bitline and a sense amplifier node;

a first enable signal SAP for the sense amplifier held at "high" in t3–t14 intervals and held at "low" in rest of the intervals; and a second enable signal SAN for the sense amplifier held at "low" in t3–t14 intervals and held at "high" in rest of the intervals.

20. A circuit for driving a split wordline (SWL) ferroelectric memory comprising:

a reception buffer for receiving signals including a CSBpad signal and providing first and second synchronizing signals;

a first controller for receiving the first synchronizing signal from the reception buffer and providing (1) a first control signal for controlling an enable time point of the sense amplifier, (2) a second control signal for controlling a column selection enable time point and a reference cell bitline pull-up, and (3) a third control signal for providing a signal for the SWL driver and other control signals;

a second controller for receiving the third control signal from the first controller, generating (1) a basic waveform generating signal S1 for an SWL1 and a basic waveform generating signal S2 for an SWL2 in a pair of SWLs for the SWL driver, (2) a fourth control signal which is a basic pulse signal for controlling enabled time periods of the signals S1 and S2 and (3) a pulse signal P2 having a driving capability improved from the fourth control signal, and providing the pulse signal P2 to the local control pulse generator;

a third controller for receiving the first, and second synchronizing signals from the reception buffer and the fourth control signal from the second controller and providing (1) a fifth control signal for controlling to be synchronous to the CSBpad signal if all signal except the basic waveform generating signal S1 for an SWL1 and the basic waveform generating signal S2 for SWL2 are disabled and (2) a sixth control signal for interrupting a disabled state of the CSBpad signal if the CSBpad signal is disabled under a state that the basic waveform generating signal S1 for the SWL1 and the basic waveform generating signal S2 for the SWL2 are enabled and sustaining an enabled state until completion of normal operations of the basic waveform generating signal S1 for the SWL1 and the basic waveform generating signal S2 for SWL2; and a fourth controller for receiving the fifth, and sixth control signals from the third controller, the first, second and third control signals from the first controller and the first synchronizing signal from the reception buffer and providing (1) an enable signal SAN for an n-MOS device and an enable signal SAP for a p-MOS device-in the sense amplifier, (2) a control signal C1 for connecting a bitline on a main cell block and a first I/O node on the sense amplifier to each other, (3) a control signal C2 for connecting a bitline on a reference cell block and a second I/O node on the sense amplifier to each other, (4) a control signal C3 for controlling low voltage pre-charges of a bitline on a main cell, (5) a bitline on a reference cell and a node on the sense amplifier, and (6) a control signal C4 for controlling an enable time point of a column selection and a bitline pull-up of a reference cell.

21. The circuit of claim 20, wherein the reception buffer subjects the CSBpad signal to inversion and non-inversion to provide the first synchronizing signal and the second synchronizing signal.

22. The circuit of claim 20, wherein the reception buffer includes:

a power-up detector for detecting a power-up signal of a power supply;

a first NOR gate for subjecting the CSBpad signal and the power-up detecting signal to a logical NOR operation;

a first inverter for inverting an output of the first NOR gate, to provide the second synchronizing signal; and a second inverter for inverting an output of the first inverter to provide the first synchronizing signal.

23. The circuit of claim 20, wherein the reception buffer includes:

a second NOR gate for subjecting the CSBpad signal and X, Z-ATD signals to a logical NOR operation;

a third inverter for inverting an output of the second NOR gate to provide the second synchronizing signal; and a fourth inverter for inverting an output of the third inverter to provide the first synchronizing signal.

24. The circuit of claim 20, wherein the reception buffer includes:

a third NOR gate for subjecting X, Z-ATD signals, a CSBpad signal and a power-up detecting signal to a logical NOR operation;

a fifth inverter for inverting an output of the third NOR gate to provide the second synchronizing signal; and a sixth inverter for inverting an output of the fifth inverter to provide the first synchronizing signal.

25. The circuit of claim 20, wherein the power-up detector includes:

a power supply voltage rise detector for detecting a rise of a power supply voltage;

an amplifier for comparing an amplifying an output of the power supply voltage rise detector and the power supply voltage;

a feed back unit for feeding back an output of the amplifier to provide a signal indicative of a stability of the power supply voltage; and a power-up forwarder for enhancing a driving capability of an output of the feed-back unit and providing to the reception buffer.

26. The circuit of claim 20, wherein the first controller includes:

a first delay for providing first and second signals obtained by dividing the first synchronizing signal from the reception buffer by times different from each other and delaying and forwarding the first delay signal as the first control signal;

a seventh inverter for inverting the second delay signal from the first delay;

a first NAND gate for subjecting the first synchronizing signal from the a reception buffer and a signal from the seventh inverter to a logical NAND operation to provide a second control signal; and an eighth inverter for inverting an output of the first NAND gate to provide a third control signal.

27. The circuit of claim 20, wherein the second controller includes:

a second delay for providing third and fourth delay signals which are the third control signal from the first controller of which falling edge is divided by times different from each other and delayed;

a fourth NOR gate for subjecting the fourth delay signal from the second delay and the third control signal from the first controller to a logical NOR operation;

a third delay for delaying a rising edge of a signal from the fourth NOR gate for a preset time period;

a ninth inverter for inverting the third control signal;

a second NAND gate for subjecting outputs of the ninth inverter, the fourth NOR gate and the third delay to a logical NAND operation to provide a fourth control signal;

a third NAND gate for subjecting an output of the ninth inverter, the fourth delay signal from the second delay, an output of the second NAND gate to a logical NAND operation;

a fourth delay for delaying a rising edge of an output of the third NAND gate for a preset time period;

a fourth NAND gate for subjecting the third delay signal from the second delay, an output of the third NAND gate and an output of the second NAND gate to a logical NAND operation;

a fifth delay for delaying a rising edge of an output of the fourth NAND gate for a preset time period;

an S1 signal forwarder for subjecting an output of the fourth delay and an output of the second NAND gate to a logical operation to forward the basic waveform generating signal S1 for the SWL1;

an S2 signal forwarder for subjecting an output of the fifth delay and an output of the second NAND gate to a logical operation to forward the basic waveform generating signal S2 for the SWL2; and a pulse signal forwarder for enhancing a driving capability of a signal from the second NAND gate to forward a pulse signal P2.

28. The circuit of claim 27, wherein the second delay includes:

a plurality of inverters for reducing a current driving capability of PMOS and enhancing a current driving capability of an NMOS in the sense amplifier; and a plurality of inverters for enhancing the current driving capabilities of the PMOS and NMOS.

29. The circuit of claim 27, wherein the third delay includes:

a plurality of inverters for reducing a current driving capability of PMOS and enhancing a current driving capability of an NMOS in the sense amplifier; and a plurality of inverters for enhancing the current driving capabilities of the PMOS and NMOS.

30. The circuit of claim 20, wherein the third controller includes:
a signal extender for receiving the first synchronizing signal from the reception buffer and the fourth control signal from the second controller, extending a high pulse of the pulse signal P2 from the second controller until a time when the CSBpad signal is held enabled at "low";
a sixth delay for delaying a rising edge of a signal from the signal extender for a predetermined time period;
a fifth NAND gate for subjecting an inverted signal of the fourth control signal from the second controller and the second synchronizing signal from the reception buffer to a logical NAND operation to provide the sixth control signal; and
a control signal forwarder for subjecting outputs of the sixth delay and the fifth NAND gate to a logical operation to provide the fifth control signal.

31. The circuit of claim 20, wherein the third controller includes:
a seventh delay for delaying a rising edge of a fourth control signal from the second controller for a predetermined time period;
a sixth NAND gate for subjecting an inverted signal of the fourth control signal from the second controller and the second synchronizing signal from the reception buffer to a logical NAND operation to provide the sixth control signal; and
a control signal forwarder for subjecting outputs of the seventh delay and the sixth NAND gate to logical operation to provide the fifth control signal.

32. The circuit of claim 20, wherein the third controller includes:
a signal extender for receiving the first synchronizing signal from the reception buffer and the fourth control signal from the second controller, and extending a high pulse of the pulse signal P2 from the second controller until a time when the CSBpad signal is held enabled at "low";
an eighth delay for delaying a rising edge and a falling edge of a signal from the signal extender for predetermined time periods;
a seventh NAND gate for subjecting an inverted signal of the fourth control signal from the second controller and the second synchronizing signal from the reception buffer to a logical NAND operation, to provide the sixth control signal; and
a control signal forwarder for subjecting outputs of the eighth delay and the fifth NAND gate to a logical operation to provide the fifth control signal.

33. The circuit of claim 20, wherein the fourth controller includes:
a sense amplifier control signal forwarder for subjecting the first control signal from the first controller and the fifth control signal from the third controller to a logical operation to provide an enable signal SAN for the NMOS device in the sense amplifier and an enable signal SAP for the PMOS device in the sense amplifier;
a bitline switching signal forwarder for subjecting the third control signal from the first controller and the fifth control signal from the third controller to a logical operation to provide a control signal C1 for connecting a bitline in a main cell block and a first I/O node on the sense amplifier and a control signal C2 for connecting a bitline in a reference cell block and a second I/O node on the sense amplifier;
a column control signal forwarder for subjecting the second control signal from the first controller and the fifth control signal from the third controller to a logical operation to provide a signal C4 being a column control signal; and
a pre-charge control signal forwarder for subjecting one of the first synchronizing signal from the reception buffer and the sixth control signal from the third controller to a logical operation to provide a pre-charge control signal C3.

34. The circuit of claim 33, wherein the bitline switching signal forwarder subjects the third control signal from the first controller and the fifth control signal from the third controller to a logical operation for providing a control signal C1 for connecting a bitline and a first I/O node on the sense amplifier and a control signal C2 for connecting a bitbarline and a second I/O node on the sense amplifier.

35. The circuit for driving a ferroelectric memory comprising:
a reception buffer for receiving signals including CSBpad signal and providing first and second synchronizing signals;
a low voltage operation and noise reduction circuit for receiving the first synchronizing signal from the reception buffer and a feed back signal thereof and providing a low voltage detecting signal for preventing operation at a low voltage and a noise free signal, which is a noise filtered first synchronizing signal;
a first controller for receiving a signal having the noise removed therefrom and providing (1) a first control signal for controlling an enable time point of the sense amplifier, (2) a second control signal for controlling a column selection enable time point and a reference cell bitline pull-up, and (3) a third control signal for providing a signal for the SWL driver and other control signals, when a normal power supply voltage is supplied from the low voltage operation and noise reduction circuit;
a second controller for receiving the third control signal from the first controller, generating (1) a basic waveform generating signal S1 for an SWL1 and a basic waveform generating signal S2 for an SWL2 in a pair of SWLs for the SWL driver, (2) a fourth control signal which is a basic pulse signal for controlling enabled time periods of the signals S1 and S2 and (3) a pulse signal P2 having a driving capability improved from the fourth control signal, and providing the fourth control signal to the low voltage operation and noise reduction circuit as a feed back signal and the pulse signal P2 to the local control pulse generator;
a third controller for receiving the first and second synchronizing signals from the reception buffer and the fourth control signal from the second controller and providing (1) a fifth control signal for controlling to be synchronous to the CSBpad signal if all signal except the basic waveform generating signal S1 for the SWL1 and the basic waveform generating signal S2 for SWL2 are disabled and (2) a sixth control signal for interrupting a disabled state of the CSBpad signal if the CSBpad signal is disabled under a state that the basic waveform generating signal S1 for the SWL1 and the basic waveform generating signal S2 for the SWL2 are enabled and sustaining an enabled state until completion of normal operations of the basic waveform generating signal S1 for the SWL1 and the basic waveform generating signal S2 for SWL2; and a fourth controller for receiving the fifth, and sixth control signals from the third controller and the first, second and third control signals from the first controller and providing (1) an enable signal SAN for an n-MOS device and an enable signal SAP for a p-MOS device in the sense amplifier, (2) a control signal C1 for connecting a bitline on a main cell block and a first I/O node on the sense amplifier to each other, (3) a control signal C2 for connecting a bitline on a reference cell block and a second I/O node on the sense amplifier to each other, (4) a control signal C3 for controlling low voltage pre-charges of a bitline on a main cell, a bitline on a reference cell and a node on the sense amplifier, and (5) a control signal C4 for controlling an enable time point of a column selection and a bitline pull-up of a reference cell.

36. The circuit of claim 35, wherein the low voltage operation and noise reduction circuit includes:
a low voltage sensing and delaying unit for receiving the first synchronizing signal and sensing and delaying a low voltage of a power supply voltage; and
a noise removing unit for removing noise of the low voltage sensing and delaying unit.

37. The circuit of claim 35, wherein the low voltage sensing and delaying unit includes:
a first delay for delaying the first synchronizing signal from the reception buffer for a preset time;
a second delay for delaying a rising edge of the first synchronizing signal;
first and second inverters for inverting outputs of the first and second delays, respectively;
a first NMOS transistor having a gate electrode and a source electrode connected to a power supply terminal Vcc in common and a drain electrode connected to an output terminal of the first inverter;
a second NMOS transistor having a gate electrode connected to an output terminal on the first inverter, a source electrode connected to the second inverter and a drain electrode adapted to forward a signal; and
a first PMOS transistor having a gate electrode grounded, a source electrode and a drain electrode respectively connected to the power supply terminal and the drain electrode of the second NMOS transistor.

38. The circuit of claim 36, wherein the noise removing unit includes:
a first inverter for inverting the fourth control signal fed-back from the second controller;
a first NAND gate for subjecting outputs of the low voltage sensing and delaying unit and the first inverter to a logical NAND operation;
a second inverter for inverting an output of the first NAND gate;
a second NAND gate for subjecting the first synchronizing signal from the reception buffer and an output of the first inverter to a logical NAND operation to provide a pre-activating pulse for controlling pre-charge of the sense amplifier; and
a third inverter for inverting an output of the second inverter to provide a low voltage detecting and noise free signal.

39. The circuit of claim 37, wherein the noise removing unit includes:
a third NMOS transistor connected between the second inverter and the second NMOS transistor;
a third inverter for inverting a signal feed-back from the second controller and providing to the gate electrode of the third NMOS transistor; and
a fourth NMOS transistor for switching an output of the second NMOS transistor on/off a grounding terminal in response to the feed-back signal.

40. The circuit of claim 35, wherein the low voltage operation and noise reduction circuit is a low voltage sensing unit which receives the first synchronizing signal from the reception buffer and sensing a low voltage of the power supply voltage for preventing operation at the low voltage.

41. The circuit of claim 35, wherein the low voltage operation and noise reduction circuit is a noise removing unit which removes a noise from the first synchronizing signal.

42. The circuit of claim 35, wherein the first controller includes:
a first delay for dividing the low voltage detecting and noise free signal from the low voltage operation and noise reduction circuit by time periods different from each other to provide first, and second delay signals and the first delay signal as the first control signal;
a first inverter for inverting the second delay signal from the first delay;
a first NAND gate for subjecting the low voltage detecting and noise free signal from the low voltage operation and noise reduction circuit and a signal from the first inverter to a logical NAND operation to provide a second control signal; and
a second inverter for inverting an output of the first NAND gate to provide the third control signal.

43. The circuit of claim 35, wherein the fourth controller includes:
a sense amplifier control signal forwarder for subjecting the first control signal from the first controller and the fifth control signal from the third controller to a logical operation to provide an enable signal SAN for the NMOS device in the sense amplifier and an enable signal SAP for the PMOS device in the sense amplifier;
a bitline switching signal forwarder for subjecting the third control signal from the first controller and the fifth control signal from the third controller to a logical operation to provide a control signal C1 for connecting a bitline in a main cell block and a first I/O node on the sense amplifier and a control signal C2 for connecting a bitline in a reference cell block and a second I/O node on the sense amplifier;
a column control signal forwarder for subjecting the second control signal from the first controller and the fifth control signal from the third controller to logical operation to provide a control signal C4 for providing a column control signal; and
a pre-charge control signal forwarder for subjecting the pre-activating pulse from the low voltage operation and noise reduction circuit and the sixth control signal from the third controller to logical operation to provide a pre-charge control signal C3.

44. The circuit of claim 43, wherein the bitline switching signal forwarder subjects the third control signal from the first controller and the fifth control signal from the third controller to provide the control signal C1 for connecting a bitline and a first I/O node on the sense amplifier and the control signal C2 for connecting a bitbarline and a second I/O node on the sense amplifier.

* * * * *